(12) United States Patent
Kurokawa et al.

(10) Patent No.: US 12,245,485 B2
(45) Date of Patent: Mar. 4, 2025

(54) DISPLAY APPARATUS INCLUDING LIGHT-EMITTING DEVICE AND LIGHT-RECEIVING DEVICE

(71) Applicant: Semiconductor Energy Laboratory Co., Ltd., Atsugi (JP)

(72) Inventors: Yoshiyuki Kurokawa, Sagamihara (JP); Kouhei Toyotaka, Atsugi (JP); Satoru Ohshita, Atsugi (JP); Daisuke Kubota, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 165 days.

(21) Appl. No.: 17/699,623

(22) Filed: Mar. 21, 2022

(65) Prior Publication Data

US 2022/0328571 A1    Oct. 13, 2022

(30) Foreign Application Priority Data

Apr. 8, 2021    (JP) .................................. 2021-066011

(51) Int. Cl.
*H10K 59/35*    (2023.01)
*H10K 59/65*    (2023.01)

(52) U.S. Cl.
CPC ......... *H10K 59/353* (2023.02); *H10K 59/351* (2023.02); *H10K 59/65* (2023.02)

(58) Field of Classification Search
CPC .................................................... H10K 59/65
See application file for complete search history.

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |
| 10,585,506 | B2 | 3/2020 | Shima et al. |
| 2002/0072139 | A1 | 6/2002 | Kashiwabara |
| 2011/0148290 | A1 | 6/2011 | Oota |

(Continued)

FOREIGN PATENT DOCUMENTS

| | | |
|---|---|---|
| JP | 2000-036385 A | 2/2000 |
| JP | 2003-059663 A | 2/2003 |

(Continued)

OTHER PUBLICATIONS

Papadopoulos.N et al., "AMOLED Displays with In-Pixel Photodetector", Liquid Crystals and Display Technology, Jul. 9, 2020, pp. 1-19.

(Continued)

*Primary Examiner* — Suberr L Chi
(74) *Attorney, Agent, or Firm* — Eric J. Robinson; Robinson Intellectual Property Law Office, P.C.

(57) ABSTRACT

A high-resolution display apparatus having a function of sensing light is provided. The display apparatus includes a display portion in which a first arrangement pattern and a second arrangement pattern are repeatedly arranged in this order in a first direction. In the first arrangement pattern, a first subpixel, a second subpixel, and a third subpixel are repeatedly arranged in this order in a second direction. In the second arrangement pattern, a fourth subpixel and a fifth subpixel are repeatedly arranged in this order in the second direction. The first to fourth subpixels each include a light-emitting device. The fifth subpixel includes a light-receiving device.

14 Claims, 26 Drawing Sheets

(56) References Cited

U.S. PATENT DOCUMENTS

| | | |
|---|---|---|
| 2012/0256204 A1 | 10/2012 | Yoshizumi et al. |
| 2012/0273804 A1 | 11/2012 | Hatano |
| 2012/0276484 A1 | 11/2012 | Izumi et al. |
| 2013/0084531 A1 | 4/2013 | Hamaguchi et al. |
| 2013/0084664 A1 | 4/2013 | Yoshitoku et al. |
| 2013/0084666 A1 | 4/2013 | Oshige |
| 2013/0280839 A1 | 10/2013 | Sonoda et al. |
| 2013/0295705 A1 | 11/2013 | Sonoda et al. |
| 2014/0004640 A1 | 1/2014 | Hamaguchi et al. |
| 2014/0004642 A1 | 1/2014 | Otsuka et al. |
| 2015/0060826 A1 | 3/2015 | Matsumoto et al. |
| 2015/0069360 A1 | 3/2015 | Sato |
| 2015/0076476 A1 | 3/2015 | Odaka et al. |
| 2015/0331508 A1* | 11/2015 | Nho ............... H10K 59/65 345/173 |
| 2016/0172595 A1 | 6/2016 | Malinowski et al. |
| 2016/0315133 A1 | 10/2016 | Sato |
| 2017/0141167 A1 | 5/2017 | Naganuma |
| 2017/0256754 A1 | 9/2017 | Defranco et al. |
| 2018/0190908 A1 | 7/2018 | Ke et al. |
| 2020/0203662 A1 | 6/2020 | Mollard et al. |
| 2020/0226838 A1* | 7/2020 | Goergen ............... A63F 13/24 |
| 2021/0066669 A1 | 3/2021 | Kubota et al. |
| 2021/0096678 A1 | 4/2021 | Kubota et al. |
| 2021/0124441 A1* | 4/2021 | Ding ............... H10K 59/40 |
| 2021/0295780 A1 | 9/2021 | Ikeda et al. |
| 2022/0261584 A1* | 8/2022 | Heo ............... G06V 40/1318 |

FOREIGN PATENT DOCUMENTS

| | | | |
|---|---|---|---|
| JP | 2008-098106 A | 4/2008 | |
| JP | 2008-147072 A | 6/2008 | |
| JP | 2008-251270 A | 10/2008 | |
| JP | 2012-160473 A | 8/2012 | |
| JP | 2014-120218 A | 6/2014 | |
| JP | 2014-135251 A | 7/2014 | |
| JP | 2014-232568 A | 12/2014 | |
| JP | 2015-115178 A | 6/2015 | |
| JP | 2016-197494 A | 11/2016 | |
| JP | 2019-179696 A | 10/2019 | |
| JP | 2020-160305 A | 10/2020 | |
| WO | WO-2019/220278 | 11/2019 | |
| WO | WO-2020202284 A1 * | 10/2020 | .......... H01L 27/3211 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

* cited by examiner

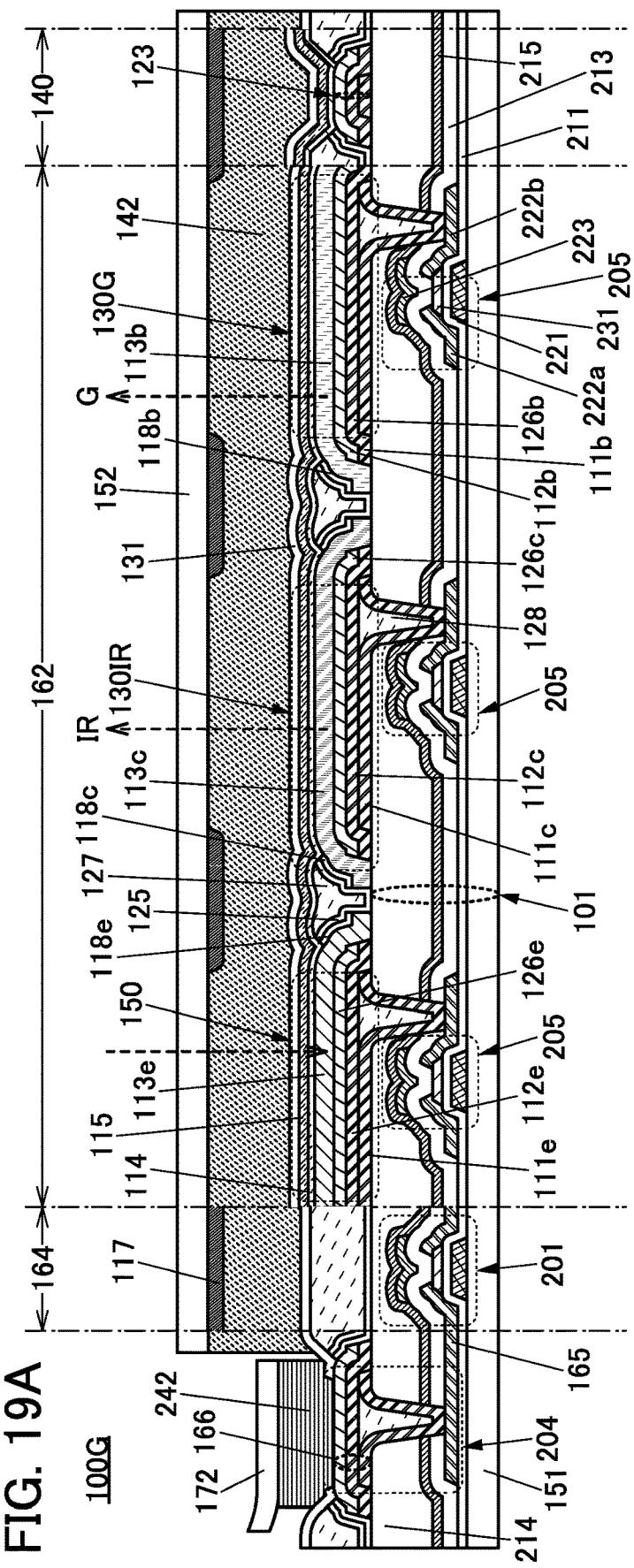
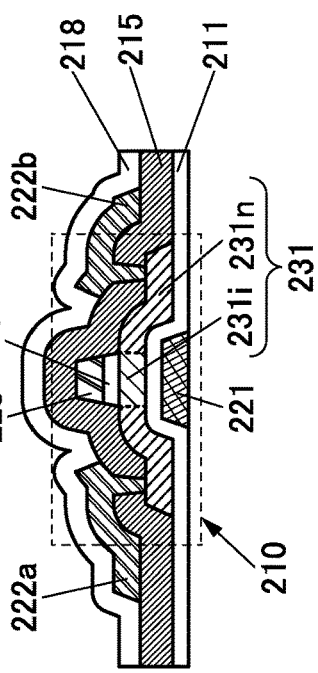
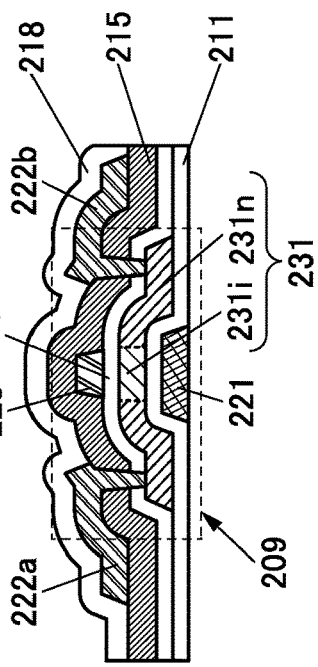

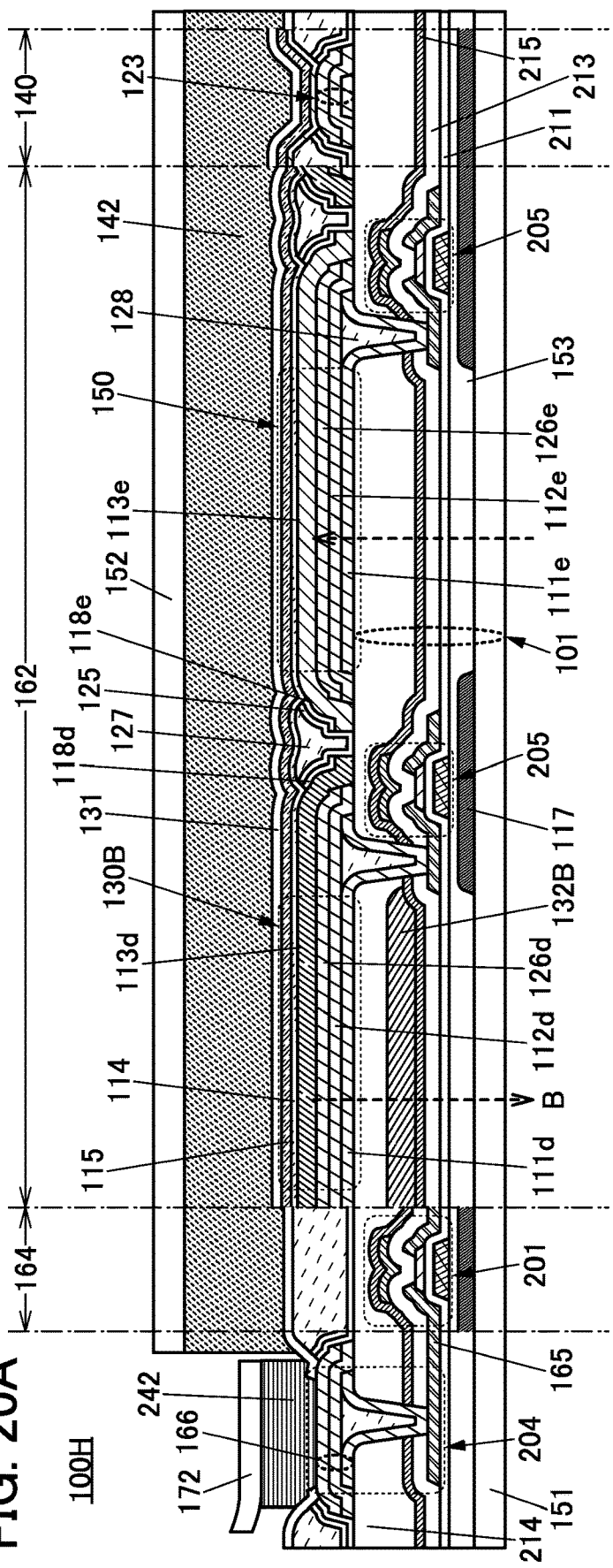
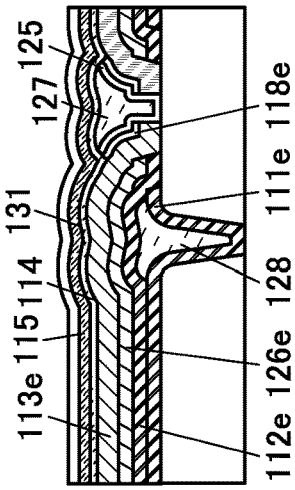
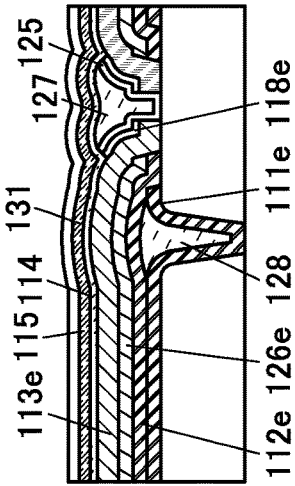
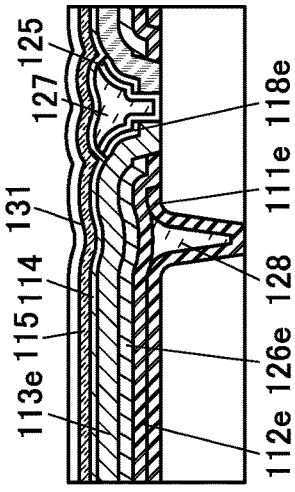

DISPLAY APPARATUS INCLUDING LIGHT-EMITTING DEVICE AND LIGHT-RECEIVING DEVICE

BACKGROUND OF THE INVENTION

1. Field of the Invention

One embodiment of the present invention relates to a display apparatus and an electronic device.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a method for driving any of them, and a method for manufacturing any of them.

2. Description of the Related Art

In recent years, higher-resolution display apparatuses have been required. For example, devices for virtual reality (VR), augmented reality (AR), substitutional reality (SR), or mixed reality (MR) are given as devices requiring high-resolution display apparatuses and have been actively developed in recent years. Display apparatuses used for these devices are required to be downsized as well as to increase resolution.

Light-emitting apparatuses including light-emitting devices (light-emitting elements) have been developed as display apparatuses, for example. Light-emitting devices utilizing electroluminescence (hereinafter referred to as EL; such devices are also referred to as EL devices or EL elements) have features such as ease of reduction in thickness and weight, high-speed response to input signals, and driving with constant DC voltage, and have been used in display apparatuses.

Patent Document 1, for example, discloses an example of a display apparatus using an organic EL element. In the case where a high display quality is required as in the display apparatus in Patent Document 1, a high-resolution display apparatus including a large number of pixels is required in some cases.

REFERENCE

Patent Document

[Patent Document 1] PCT International Publication No. 2019/220278

SUMMARY OF THE INVENTION

A display apparatus having a high display quality, such as the one disclosed in Patent Document 1, is desired for VR devices and AR devices. In this case, an image is displayed in a wearable housing, like in a glasses-type device or a goggle-type device; therefore, small size and light weight are important factors for the display apparatus. In the wearable housing, for example, the size of the display apparatus needs to be reduced to approximately 2 inches or smaller, or 1 inch or smaller.

In addition, multifunctionalization of VR devices and AR devices with the use of sensors has been promoted.

An object of one embodiment of the present invention is to provide a high-resolution display apparatus having a function of sensing light. An object of one embodiment of the present invention is to provide a high-definition display apparatus having a function of sensing light. An object of one embodiment of the present invention is to provide a highly reliable display apparatus having a function of sensing light.

Note that the description of these objects does not preclude the existence of other objects. One embodiment of the present invention does not need to achieve all of these objects. Other objects can be derived from the description of the specification, the drawings, and the claims.

One embodiment of the present invention is a display apparatus including a display portion in which a first arrangement pattern and a second arrangement pattern are repeatedly arranged in this order in a first direction. In the first arrangement pattern, a first subpixel, a second subpixel, and a third subpixel are repeatedly arranged in this order in a second direction. In the second arrangement pattern, a fourth subpixel and a fifth subpixel are repeatedly arranged in this order in the second direction. The first to fourth subpixels each include a light-emitting device. The fifth subpixel includes a light-receiving device.

The longitudinal direction of each of the first subpixel, the second subpixel, and the third subpixel is preferably the first direction.

The longitudinal direction of the fourth subpixel is preferably the second direction.

The fifth subpixel preferably has the lowest aperture ratio of the first to fifth subpixels.

It is preferable that the third subpixel emit infrared light and have the highest aperture ratio of the first to fifth subpixels. It is preferable that one of the first subpixel and the second subpixel emit red light, the other of the first subpixel and the second subpixel emit green light, the fourth subpixel emit blue light, and the fifth subpixel sense at least infrared light.

Alternatively, it is preferable that the fourth subpixel emit infrared light and have the highest aperture ratio of the first to fifth subpixels. It is preferable that one of the first subpixel and the second subpixel emit red light, the other of the first subpixel and the second subpixel emit green light, the third subpixel emit blue light, and the fifth subpixel sense at least infrared light.

The first subpixel preferably includes a region in which the distance to an adjacent subpixel is less than or equal to 3 μm, further preferably less than 1 μm.

One embodiment of the present invention is an electronic device including a display apparatus having any of the above structures, and a processing portion. The display apparatus has a function of capturing an image with the use of the fifth subpixel. The processing portion has a function of sensing one or more selected from blinking, movement of an iris, and movement of an eyelid of a user, with the use of image data obtained with the display apparatus.

One embodiment of the present invention is an electronic device including at least two display apparatuses each having any of the above structures, a housing provided with the display apparatuses, and a battery that is provided for the housing and supplies electric power to the display apparatuses. The housing includes a mounting portion and a pair of lenses. An image from one of the two display apparatuses is projected on one of the pair of lenses, and an image from the other of the two display apparatuses is projected on the other of the pair of lenses. The electronic device preferably further includes a processing portion provided for the housing. The display apparatus has a function of capturing an image with the use of the fifth subpixel. The processing portion preferably has a function of sensing one or more selected from blinking, movement of an iris, and movement of an eyelid of a user, with the use of image data obtained with the display apparatus.

With one embodiment of the present invention, a high-resolution display apparatus having a function of sensing light can be provided. With one embodiment of the present invention, a high-definition display apparatus having a function of sensing light can be provided. With one embodiment of the present invention, a highly reliable display apparatus having a function of sensing light can be provided.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

In the accompanying drawings:

FIG. 19A is a cross-sectional view illustrating an example of a display apparatus, and FIGS. 19B and 19C are cross-sectional views each illustrating an example of a transistor;

FIGS. 20A to 20D are cross-sectional views illustrating examples of display apparatuses;

DETAILED DESCRIPTION OF THE INVENTION

Figure 1A:
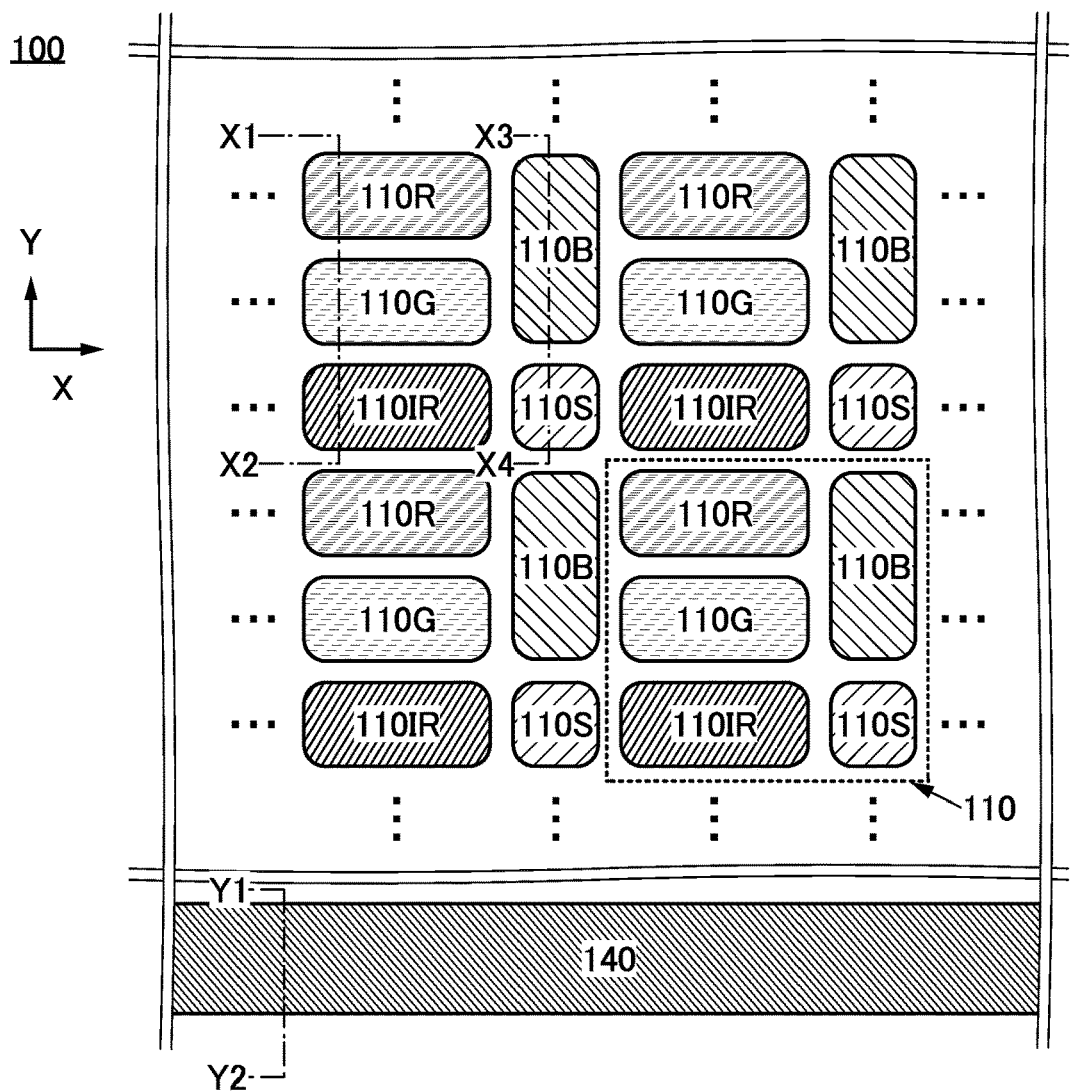
FIG. 1A is a top view illustrating an example of a display apparatus.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is applied to portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

Embodiment 1

In this embodiment, a display apparatus of one embodiment of the present invention is described with reference to FIGS. 1A and 1B, FIGS. 2A to 2D, FIGS. 3A to 3C, FIGS. 4A and 4B, FIGS. 5A to 5C, and FIGS. 6A to 6F.

The display apparatus of one embodiment of the present invention includes a display portion in which a first arrangement pattern and a second arrangement pattern are repeatedly arranged in this order in a first direction. In the first arrangement pattern, a first subpixel, a second subpixel, and a third subpixel are repeatedly arranged in this order in a second direction. In the second arrangement pattern, a fourth subpixel and a fifth subpixel are repeatedly arranged in this order in the second direction. The first to fourth subpixels each include a light-emitting device, and the fifth subpixel includes a light-receiving device.

For example, as a combination of the first to fifth subpixels, any four of the subpixels emit red (R) light, green (G) light, blue (B) light, and infrared (IR) light, and the remaining one subpixel senses at least one of visible light and infrared light. Alternatively, any four of the subpixels may emit yellow (Y) light, cyan (C) light, magenta (M) light, and infrared (IR) light, and the remaining one subpixel may sense at least one of visible light and infrared light.

The longitudinal direction (also referred to as the long-side direction) of each of the first, second, and third subpixels is preferably the first direction. The longitudinal direction of the fourth subpixel is preferably the second direction.

For example, it is preferable that the first subpixel emit red light, the second subpixel emit green light, the third subpixel emit infrared light, the fourth subpixel emit blue light, and the fifth subpixel sense at least infrared light. Alternatively, it is preferable that the first subpixel emit green light, the second subpixel emit red light, the third subpixel emit infrared light, the fourth subpixel emit blue light, and the fifth subpixel sense at least infrared light.

The pixel having the above structure can display a full-color image with the use of the first subpixel, the second subpixel, and the fourth subpixel. The layout of the first subpixel, the second subpixel, and the fourth subpixel is what is called S stripe arrangement. Thus, high display quality can be achieved.

In the pixel having the above structure, the third subpixel can be used as a light source. The fifth subpixel is preferably capable of sensing infrared light emitted from the third subpixel. The fifth subpixel may be capable of sensing both infrared light and visible light.

The third subpixel preferably has the highest aperture ratio of the first to fifth subpixels. Thus, the sensing accuracy of the fifth subpixel can be increased.

Alternatively, it is preferable that the first subpixel emit red light, the second subpixel emit green light, the third subpixel emit blue light, the fourth subpixel emit infrared light, and the fifth subpixel sense at least infrared light. Further alternatively, it is preferable that the first subpixel emit green light, the second subpixel emit red light, the third subpixel emit blue light, the fourth subpixel emit infrared light, and the fifth subpixel sense at least infrared light.

The pixel having the above structure can display a full-color image with the use of the first subpixel, the second subpixel, and the third subpixel. The layout of the first subpixel, the second subpixel, and the third subpixel is what is called stripe arrangement. Thus, high display quality can be achieved.

In the pixel having the above structure, the fourth subpixel can be used as a light source. The fifth subpixel is preferably capable of sensing infrared light emitted from the fourth subpixel. The fifth subpixel may be capable of sensing both infrared light and visible light.

The fourth subpixel preferably has the highest aperture ratio of the first to fifth subpixels. Thus, the sensing accuracy of the fifth subpixel can be increased.

Here, the wavelength of infrared light can be longer than or equal to 750 nm, and is preferably longer than or equal to 780 nm. It is particularly preferable to use, as infrared light, near-infrared light having a wavelength in the range of 750 nm to 2500 nm inclusive.

The display apparatus of one embodiment of the present invention includes light-emitting devices and a light-receiving device in a pixel. Since the display portion of the display apparatus of one embodiment of the present invention has a light-receiving function, image capturing can be performed with the use of the display portion. For example, the display portion can capture an image while displaying an image. Furthermore, it is possible that in the pixel, some of the subpixels emit light as a light source and other subpixels are used for displaying an image.

In the display apparatus of one embodiment of the present invention, the light-emitting devices are arranged in a matrix in the display portion, and an image can be displayed on the display portion. The light-receiving devices are arranged in a matrix in the display portion.

For example, in an electronic device including the display apparatus of one embodiment of the present invention, a processing portion can have a function of sensing one or more selected from blinking, movement of an iris, and movement of an eyelid of a user, with the use of image data obtained with the display apparatus.

The display apparatus of one embodiment of the present invention can capture an image of the periphery, surface, or inside (e.g., fundus) of an eye with the use of the light-receiving device. For example, with the use of a light-receiving device sensing infrared light, one or more of blinking, movement of an eyelid, and movement of an iris can be sensed. Moreover, a light-receiving device sensing visible light can be used for one or both funduscopy and eye fatigue assessment. The amount of hemoglobin can be measured with the use of one or both of visible light and infrared light. The use of both visible light and infrared light can increase the measurement accuracy in some cases. Note that these functions will be described in detail in Embodiment 2.

For another example, the electronic device including the display apparatus of one embodiment of the present invention can sense the approach or touch of an object (e.g., a finger, a hand, or a pen).

Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can sense the reflected light (or the scattered light); thus, image capturing or touch sensing is possible even in a dark place.

The display apparatus of one embodiment of the present invention has a function of displaying an image using the light-emitting devices. That is, the light-emitting devices function as display devices (also referred to as display elements).

As the light-emitting device, an organic light-emitting diode (OLED) or a quantum-dot light-emitting diode (QLED) is preferably used, for example. Examples of a light-emitting substance (also referred to as a light-emitting material) included in the light-emitting device include a substance exhibiting fluorescence (a fluorescent material), a substance exhibiting phosphorescence (a phosphorescent material), and a substance exhibiting thermally activated delayed fluorescence (a thermally activated delayed fluorescent (TADF) material). As the TADF material, a material in which the singlet and triplet excited states are in thermal equilibrium may be used. Since such a TADF material has a short emission lifetime (excitation lifetime), it inhibits a reduction in the efficiency of a light-emitting device in a high-luminance region. A light-emitting diode (LED) such as a micro-LED can be used as the light-emitting device. An inorganic compound (e.g., a quantum dot material) can also be used as the light-emitting substance included in the light-emitting device.

The display apparatus of one embodiment of the present invention has a function of sensing light using the light-receiving devices.

As the light-receiving devices, PN photodiodes or PIN photodiodes can be used, for example. The light-receiving devices function as photoelectric conversion devices (also referred to as photoelectric conversion elements) that sense light entering the light-receiving devices and generate electric charge. The amount of electric charge generated from the light-receiving devices depends on the amount of light entering the light-receiving devices.

It is particularly preferable to use an organic photodiode including a layer containing an organic compound as the light-receiving device. An organic photodiode, which is easily made thin, lightweight, and large in area and has a high degree of freedom for shape and design, can be used in a variety of display apparatuses.

In one embodiment of the present invention, organic EL devices are used as the light-emitting devices, and organic photodiodes are used as the light-receiving devices. The organic EL devices and the organic photodiodes can be formed over one substrate. Thus, the organic photodiodes can be incorporated in the display apparatus including the organic EL devices.

Since a large number of layers can be shared between the organic photodiodes and the organic EL devices, forming the common layers concurrently can prevent the increase in the number of film formation steps.

For example, one of a pair of electrodes (a common electrode) can be a layer shared by the light-receiving devices and the light-emitting devices. As another example, at least one of a hole-injection layer, a hole-transport layer, an electron-transport layer, and an electron-injection layer is preferably shared by the light-receiving devices and the light-emitting devices.

Note that a layer shared by the light-receiving devices and the light-emitting devices may have a different function depending on which devices the layer is in. In this specification, the name of a component is based on its function in the light-emitting devices. For example, a hole-injection layer functions as a hole-injection layer in the light-emitting devices and functions as a hole-transport layer in the light-receiving devices. Similarly, an electron-injection layer functions as an electron-injection layer in the light-emitting devices and functions as an electron-transport layer in the light-receiving devices. A layer shared by the light-receiving devices and the light-emitting devices may have the same function in both the light-receiving devices and the light-emitting devices. The hole-transport layer functions as a hole-transport layer in both the light-emitting devices and the light-receiving devices, and the electron-transport layer functions as an electron-transport layer in both the light-emitting devices and the light-receiving devices.

In the case of manufacturing a display apparatus including a plurality of organic EL devices including light-emitting layers emitting light of different colors from each other, the light-emitting layers each need to be formed in an island shape.

For example, an island-shaped light-emitting layer can be formed by a vacuum evaporation method using a metal mask (also referred to as a shadow mask). However, this method causes a deviation from the designed shape and position of an island-shaped light-emitting layer due to various influences such as the low accuracy of the metal mask position, the positional deviation between the metal mask and a substrate, a warp of the metal mask, and the vapor-scattering-induced expansion of outline of the formed film; accordingly, it is difficult to achieve high resolution and high aperture ratio of the display apparatus.

In a method for manufacturing the display apparatus of one embodiment of the present invention, an island-shaped pixel electrode (also referred to as a lower electrode) is formed, a first layer (also referred to as an EL layer or part of an EL layer) including a light-emitting layer emitting light of a first color is formed on the entire surface, and then a first sacrifice layer is formed over the first layer. Then, a first resist mask is formed over the first sacrifice layer and the first layer and the first sacrifice layer are processed using the first resist mask, whereby the first layer is formed into an island shape. Next, in a manner similar to that of the first layer, a second layer (also referred to as an EL layer or part of an EL layer) including a light-emitting layer emitting light of a second color is processed into an island shape using a second sacrifice layer and a second resist mask.

As described above, in the method for manufacturing the display apparatus of one embodiment of the present invention, an island-shaped EL layer is formed by processing an EL layer formed on the entire surface, not by using a fine metal mask. Accordingly, a high-resolution display apparatus or a display apparatus having a high aperture ratio, which had been difficult to achieve, can be manufactured. Moreover, EL layers of different colors can be formed separately, which enables extremely clear images with a high contrast; thus, a display apparatus with high display quality can be manufactured. In addition, a sacrifice layer (also referred to as a mask layer) provided over an EL layer can reduce damage to the EL layer in the manufacturing process of the display apparatus, increasing the reliability of the light-emitting device.

For example, it is not necessary to employ unique pixel arrangement such as a PenTile pattern for pseudo improvement in the resolution degree, and an extremely high-resolution display apparatus can be achieved even with pixel arrangement in which three or more subpixels are included in one pixel. For example, when three subpixels of R, G, and B are arranged in stripe arrangement or S stripe arrangement, a high-resolution display apparatus can be achieved.

It is difficult to set the distance between adjacent light-emitting devices to be less than 10 µm with a formation method using a metal mask, for example. In contrast, with the above method, the distance can be decreased to 3 µm or less, 2 µm or less, or 1 µm or less.

Furthermore, a pattern of the EL layer itself (also referred to as a processing size) can be made much smaller than that in the case of using a metal mask. For example, in the case of using a metal mask for forming EL layers separately, a variation in the thickness occurs between the center and the edge of the EL layer. This causes a reduction in an effective area that can be used as a light-emitting region with respect to the area of the EL layer. In contrast, in the above manufacturing method, an EL layer is formed by processing a film deposited to have a uniform thickness, which enables a uniform thickness in the EL layer. Thus, even in a fine pattern, almost the whole area can be used as a light-emitting region. Thus, a display apparatus having both a high resolution and a high aperture ratio can be manufactured.

Here, each of the first layer and the second layer includes at least a light-emitting layer and preferably consists of a plurality of layers. Specifically, one or more layers are preferably formed over the light-emitting layer. A layer between the light-emitting layer and the sacrifice layer can inhibit the light-emitting layer from being exposed on the outermost surface during the manufacturing process of the display apparatus and can reduce damage to the light-emitting layer. Thus, the reliability of the light-emitting device can be increased.

Note that it is not necessary to form all layers included in EL layers separately between light-emitting devices emitting light of different colors, and some layers of the EL layers can be formed in the same step. In the method for manufacturing the display apparatus of one embodiment of the present invention, some layers included in the EL layer are formed into an island shape separately for each color, and then the sacrifice layer is removed. After that, other layers included in the EL layers and a common electrode (also referred to as an upper electrode) are formed so as to be shared by the light-emitting devices of different colors.

A manufacturing method similar to that of the light-emitting device can be employed for the light-receiving device. An island-shaped active layer (also referred to as a photoelectric conversion layer) included in the light-receiving layer is formed by processing a film that is to be the active layer and formed on the entire surface, not by using a fine metal mask; thus, the island-shaped active layer can have a uniform thickness. In addition, a sacrifice layer provided over the active layer can reduce damage to the active layer in the manufacturing process of the display apparatus, increasing the reliability of the light-receiving device.

Figure 1B:
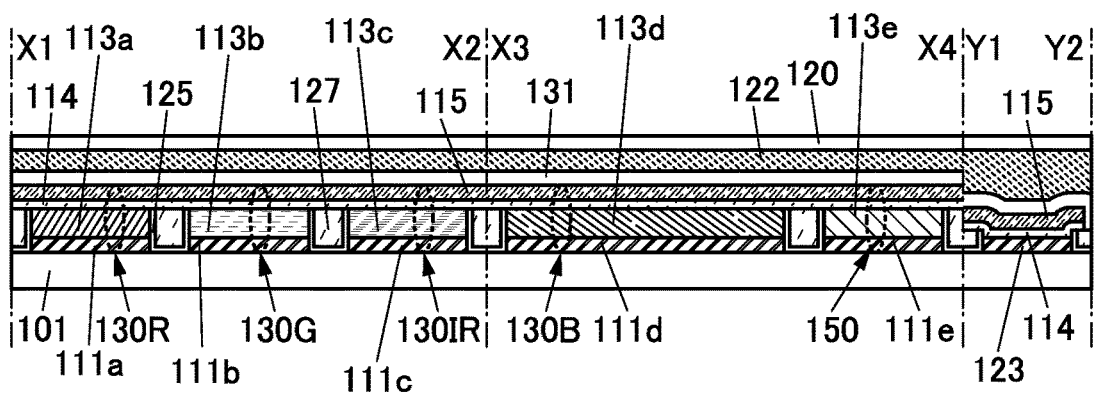
FIG. 1B is a cross-sectional view illustrating an example of the display apparatus.

FIGS. 1A and 1B illustrate a display apparatus of one embodiment of the present invention.

FIG. 1A is a top view of a display apparatus 100. The display apparatus 100 includes a display portion in which a plurality of pixels 110 are arranged in a matrix, and a connection portion 140 outside the display portion. One pixel 110 consists of five subpixels 110R, 110G, 110B, 110IR, and 110S.

FIG. 1A illustrates an example in which one pixel 110 is composed of three rows and two columns. The pixel 110 includes the subpixel 110R in the first row, the subpixel 110G in the second row, and the subpixel 110B in the first and second rows. The pixel 110 includes two subpixels (the subpixels 110IR and 110S) in the third row. In other words, the pixel 110 includes three subpixels (the subpixels 110R, 110G, and 110IR) in the left column (the first column), and two subpixels (the subpixels 110B and 110S) in the right column (the second column).

In the display portion illustrated in FIG. 1A, it can be said that the first arrangement pattern and the second arrangement pattern are repeatedly arranged in this order in the X direction. In the first arrangement pattern, the subpixels 110R, 110G, and 110IR are repeatedly arranged in this order in the Y direction. The longitudinal direction of each of the subpixels 110R, 110G, and 110IR is the X direction. In the second arrangement pattern, the subpixels 110B and 110S are repeatedly arranged in this order in the Y direction. The longitudinal direction of the subpixel 110B is the Y direction. The subpixel 110S has the lowest aperture ratio of the five subpixels.

The subpixel 110R emits red light. The subpixel 110G emits green light. The subpixel 110B emits blue light. The subpixel 110IR emits infrared light. The subpixel 110S senses at least infrared light. The subpixel 110S may be capable of sensing both infrared light and visible light.

The pixel enables full-color display with the use of the subpixels 110R, 110G, and 110B. The layout of the subpixels 110R, 110G, and 110B is what is called S stripe arrangement. Thus, high display quality can be achieved.

The subpixel 110IR can be used as a light source. The subpixel 110S can sense infrared light emitted from the subpixel 110IR.

The subpixels 110R, 110G, 110B, and 110IR each include a light-emitting device, and the subpixel 110S includes a light-receiving device.

Although the subpixels 110R, 110G, 110B, and 110IR have the same or substantially the same aperture ratio (also referred to as the size or size the of a light-emitting region) in FIG. 1A, one embodiment of the present invention is not limited thereto. The subpixels 110R, 110G, 110B, and 110IR may have different aperture ratios, or two or more of the subpixels 110R, 110G, 110B, and 110IR may have the same or the substantially the same aperture ratio.

FIG. 1A illustrates an example in which the subpixel 110S has the lowest aperture ratio of the subpixels 110R, 110G, 110B, 110IR, and 110S. When the subpixel 110S has a small light-receiving area, an image capturing area is narrowed and it is possible to inhibit blur from occurring in the captured image being displayed and to increase the definition. Accordingly, an image having a high resolution or a high definition can be captured, which is preferable. Note that the aperture ratio of each of the subpixels 110R, 110G, 110B, 110IR, and 110S can be determined as appropriate.

FIGS. 2A to 2D illustrate other structure examples of the pixel 110.

The pixels 110 illustrated in FIGS. 2A to 2D each consist of the five subpixels 110R, 110G, 110B, 110IR, and 110S.

Figure 2A:
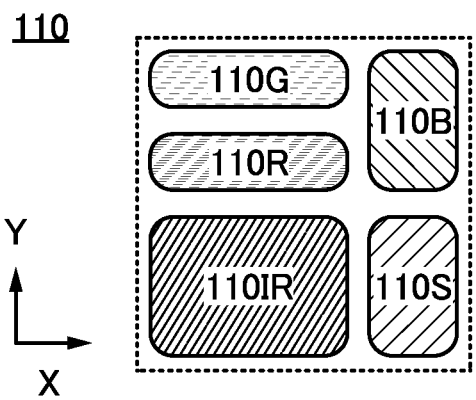
FIGS. 2A to 2D each illustrate an example of a pixel.

FIG. 2A illustrates an example in which one pixel 110 is composed of three rows and two columns. The pixel 110 includes the subpixel 110G in the first row, the subpixel 110R in the second row, and the subpixel 110B in the first and second rows. The pixel 110 includes two subpixels (the subpixels 110IR and 110S) in the third row. In other words, the pixel 110 includes three subpixels (the subpixels 110G, 110R, and 110IR) in the left column (the first column), and two subpixels (the subpixels 110B and 110S) in the right column (the second column).

Figure 2B:
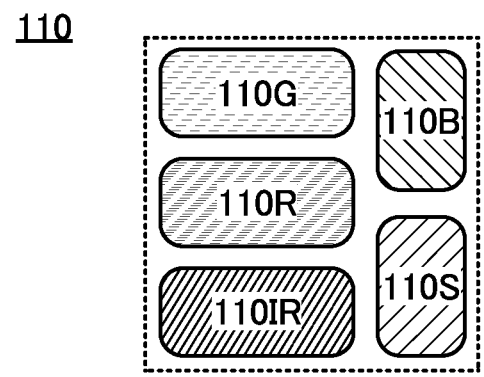

FIG. 2B illustrates an example in which one pixel 110 is composed of three rows and two columns. The pixel 110 includes the subpixel 110G in the first row, the subpixel 110R in the second row, and the subpixel 110IR in the third row. The subpixel 110B is provided in the first and second rows, and the subpixel 110S is provided in the second and third rows. In other words, the pixel 110 includes three subpixels (the subpixels 110G, 110R, and 110IR) in the left column (the first column), and two subpixels (the subpixels 110B and 110S) in the right column (the second column).

In the display portion including the pixel 110 illustrated in each of FIG. 2A and FIG. 2B, it can be said that the first arrangement pattern and the second arrangement pattern are repeatedly arranged in this order in the X direction. In the first arrangement pattern, the subpixels 110G, 110R, and 110IR are repeatedly arranged in this order in the Y direction. The longitudinal direction of each of the subpixels 110G, 110R, and 110IR is the X direction. In the second arrangement pattern, the subpixels 110B and 110S are repeatedly arranged in this order in the Y direction. The longitudinal direction of the subpixel 110B is the Y direction.

The subpixel 110R emits red light. The subpixel 110G emits green light. The subpixel 110B emits blue light. The subpixel 110IR emits infrared light. The subpixel 110S senses at least infrared light. The subpixel 110S may be capable of sensing both infrared light and visible light.

The pixel enables full-color display with the use of the subpixels 110R, 110G, and 110B. The layout of the subpixels 110R, 110G, and 110B is what is called S stripe arrangement. Thus, high display quality can be achieved.

The subpixel 110IR can be used as a light source. The subpixel 110S can sense infrared light emitted from the subpixel 110IR.

In the pixel 110 illustrated in each of FIG. 2A and FIG. 2B, the subpixel 110B and the subpixel 110S have the same or substantially the same aperture ratio. In FIG. 2A, the subpixel 110IR has a higher aperture ratio than the subpixels 110G and 110R. The subpixel 110IR has the highest aperture ratio of the subpixels 110R, 110G, 110B, 110IR, and 110S in the pixel 110 illustrated in FIG. 2A. In contrast, FIG. 2B illustrates an example in which the subpixels 110G, 110R, and 110IR have the same or substantially the same aperture ratio.

Figure 2C:
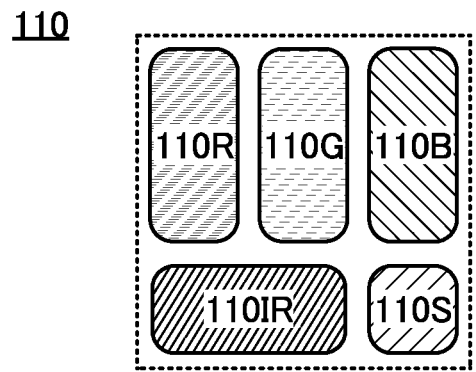
Figure 2D:
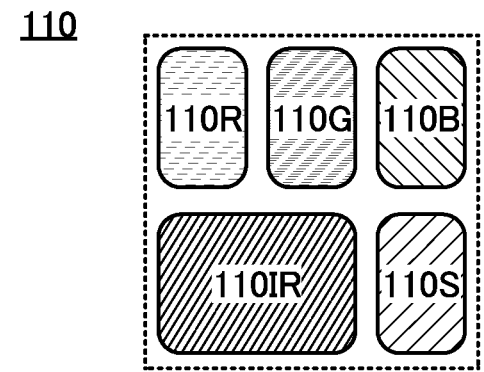

FIG. 2C and FIG. 2D each illustrate an example in which one pixel 110 is composed of two rows and three columns. The pixel 110 includes three subpixels (the subpixels 110R, 110G, and 110B) in the first row, and two subpixels (the subpixels 110IR and 110S) in the second row. In other words, the pixel 110 includes the subpixel 110R in the left column (the first column), the subpixel 110G in the middle column (the second column), and the subpixel 110IR in the left and middle columns. In addition, the pixel 110 includes two subpixels (the subpixels 110B and 110S) in the right column (the third column).

In the display portion including the pixel 110 illustrated in each of FIG. 2C and FIG. 2D, it can be said that the first arrangement pattern and the second arrangement pattern are repeatedly arranged in this order in the Y direction. In the first arrangement pattern, the subpixels 110R, 110G, and 110B are repeatedly arranged in this order in the X direction. The longitudinal direction of each of the subpixels 110R, 110G, and 110B is the Y direction. In the second arrangement pattern, the subpixels 110IR and 110S are repeatedly arranged in this order in the X direction. The longitudinal direction of the subpixel 110IR is the X direction.

The subpixel 110R emits red light. The subpixel 110G emits green light. The subpixel 110B emits blue light. The subpixel 110IR emits infrared light. The subpixel 110S senses at least infrared light. The subpixel 110S may be capable of sensing both infrared light and visible light.

The pixel enables full-color display with the use of the subpixels 110R, 110G, and 110B. In the pixel 110 illustrated in each of FIG. 2C and FIG. 2D, the layout of the subpixels 110R, 110G, and 110B is what is called stripe arrangement. Thus, high display quality can be achieved.

The subpixel 110IR can be used as a light source. The subpixel 110S can sense infrared light emitted from the subpixel 110IR.

In the pixel 110 illustrated in FIG. 2C, the subpixels 110R, 110G, 110B, and 110IR have the same or substantially the same aperture ratio. The subpixel 110S has the lowest aperture ratio of the subpixels 110R, 110G, 110B, 110IR, and 110S. Note that like the subpixels 110B and 110S illustrated in FIG. 2B, the subpixels 110IR and 110S in FIG. 2C may have the same or substantially the same aperture ratio.

In the pixel 110 illustrated in FIG. 2D, the subpixels 110R, 110G, 110B, and 110S have the same or substantially the same aperture ratio. The subpixel 110IR has the highest aperture ratio of the subpixels 110R, 110G, 110B, 110IR, and 110S.

Although the top view of FIG. 1A illustrates an example in which the connection portion 140 is positioned in the lower side of the display portion, one embodiment of the present invention is not limited thereto. The connection portion 140 is provided in at least one of the upper side, the right side, the left side, and the lower side of the display portion in the top view, and may be provided so as to surround the four sides of the display portion. The top surface shape of the connection portion 140 can be a belt-like shape, an L shape, an U shape, a frame-like shape, or the like. The number of the connection portions 140 can be one or more.

FIG. 1B illustrates a cross-sectional view taken along dashed-dotted lines X1-X2, X3-X4, and Y1-Y2 in FIG. 1A. Moreover, FIGS. 3A to 3C, FIGS. 4A and 4B, and FIGS. 5A to 5C show modification examples of the cross-sectional view taken along dashed-dotted lines X1-X2 and Y1-Y2 in FIG. 1A.

As illustrated in FIG. 1B, in the display apparatus 100, light-emitting devices 130R, 130G, 130B, and 130IR and a light-receiving device 150 are provided over a layer 101 including a transistor, and a protective layer 131 is provided to cover the light-emitting devices and the light-receiving device. A substrate 120 is bonded to the protective layer 131 with a resin layer 122. In a region between two adjacent devices (a light-emitting device and a light-receiving device, two light-emitting devices, or two light-receiving devices), an insulating layer 125 and an insulating layer 127 over the insulating layer 125 are provided.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

The layer 101 including a transistor can employ a stacked-layer structure in which a plurality of transistors are provided over a substrate and an insulating layer is provided to cover these transistors, for example. The layer 101 including a transistor may have a depression portion between two adjacent devices. For example, a depression portion may be provided in an insulating layer positioned at the outermost surface of the layer 101 including a transistor. Structure examples of the layer 101 including a transistor will be described in Embodiment 4.

The light-emitting device 130R emits red (R) light. The light-emitting device 130G emits green (G) light. The light-emitting device 130B emits blue (B) light. The light-emitting device 130IR emits infrared (IR) light.

The light-emitting device includes an EL layer between a pair of electrodes. In this specification and the like, one of the pair of electrodes may be referred to as a pixel electrode and the other may be referred to as a common electrode.

One of the pair of electrodes of the light-emitting device functions as an anode, and the other electrode functions as a cathode. The case where the pixel electrode functions as an anode and the common electrode functions as a cathode will be described below as an example.

The light-emitting device 130R includes a conductive layer 111*a* over the layer 101 including a transistor, a first layer 113*a* having an island shape over the conductive layer 111*a*, a sixth layer 114 over the first layer 113*a* having an island shape, and a common electrode 115 over the sixth layer 114. The conductive layer 111*a* functions as a pixel electrode. In the light-emitting device 130R, the first layer 113*a* and the sixth layer 114 can be collectively referred to as an EL layer. Description in Embodiment 5 can be referred to for the structure example of the light-emitting device.

The first layer 113a includes a hole-injection layer, a hole-transport layer, a light-emitting layer, and an electron-transport layer, for example. Alternatively, the first layer 113a includes a first light-emitting unit, a charge generation layer, and a second light-emitting unit.

The sixth layer 114 includes an electron-injection layer, for example. Alternatively, the sixth layer 114 may include a stack of an electron-transport layer and an electron-injection layer.

The light-emitting device 130G includes a conductive layer 111b over the layer 101 including a transistor, a second layer 113b having an island shape over the conductive layer 111b, the sixth layer 114 over the second layer 113b having an island shape, and the common electrode 115 over the sixth layer 114. The conductive layer 111b functions as a pixel electrode. In the light-emitting device 130G, the second layer 113b and the sixth layer 114 can be collectively referred to as an EL layer.

The light-emitting device 130IR includes a conductive layer 111c over the layer 101 including a transistor, a third layer 113c having an island shape over the conductive layer 111c, the sixth layer 114 over the third layer 113c having an island shape, and the common electrode 115 over the sixth layer 114. The conductive layer 111c functions as a pixel electrode. In the light-emitting device 130IR, the third layer 113c and the sixth layer 114 can be collectively referred to as an EL layer.

The light-emitting device 130B includes a conductive layer 111d over the layer 101 including a transistor, a fourth layer 113d having an island shape over the conductive layer 111d, the sixth layer 114 over the fourth layer 113d having an island shape, and the common electrode 115 over the sixth layer 114. The conductive layer 111d functions as a pixel electrode. In the light-emitting device 130B, the fourth layer 113d and the sixth layer 114 can be collectively referred to as an EL layer.

The light-receiving device includes an active layer between a pair of electrodes. In this specification and the like, one of the pair of electrodes may be referred to as a pixel electrode and the other may be referred to as a common electrode.

The light-receiving device can have a structure in which one or both of infrared light and visible light can be sensed. As the structure in which visible light is sensed, a structure can be given in which one or more of blue light, violet light, bluish violet light, green light, yellowish green light, yellow light, orange light, red light, and the like are sensed.

One of the pair of electrodes included in the light-receiving device functions as an anode, and the other functions as a cathode. Hereinafter, the case where the pixel electrode functions as an anode and the common electrode functions as a cathode is described as an example. The light-receiving device is driven by application of reverse bias between the pixel electrode and the common electrode, whereby light incident on the light-receiving device can be sensed and electric charge can be generated and extracted as current. Alternatively, the pixel electrode may function as a cathode and the common electrode may function as an anode.

The light-receiving device 150 includes a conductive layer 111e over the layer 101 including a transistor, a fifth layer 113e having an island shape over the conductive layer 111e, the sixth layer 114 over the fifth layer 113e having an island shape, and the common electrode 115 over the sixth layer 114. The conductive layer 111e functions as a pixel electrode.

The fifth layer 113e includes at least an active layer. The fifth layer 113e can further include one or more of a hole-transport layer, an electron-blocking layer, a hole-blocking layer, and an electron-transport layer.

The sixth layer 114 is shared by the light-emitting devices and the light-receiving device. The sixth layer 114 includes, for example, the electron-injection layer, as described above. Alternatively, the sixth layer 114 may include a stack of an electron-transport layer and an electron-injection layer.

The common electrode 115 is electrically connected to a conductive layer 123 provided in the connection portion 140. Note that FIG. 1B illustrates an example in which the sixth layer 114 is provided over the conductive layer 123 and the conductive layer 123 and the common electrode 115 are electrically connected to each other through the sixth layer 114. The sixth layer 114 is not necessarily provided in the connection portion 140. For example, FIG. 3C illustrates an example in which the sixth layer 114 is not provided over the conductive layer 123 and the conductive layer 123 and the common electrode 115 are directly connected to each other.

For example, by using a mask for specifying a film formation area (also referred to as an area mask or a rough metal mask), the sixth layer 114 can be formed in a region different from a region where the common electrode 115 is formed.

The side surfaces of the conductive layers 111a to 111e, the first layer 113a, the second layer 113b, the third layer 113c, the fourth layer 113d, and the fifth layer 113e are covered with the insulating layer 125 and the insulating layer 127. Accordingly, the sixth layer 114 (or the common electrode layer 115) is inhibited from being in contact with the side surface of any of the conductive layers 111a to 111e, the first layer 113a, the second layer 113b, the third layer 113c, the fourth layer 113d, and the fifth layer 113e, whereby a short circuit of the light-emitting devices and the light-receiving device can be inhibited. Thus, the reliability of the light-emitting devices and the light-receiving device can be increased.

The insulating layer 125 preferably covers at least the side surfaces of the conductive layers 111a to 111e. In addition, the insulating layer 125 further preferably covers the side surfaces of the first layer 113a, the second layer 113b, the third layer 113c, the fourth layer 113d, and the fifth layer 113e. The insulating layer 125 can be in contact with the side surfaces of the conductive layers 111a to 111e, the first layer 113a, the second layer 113b, the third layer 113c, the fourth layer 113d, and the fifth layer 113e.

The insulating layer 127 is provided over the insulating layer 125 to fill depression portions of the insulating layer 125. The insulating layer 127 can overlap with (or cover) the side surfaces of the conductive layers 111a to 111e, the first layer 113a, the second layer 113b, the third layer 113c, the fourth layer 113d, and the fifth layer 113e with the insulating layer 125 between the insulating layer 127 and the side surfaces.

The insulating layer 125 and the insulating layer 127 can fill a gap between the adjacent island-shaped layers, whereby the formation surface of a layer (e.g., the common electrode) provided over the island-shaped layers can be less uneven and flatter. Thus, the coverage with the common electrode can be increased and disconnection of the common electrode can be prevented.

The insulating layer 125 and the insulating layer 127 can be provided in contact with the island-shaped layers. Thus, the island-shaped layers can be prevented from being separated. When the insulating layer and the island-shaped layers are in close contact with each other, the adjacent island-shaped layers can be fixed by or attached to the insulating layer.

An organic resin film is suitable as the insulating layer 127. In the case where the side surface of an EL layer and a photosensitive organic resin film are in direct contact with each other, the EL layer might be damaged by an organic solvent or the like that might be contained in the photosensitive organic resin film. When an aluminum oxide film formed by an atomic layer deposition (ALD) method is used as the insulating layer 125, a structure can be employed in which the photosensitive organic resin film used as the insulating layer 127 and the side surface of the EL layer are not in direct contact with each other. Thus, the EL layer can be inhibited from being dissolved by the organic solvent, for example.

Note that one of the insulating layer 125 and the insulating layer 127 is not necessarily provided. For example, a single-layer insulating layer 125 using an inorganic material can be used as a protective insulating layer of the EL layer. In this way, the reliability of the display apparatus can be increased. For another example, a single-layer insulating layer 127 using an organic material can fill a gap between the adjacent EL layers and planarization can be performed. In this way, the coverage with the common electrode (the upper electrode) formed over the EL layers and the insulating layer 127 can be increased.

Figure 3A:
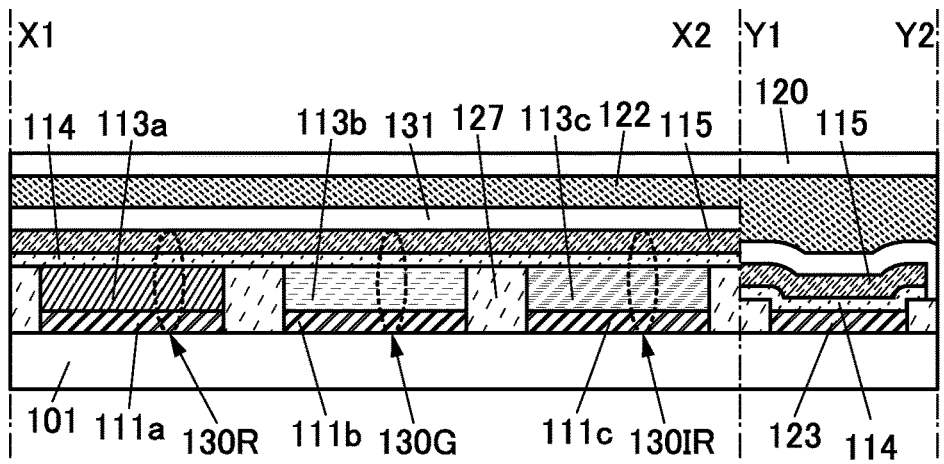
FIGS. 3A to 3C are cross-sectional views each illustrating an example of a display apparatus.

FIG. 3A illustrates an example in which the insulating layer 125 is not provided. In the case where the insulating layer 125 is not provided, the insulating layer 127 can be in contact with the side surfaces of the conductive layers 111a to 111e, the first layer 113a, the second layer 113b, the third layer 113c, the fourth layer 113d, and the fifth layer 113e. The insulating layer 127 can be provided to fill gaps between the EL layers of the light-emitting devices.

At this time, it is preferable to use, for the insulating layer 127, an organic material that causes less damage to the first layer 113a, the second layer 113b, the third layer 113c, the fourth layer 113d, and the fifth layer 113e. For example, it is preferable to use, for the insulating layer 127, an organic material such as polyvinyl alcohol (PVA), polyvinyl butyral, polyvinyl pyrrolidone, polyethylene glycol, polyglycerin, pullulan, water-soluble cellulose, or alcohol-soluble polyamide resin.

Figure 3B:
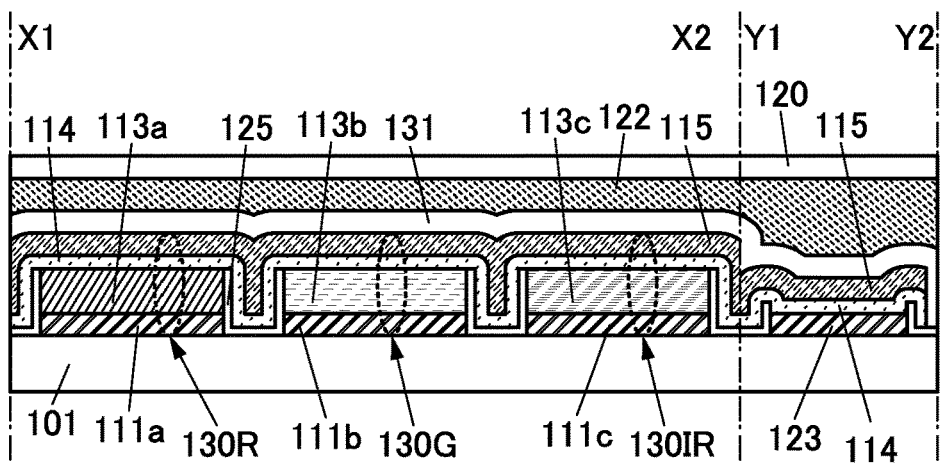
Figure 3C:
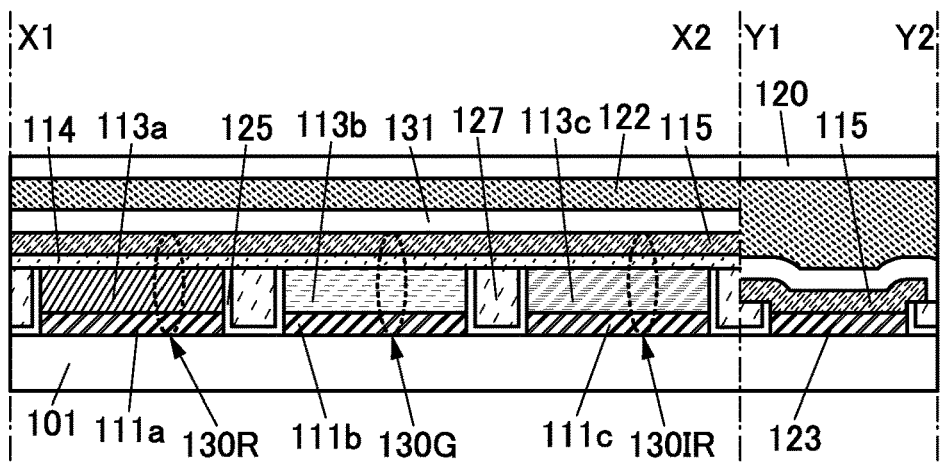

FIG. 3B illustrates an example in which the insulating layer 127 is not provided.

The sixth layer 114 and the common electrode 115 are provided over the first layer 113a, the second layer 113b, the third layer 113c, the fourth layer 113d, the fifth layer 113e, the insulating layer 125, and the insulating layer 127. Before the insulating layer 125 and the insulating layer 127 are provided, a step is generated due to a difference between a region where the pixel electrode and the EL layer are provided and a region where neither the pixel electrode nor the EL layer is provided (region between the light-emitting elements). In the display apparatus of one embodiment of the present invention, the step can be planarized with the insulating layer 125 and the insulating layer 127, and the coverage with the sixth layer 114 and the common electrode 115 can be improved. Thus, connection defects caused by disconnection can be inhibited. Alternatively, an increase in electrical resistance, which is caused by a reduction in thickness locally of the common electrode 115 due to the step, can be prevented.

To improve the planarity of a surface over which the sixth layer 114 and the common electrode 115 are formed, the levels of the top surfaces of the insulating layers 125 and 127 are preferably aligned or substantially aligned with at least one of the levels of the top surfaces of the first layer 113a, the second layer 113b, the third layer 113c, the fourth layer 113d, and the fifth layer 113e. The top surface of the insulating layer 127 preferably has a flat surface, and may include a projection portion, a convex surface, a concave surface, or a depression portion.

The insulating layer 125 includes regions in contact with the side surfaces of the first layer 113a, the second layer 113b, the third layer 113c, the fourth layer 113d, and the fifth layer 113e, and functions as a protective insulating layer of the first layer 113a, the second layer 113b, the third layer 113c, the fourth layer 113d, and the fifth layer 113e. With the insulating layer 125, entry of impurities such as oxygen or moisture from the side surfaces of the first layer 113a, the second layer 113b, the third layer 113c, the fourth layer 113d, and the fifth layer 113e into their insides can be prevented, and thus a highly reliable display apparatus can be obtained.

When the widths (thicknesses) of the insulating layer 125 in the regions in contact with the side surfaces of the first layer 113a, the second layer 113b, the third layer 113c, the fourth layer 113d, and the fifth layer 113e are large in the cross-sectional view, the distance between the first layer 113a, the second layer 113b, the third layer 113c, the fourth layer 113d, and the fifth layer 113e is large, which results in a reduction in aperture ratio in some cases. When the widths (thicknesses) of the insulating layer 125 are small, the effect of preventing entry of impurities from the side surfaces of the first layer 113a, the second layer 113b, the third layer 113c, the fourth layer 113d, and the fifth layer 113e into their insides is lowered in some cases. The widths (thicknesses) of the insulating layer 125 in the regions in contact with the side surfaces of the first layer 113a, the second layer 113b, the third layer 113c, the fourth layer 113d, and the fifth layer 113e are preferably greater than or equal to 3 nm and less than or equal to 200 nm, further preferably greater than or equal to 3 nm and less than or equal to 150 nm, still further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet still further preferably greater than or equal to 10 nm and less than or equal to 50 nm. When the width (thickness) of the insulating layer 125 is within the above range, a highly reliable display apparatus with a high aperture ratio can be obtained.

The insulating layer 125 can be formed using an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium-gallium-zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, aluminum oxide is preferably used because it has high selectivity with respect to the EL layer in etching and has a function of protecting the EL layer when the insulating layer 127 to be described later is formed. An inorganic insulating film such as an aluminum oxide film, a hafnium oxide film, or a silicon oxide film is formed by an ALD method as the insulating layer 125, whereby the insulating layer 125 can have few pinholes and an excellent function of protecting the EL layer. The insulating layer 125 may have a stacked-layer structure of a film formed by an ALD method and a film formed by a sputtering method. The insulating layer 125 may have a stacked-layer structure of an aluminum oxide film formed by an ALD method and a silicon nitride film formed by a sputtering method, for example.

Note that in this specification and the like, oxynitride refers to a material that contains more oxygen than nitrogen, and nitride oxide refers to a material that contains more nitrogen than oxygen. For example, silicon oxynitride refers to a material which contains oxygen at a higher proportion than nitrogen, and silicon nitride oxide refers to a material which contains nitrogen at a higher proportion than oxygen.

As the formation method of the insulating layer 125, a sputtering method, a chemical vapor deposition (CVD) method, a pulsed laser deposition (PLD) method, an ALD method, and the like can be given. The insulating layer 125 is preferably formed by an ALD method achieving good coverage.

The insulating layer 127 over the insulating layer 125 has a function of reducing the depression portion of the insulating layer 125 formed between adjacent light-emitting devices. In other words, the insulating layer 127 brings an effect of improving the planarity of a surface where the common electrode 115 is formed. As the insulating layer 127, an insulating layer containing an organic material can be favorably used. Examples of materials used for the insulating layer 127 include an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. Examples of organic materials used for the insulating layer 127 include polyvinyl alcohol (PVA), polyvinyl butyral, polyvinyl pyrrolidone, polyethylene glycol, polyglycerin, pullulan, water-soluble cellulose, and an alcohol-soluble polyamide resin. Alternatively, a photosensitive resin can be used for the insulating layer 127. A photoresist may be used for the photosensitive resin. As the photosensitive resin, a positive photosensitive material or a negative photosensitive material can be used.

The level difference between the top surface of the insulating layer 127 and the top surface of any of the first layer 113a, the second layer 113b, the third layer 113c, the fourth layer 113d, and the fifth layer 113e is, preferably, for example, less than or equal to 0.5 times the thickness of the insulating layer 127, further preferably less than or equal to 0.3 times the thickness of the insulating layer 127. The insulating layer 127 may be provided such that the level of the top surface of any of the first layer 113a, the second layer 113b, the third layer 113c, the fourth layer 113d, and the fifth layer 113e is higher than the level of the top surface of the insulating layer 127, for example. Further alternatively, the insulating layer 127 may be provided such that the level of the top surface of insulating layer 127 is higher than the level of the top surface of the light-emitting layer included in any of the first layer 113a, the second layer 113b, the third layer 113c, and the fourth layer 113d.

The protective layer 131 is preferably provided over the light-emitting devices 130R, 130G, 130B, and 1301R and the light-receiving device 150. Providing the protective layer 131 can improve the reliability of the light-emitting devices and the light-receiving device.

There is no limitation on the conductivity of the protective layer 131. As the protective layer 131, at least one type of insulating films, semiconductor films, and conductive films can be used.

The protective layer 131 including an inorganic film can prevent oxidation of the common electrode 115 and entry of impurities (such as moisture and oxygen) into the light-emitting devices 130R, 130G, 130B, and 1301R and the light-receiving device 150. Thus, the light-emitting devices and the light-receiving device are inhibited from deteriorating and the reliability of the display apparatus can be increased.

As the protective layer 131, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

The protective layer 131 preferably includes a nitride insulating film or a nitride oxide insulating film, and further preferably includes a nitride insulating film.

As the protective layer 131, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layer 131, the protective layer 131 preferably has a high visible-light-transmitting property. For example, ITO, IGZO, and aluminum oxide are preferable because they are inorganic materials having a high visible-light-transmitting property.

The protective layer 131 can be, for example, a stack of an aluminum oxide film and a silicon nitride film over the aluminum oxide film, or a stack of an aluminum oxide film and an IGZO film over the aluminum oxide film. Such a stacked-layer structure can suppress entry of impurities (such as water and oxygen) into the EL layer.

Furthermore, the protective layer 131 may include an organic film. For example, the protective layer 131 may include both an organic film and an inorganic film.

The end portions of the top surfaces of the conductive layers 111a to 111e are not covered with an insulating layer. Thus, the distance between adjacent light-emitting devices can be extremely shortened. Accordingly, the display apparatus can have high resolution or high definition.

Figure 4A:
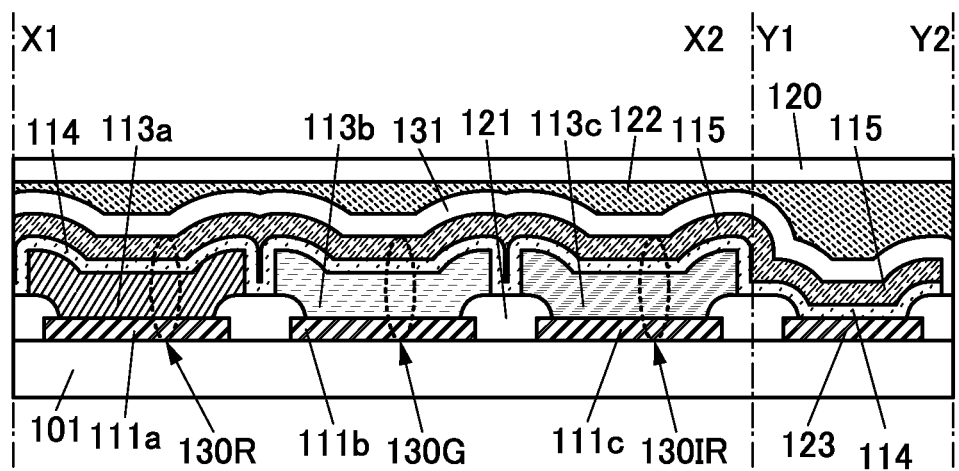
FIGS. 4A and 4B are cross-sectional views each illustrating an example of a display apparatus.
Figure 4B:
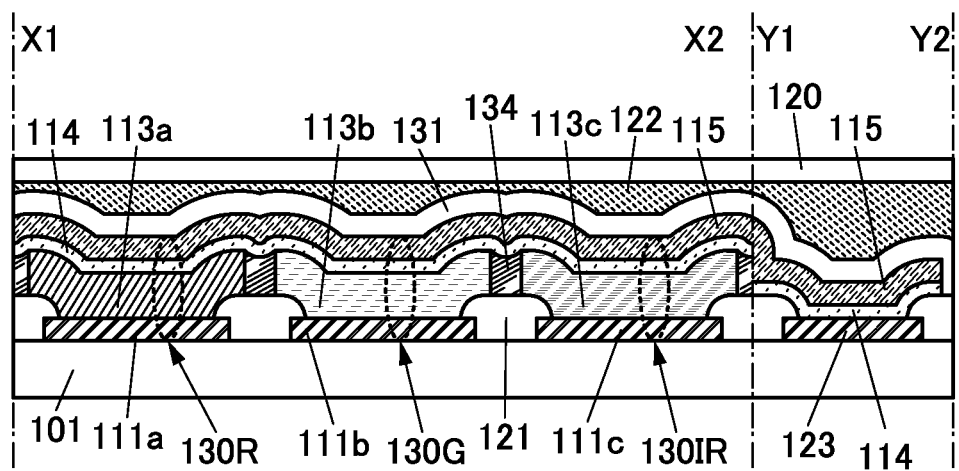

Note that as illustrated in FIGS. 4A and 4B, the end portions of the conductive layers 111a to 111c may be covered with an insulating layer 121.

The insulating layer 121 can have a single-layer structure or a stacked-layer structure including one or both of an inorganic insulating film and an organic insulating film.

Examples of an organic insulating material that can be used for the insulating layer 121 include an acrylic resin, an epoxy resin, a polyimide resin, a polyamide resin, a polyimide-amide resin, a polysiloxane resin, a benzocyclobutene-based resin, and a phenol resin. As an inorganic insulating film that can be used as the insulating layer 121, an inorganic insulating film that can be used as the protective layer 131 can be used.

When an inorganic insulating film is used as the insulating layer 121 covering the end portion of the pixel electrode, impurities are less likely to enter the light-emitting device as compared with the case where an organic insulating film is used; therefore, the reliability of the light-emitting device can be improved. When an organic insulating film is used as the insulating layer 121 covering the end portion of the pixel electrode, a short circuit in the light-emitting device can be prevented because the organic insulating film has higher step coverage and is less likely to be influenced by the shape of the pixel electrode than the inorganic insulating film. Specifically, when an organic insulating film is used as the insulating layer 121, the insulating layer 121 can be processed into a tapered shape or the like. Note that in this specification and the like, a tapered shape refers to a shape such that at least part of a side surface of a component is inclined with respect to the substrate surface or the surface where the component is formed. For example, a tapered shape preferably includes a region where the angle between the inclined side surface and the substrate surface or the surface where a component is formed (such an angle is also referred to as a taper angle) is less than 90°.

Note that the insulating layer 121 is not necessarily provided. The aperture ratio of the subpixel can be sometimes increased without providing the insulating layer 121. Alternatively, the distance between subpixels can be shortened and the resolution or the definition of the display apparatus can be sometimes increased.

Note that FIG. 4A illustrates an example in which the sixth layer 114 is also formed in a region between the first layer 113a and the second layer 113b, for example; however, as illustrated in FIG. 4B, a space 134 may be formed in the region.

The space 134 includes, for example, one or more selected from air, nitrogen, oxygen, carbon dioxide, and Group 18 elements (typically, helium, neon, argon, xenon, and krypton). Alternatively, a resin or the like may be embedded in the space 134.

FIG. 1A and the like illustrate an example in which the end portion of the conductive layer 111a and the end portion of the first layer 113a are aligned or substantially aligned with each other. In other words, the top surface shape of the conductive layer 111a and the top surface shape of the first layer 113a are the same or substantially the same.

Figure 5A:
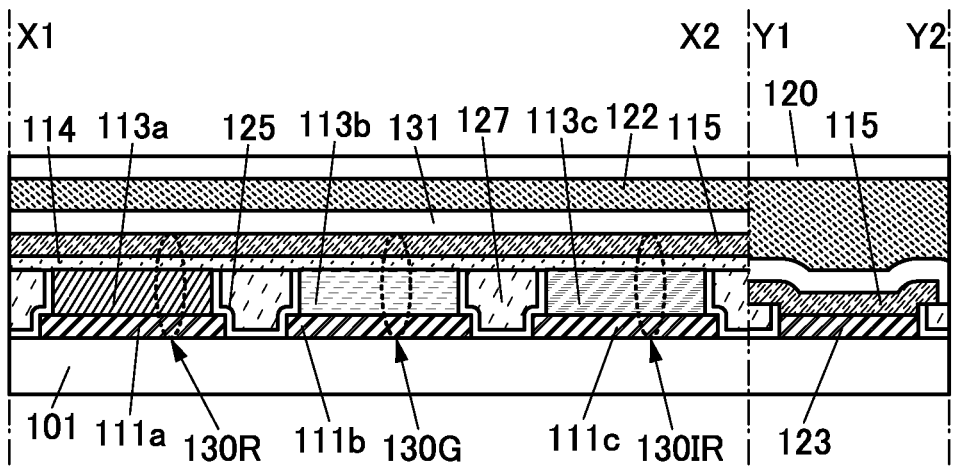
FIGS. 5A to 5C are cross-sectional views each illustrating an example of a display apparatus.
Figure 5B:
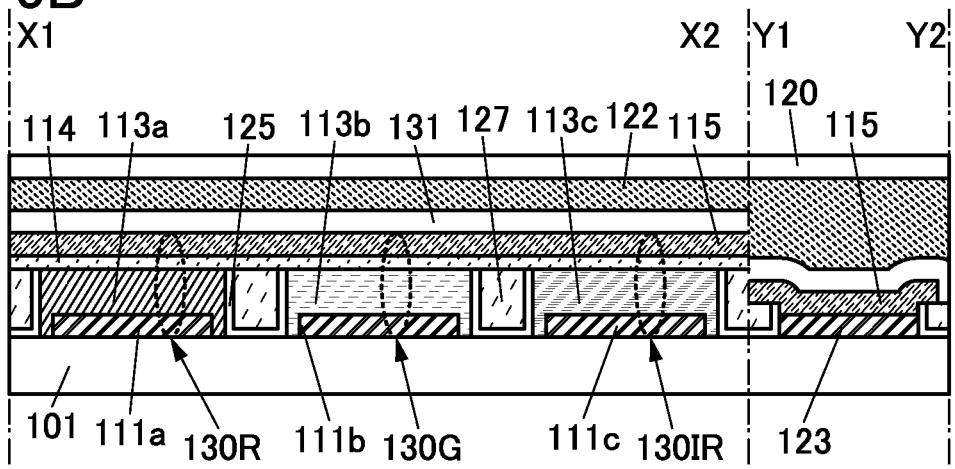

The size relationships between the conductive layer 111a and the first layer 113a, between the conductive layer 111b and the second layer 113b, between the conductive layer 111c and the third layer 113c, and the like are not particularly limited. FIG. 5A illustrates an example in which the end portion of the first layer 113a is positioned on an inner side than the end portion of the conductive layer 111a. In FIG. 5A, the end portion of the first layer 113a is positioned over the conductive layer 111a. FIG. 5B illustrates an example in which the end portion of the first layer 113a is positioned on an outer side than the end portion of the conductive layer 111a. In FIG. 5B, the first layer 113a is provided to cover the end portion of the conductive layer 111a.

In the case where end portions are aligned or substantially aligned with each other and the case where top surface shapes are the same or substantially the same, it can be said that outlines of stacked layers at least partly overlap with each other in a top view. For example, the case of patterning or partly patterning an upper layer and a lower layer with the use of the same mask pattern is included in the expression. The expression "end portions are aligned or substantially aligned with each other" or "top surface shapes are the same or substantially the same" also includes the case where the outlines do not completely overlap with each other; for instance, the edge of the upper layer may be positioned on an inner side or an outer side than the edge of the lower layer.

Figure 5C:
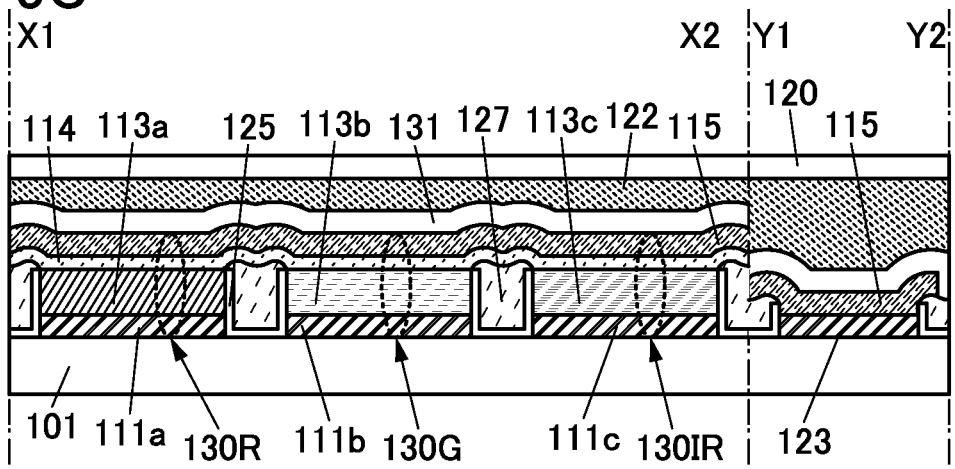

FIG. 5C illustrates a modification example of the insulating layer 127. In the cross-sectional view of FIG. 5C, the top surface of the insulating layer 127 gently rises from its end portions toward the center, i.e., has convexities, and has a depression portion in the center and its vicinity, i.e., has a concavity.

FIGS. 6A to 6F each illustrate a cross-sectional structure of a region 139 including the insulating layer 127 and its surroundings.

Figure 6A:
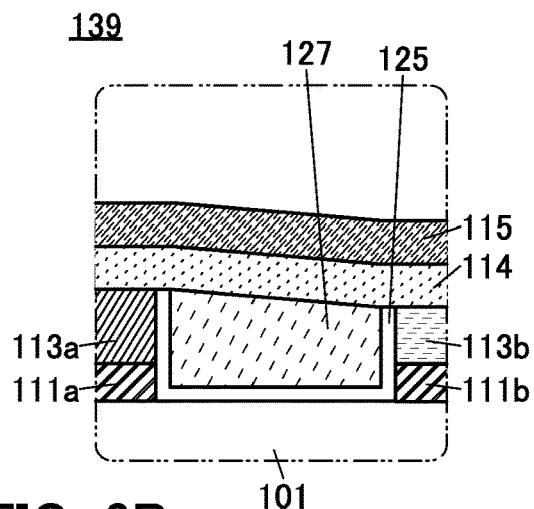
FIGS. 6A to 6F are cross-sectional views each illustrating an example of a display apparatus.

FIG. 6A illustrates an example in which the first layer 113a and the second layer 113b have different thicknesses. The level of the top surface of the insulating layer 125 agrees with or substantially agrees with the level of the top surface of the first layer 113a on the first layer 113a side, and agrees with or substantially agrees with the level of the top surface of the second layer 113b on the second layer 113b side. The top surface of the insulating layer 127 has a gentle slope such that the side closer to the first layer 113a is higher and the side closer to the second layer 113b is lower. In this manner, the levels of the insulating layers 125 and 127 are preferably equal to the levels of the top surfaces of the adjacent EL layers. Alternatively, the top surface of the insulating layer 125 and the top surface of the insulating layer 127 may each include a flat portion that is level with the top surface of any of the layers of the adjacent EL layers.

Figure 6B:
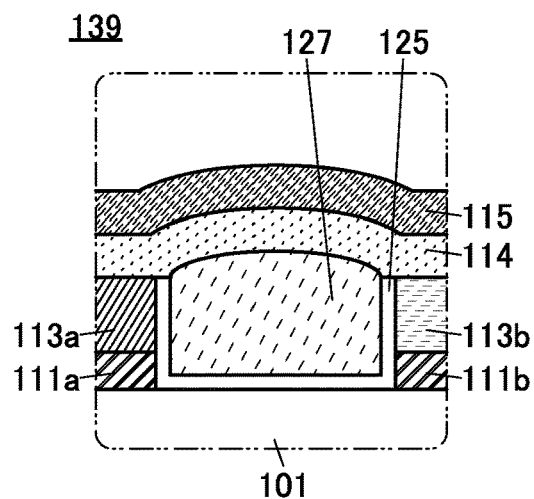

In FIG. 6B, the top surface of the insulating layer 127 includes a region higher than the top surface of the first layer 113a and the top surface of the second layer 113b. As illustrated in FIG. 6B, it can be said that the top surface of the insulating layer 127 has a shape in which its center and vicinity thereof rise, i.e., a shape including a convex surface, in the cross-sectional view.

Figure 6C:
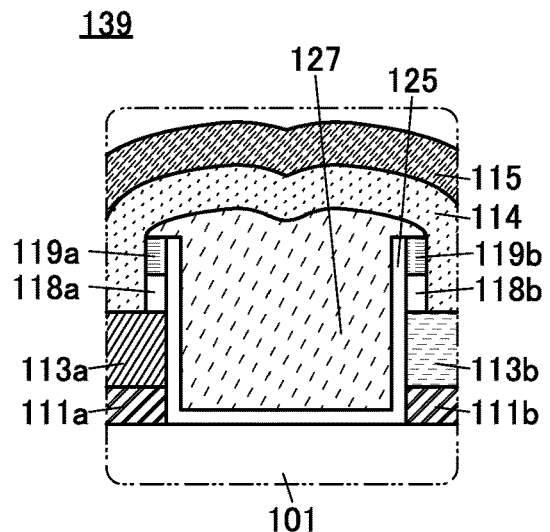

In the cross-sectional view of FIG. 6C, the top surface of the insulating layer 127 gently rises from its end portions toward the center, i.e., has convexities, and has a depression portion in the center and its vicinity, i.e., has a concavity. The insulating layer 127 includes a region higher than the top surface of the first layer 113a and the top surface of the second layer 113b. In the region 139 of the display apparatus, at least one of a sacrifice layer 118a and a sacrifice layer 119a is included, the insulating layer 127 includes a first region whose level is higher than the top surface of the first layer 113a and that is positioned outside the insulating layer 125, and the first region is positioned over at least one of the sacrifice layer 118a and the sacrifice layer 119a. In the region 139 of the display apparatus, at least one of a sacrifice layer 118b and a sacrifice layer 119b is included, the insulating layer 127 includes a second region whose level is higher than the top surface of the second layer 113b and that is positioned outside the insulating layer 125, and the second region is positioned over at least one of the sacrifice layer 118b and the sacrifice layer 119b.

Figure 6D:
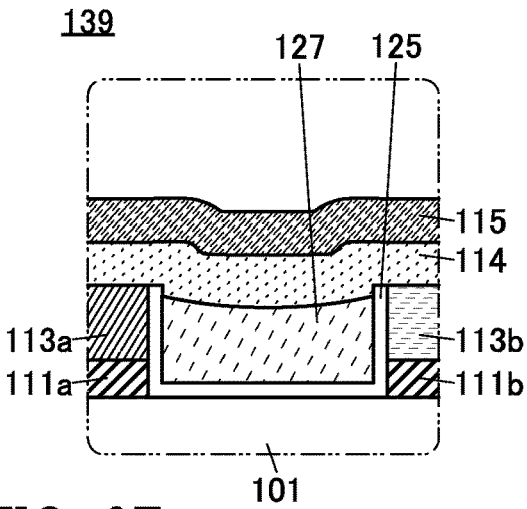

In FIG. 6D, the top surface of the insulating layer 127 includes a region whose level is lower than the levels of the top surface of the first layer 113a and the top surface of the second layer 113b. In the cross-sectional view, the top surface of the insulating layer 127 has a depression portion in the center and its vicinity, i.e., has a concavity.

Figure 6E:
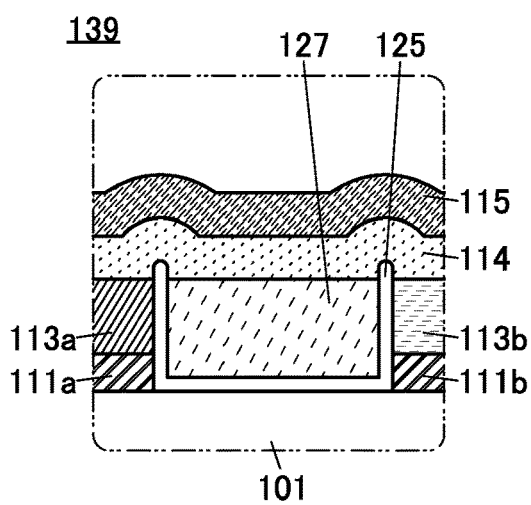

In FIG. 6E, the top surface of the insulating layer 125 includes a region lower than the top surface of the first layer 113a and the top surface of the second layer 113b. That is, the insulating layer 125 protrudes from the formation surface of the sixth layer 114 and forms a projection.

For example, when the insulating layer 125 is formed so that its level is equal to or substantially equal to the level of the sacrificial layer, the insulating layer 125 may protrude as illustrated in FIG. 6E.

Figure 6F:
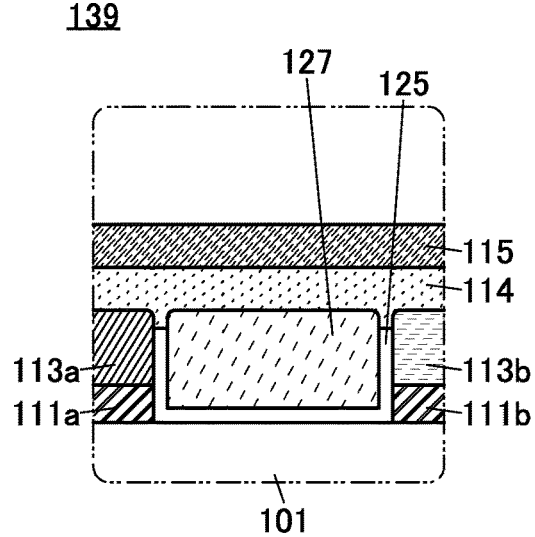

In FIG. 6F, the top surface of the insulating layer 125 includes a region whose level is lower than the levels of the top surface of the first layer 113a and the top surface of the second layer 113b. That is, the insulating layer 125 forms a depression portion on the formation surface of the sixth layer 114.

As described above, the insulating layer 125 and the insulating layer 127 can have a variety of shapes.

As the sacrifice layer, one or more of inorganic films such as a metal film, an alloy film, a metal oxide film, a semiconductor film, and an inorganic insulating film can be used, for example.

For example, a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials can be used for the sacrifice layer.

For the sacrificial layer, a metal oxide such as In—Ga—Zn oxide can be used. As the sacrificial layer, an In—Ga—Zn oxide film can be formed by a sputtering method, for example. Furthermore, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like can be used. Indium tin oxide containing silicon, or the like can also be used.

In addition, in place of gallium described above, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used.

As the sacrificial layer, a variety of inorganic insulating films that can be used as the protective layer 131 can be used. In particular, an oxide insulating film is preferable because its adhesion to the EL layer is higher than that of a nitride insulating film. For example, an inorganic insulating material such as aluminum oxide, hafnium oxide, or silicon oxide can be used for the sacrificial layer. As the sacrificial layer, an aluminum oxide film can be formed by an ALD method, for example. The use of an ALD method is preferable, in which case damage to a base (in particular, the EL layer or the like) can be reduced. For example, a silicon nitride film can be formed by a sputtering method.

For example, the sacrifice layer can employ a stacked-layer structure of an inorganic insulating film (e.g., an aluminum oxide film) formed by an ALD method and an In—Ga—Zn oxide film formed by a sputtering method. Alternatively, the sacrifice layer can employ a stacked-layer structure of an inorganic insulating film (e.g., an aluminum oxide film) formed by an ALD method and an aluminum film, a tungsten film, or an inorganic insulating film (e.g., a silicon nitride film) formed by a sputtering method.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a structure in which light-emitting layers in light-emitting devices of different colors (here, blue (B), green (G), and red (R)) are separately formed or separately patterned may be referred to as a side-by-side (SBS) structure. The SBS structure can optimize materials and structures of light-emitting devices and thus can extend freedom of choice of materials and structures, whereby the luminance and the reliability can be easily improved.

In this specification and the like, a light-emitting device capable of emitting white light may be referred to as a white light-emitting device. Note that a combination of such a white light-emitting device with coloring layers (e.g., color filters) enables providing a full-color display apparatus.

Structures of light-emitting devices can be classified roughly into a single structure and a tandem structure. A light-emitting device with a single structure includes one light-emitting unit between a pair of electrodes, and the light-emitting unit preferably includes one or more light-emitting layers. When two light-emitting layers are used to obtain white light emission, two light-emitting layers that emit light of complementary colors are selected. For example, when emission colors of a first light-emitting layer and a second light-emitting layer are complementary colors, a light-emitting device can be configured to emit white light as a whole. In the case where three or more light-emitting layers are used to obtain white light emission, a light-emitting device is configured to emit white light as a whole by combining emission colors of the three or more light-emitting layers.

A light-emitting device with a tandem structure includes two or more light-emitting units between a pair of electrodes, and each light-emitting unit preferably includes one or more light-emitting layers. To obtain white light emission, white light may be obtained by combining light emitted from light-emitting layers of a plurality of light-emitting units. Note that the structure that can provide white light emission is similar to that of the single structure. In the light-emitting device with a tandem structure, it is preferable that an intermediate layer such as a charge-generation layer be provided between the plurality of light-emitting units.

When the white light-emitting device (having a single structure or a tandem structure) and a light-emitting device having an SBS structure are compared to each other, the latter can have lower power consumption than the former. To reduce power consumption, a light-emitting device having an SBS structure is preferably used.

Meanwhile, the white light-emitting device is preferable in terms of lower manufacturing cost or higher manufacturing yield because the manufacturing process of the white light-emitting device is simpler than that of a light-emitting device having an SBS structure.

In the display apparatus of this embodiment, the distance between the light-emitting devices can be narrowed. Specifically, the distance between the light-emitting devices, the distance between the EL layers, or the distance between the pixel electrodes can be less than 10 µm, 5 µm or less, 3 µm or less, 2 µm or less, 1 µm or less, 500 nm or less, 200 nm or less, 100 nm or less, 90 nm or less, 70 nm or less, 50 nm or less, 30 nm or less, 20 nm or less, 15 nm or less, or 10 nm or less. In other words, the display apparatus includes a region where the distance between the side surface of the first layer 113a and the side surface of the second layer 113b or the distance between the side surface of the second layer 113b and the side surface of the third layer 113c is 1 μm or less, preferably 0.5 μm (500 nm) or less, further preferably 100 nm or less.

Note that the distance between the light-emitting device and the light-receiving device can be set within the above range. In order to suppress leakage between the light-emitting device and the light-receiving device, the distance between the light-emitting device and the light-receiving device is preferably larger than the distance between the light-emitting devices. For example, the distance between the light-emitting device and the light-receiving device can be set to 8 μm or less, 5 μm or less, or 3 μm or less.

One or both of a light-blocking layer and a color filter may be provided on the surface of the substrate 120 on the resin layer 122 side. Moreover, a variety of optical members can be provided on the outer side of the substrate 120. Examples of optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be provided on the outer surface of the substrate 120.

For the substrate 120, glass, quartz, ceramic, sapphire, a resin, a metal, an alloy, a semiconductor or the like can be used. The substrate on the side from which light from the light-emitting device is extracted is formed using a material which transmits the light. When a flexible material is used for the substrate 120, the display apparatus can have increased flexibility and a flexible display can be obtained. Furthermore, a polarizing plate may be used as the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as the substrate 120.

In the case where a circularly polarizing plate overlaps the display apparatus, a highly optically isotropic substrate is preferably used as the substrate included in the display apparatus. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of films having high optical isotropy include a triacetyl cellulose (TAC, also referred to as cellulose triacetate) film, a cycloolefin polymer (COP) film, a cycloolefin copolymer (COC) film, and an acrylic film.

When a film used as the substrate absorbs water, the shape of the display panel might be changed, e.g., creases might be caused. Thus, as the substrate, a film with a low water absorption rate is preferably used. For example, the water absorption rate of the film is preferably 1% or lower, further preferably 0.1% or lower, still further preferably 0.01% or lower.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As materials for a gate, a source, and a drain of a transistor and conductive layers functioning as wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, stacked films of any of the above materials can be used for the conductive layers. For example, stacked films of indium tin oxide and an alloy of silver and magnesium are preferably used, in which case the conductivity can be increased. These materials can also be used for conductive layers such as wirings and electrodes included in the display apparatus, and conductive layers (e.g., a conductive layer functioning as the pixel electrode or the common electrode) included in the light-emitting device.

Examples of insulating materials that can be used for insulating layers include resins such as an acrylic resin and an epoxy resin, and inorganic insulating materials such as silicon oxide, silicon oxynitride, silicon nitride oxide, silicon nitride, and aluminum oxide.

Next, materials that can be used for the light-emitting device and the light-receiving device will be described.

A conductive film that transmits visible light and infrared light is used as the electrode through which light is extracted, which is either the pixel electrode or the common electrode. A conductive film that reflects visible light and infrared light is preferably used as the electrode through which light is not extracted.

For the pair of electrodes (the pixel electrode and the common electrode) of the light-emitting device and the light-receiving device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device and the light-receiving device preferably employ a microcavity structure. Therefore, one of the pair of electrodes of each of the light-emitting device and the light-receiving device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified. When the light-receiving device has a microcavity structure, light received by the active layer can be resonated between the electrodes, whereby the light can be intensified and the sensing accuracy of the light-receiving device can be increased.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting device. The visible light reflectivity of the transflective electrode is higher than or equal to 10% and less than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1 \times 10^{-2}$ Ωcm or lower. The near-infrared light (light at wavelengths greater than or equal to 750 nm and less than or equal to 1300 nm) transmittance and reflectivity of these electrodes preferably satisfy the above-described numerical ranges of the visible light transmittance and reflectivity.

The first layer 113a, the second layer 113b, the third layer 113c, and the fourth layer 113d each include a light-emitting layer. The first layer 113a, the second layer 113b, the third layer 113c, and the fourth layer 113d preferably include light-emitting layers emitting light of different colors.

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by exciplex-triplet energy transfer (ExTET), which is energy transfer from the exciplex to the light-emitting substance (phosphorescent material). When a combination of materials is selected so as to form an exciplex that emits light whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the first layer 113a, the second layer 113b, the third layer 113c, and the fourth layer 113d may also include a layer containing any of a substance with a high hole-injection property, a substance with a high hole-transport property (also referred to as a hole-transport material), a hole-blocking material, a substance with a high electron-transport property (also referred to as an electron-transport material), a substance with a high electron-injection property, an electron-blocking material, a substance with a bipolar property (also referred to as a substance with a high electron- and hole-transport property or a bipolar material), and the like.

Either a low molecular compound or a high molecular compound can be used in the light-emitting device, and an inorganic compound may also be included. Each layer included in the light-emitting device can be formed by any of the following methods: an evaporation method (including a vacuum evaporation method), a transfer method, a printing method, an inkjet method, a coating method, and the like.

For example, the first layer 113a, the second layer 113b, the third layer 113c, and the fourth layer 113d may each include one or more of a hole-injection layer, a hole-transport layer, a hole-blocking layer, an electron-blocking layer, an electron-transport layer, and an electron-injection layer. In addition, the first layer 113a, the second layer 113b, the third layer 113c, and the fourth layer 113d may each include a charge-generation layer (also referred to as an intermediate layer).

The sixth layer 114 can include one or more of a hole-injection layer, a hole-transport layer, a hole-blocking layer, an electron-blocking layer, an electron-transport layer, and an electron-injection layer. For example, in the case where the conductive layers 111a to 111d each function as an anode and the common electrode 115 functions as a cathode, the sixth layer 114 preferably includes an electron-injection layer.

The hole-injection layer injects holes from the anode to the hole-transport layer and contains a substance with a high hole-injection property. Examples of a substance with a high hole-injection property include an aromatic amine compound and a composite material containing a hole-transport material and an acceptor material (electron-accepting material).

In the light-emitting device, the hole-transport layer transports holes injected from the anode by the hole-injection layer, to the light-emitting layer. In the light-receiving device, the hole-transport layer transports holes generated in the active layer on the basis of incident light, to the anode. The hole-transport layer contains a hole-transport material. The hole-transport material preferably has a hole mobility of $1 \times 10^{-6}$ cm$^2$/Vs or higher. Note that other substances can also be used as long as the substances have a hole-transport property higher than an electron-transport property. As the hole-transport material, substances with a high hole-transport property, such as a π-electron rich heteroaromatic compound (e.g., a carbazole derivative, a thiophene derivative, and a furan derivative) and an aromatic amine (a compound having an aromatic amine skeleton), are preferred.

In the light-emitting device, the electron-transport layer transports electrons injected from the cathode by the electron-injection layer, to the light-emitting layer. In the light-receiving device, the electron-transport layer transports electrons generated in the active layer on the basis of incident light, to the cathode. The electron-transport layer contains an electron-transport material. The electron-transport material preferably has an electron mobility of $1 \times 10^{-6}$ cm$^2$/Vs or higher. Note that other substances can also be used as long as the substances have an electron-transport property higher than a hole-transport property. As the electron-transport material, any of the following substances with a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a n-electron deficient heteroaromatic compound such as a nitrogen-containing heteroaromatic compound.

The electron-injection layer injects electrons from the cathode to the electron-transport layer and contains a substance with a high electron-injection property. As the substance with a high electron-injection property, an alkali metal, an alkaline earth metal, or a compound thereof can be used. As the substance with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, ytterbium, lithium fluoride (LiF), cesium fluoride (CsF), calcium fluoride (CaF$_2$), 8-(quinolinolato) lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide (LiO$_x$), or cesium carbonate, for example. The electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) of the organic compound having an unshared electron pair is preferably greater than or equal to $-3.6$ eV and less than or equal to $-2.3$ eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

For example, the charge-generation layer can be favorably formed using a material that can be used for the electron-injection layer, such as lithium. As another example, the charge-generation layer can be favorably formed using a material that can be used for the hole-injection layer. Moreover, the charge-generation layer can be a layer containing a hole-transport material and an acceptor material (electron-accepting material). The charge-generation layer can be a layer containing an electron-transport material and a donor material. Forming the charge-generation layer including such a layer can suppress an increase in the driving voltage that would be caused when the light-emitting units are stacked.

The fifth layer 113e includes an active layer.

The active layer contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., C$_{60}$ and C$_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for the light-receiving device. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include [6,6]-phenyl-$C_{71}$-butyric acid methyl ester (abbreviation: $PC_{70}BM$), [6,6]-phenyl-$C_{61}$-butyric acid methyl ester (abbreviation: $PC_{60}BM$), and 1',1'',4',4''-tetrahydro-di[1,4]methanonaphthaleno[1,2:2',3',56,60:2'',3''][5,6]fullerene-$C_{60}$ (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the fifth layer 113e may further include a layer containing any of a substance with a high hole-transport property, a hole-blocking material, a substance with a high electron-transport property, an electron-blocking material, a substance with a bipolar property (a substance with a high electron- and hole-transport property), and the like. The fifth layer 113e may include a variety of functional layers that can be used in the first layer 113a, the second layer 113b, the third layer 113c, and the fourth layer 113d.

Either a low molecular compound or a high molecular compound can be used in the light-receiving device, and an inorganic compound may also be included. Each layer included in the light-receiving device can be formed by any of the following methods: an evaporation method (including a vacuum evaporation method), a transfer method, a printing method, an inkjet method, a coating method, and the like.

As the hole-transport material or the electron-blocking material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

For the active layer, a high molecular compound such as poly[[4,8-bis[5-(2-ethylhexyl)-2-thienyl]benzo[1,2-b:4,5-b']dithiophene-2,6-diyl]-2,5-th iophenediyl[5,7-bis(2-ethylhexyl)-4,8-dioxo-4H,8H-benzo[1,2-c:4,5-c']dithiophene-1,3-diyl]]polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. The third material may be a low molecular compound or a high molecular compound.

Thin films included in the display apparatus (e.g., insulating films, semiconductor films, and conductive films) can be formed by a sputtering method, a CVD method, a vacuum evaporation method, a PLD method, an ALD method, or the like. Examples of a CVD method include a plasma-enhanced CVD (PECVD) method and a thermal CVD method. An example of a thermal CVD method is a metal organic CVD (MOCVD) method.

Alternatively, thin films included in the display apparatus (e.g., insulating films, semiconductor films, and conductive films) can be formed by a method such as spin coating, dipping, spray coating, ink-jetting, dispensing, screen printing, or offset printing or with a doctor knife, a slit coater, a roll coater, a curtain coater, or a knife coater.

Specifically, for fabrication of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a light-emitting layer, an electron-transport layer, and an electron-injection layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, screen printing (stencil), offset printing (planography), flexography (relief printing), gravure printing, or micro-contact printing), or the like.

Thin films included in the display apparatus can be processed by a photolithography method or the like. Alternatively, thin films may be processed by a nanoimprinting method, a sandblasting method, a lift-off method, or the like. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use EUV light, X-rays, or an electron beam because they can perform extremely minute processing. Note that a photomask is not needed when exposure is performed by scanning with a beam such as an electron beam.

For etching of thin films, a dry etching method, a wet etching method, a sandblast method, or the like can be used.

As described above, the display apparatus of one embodiment of the present invention includes, in a pixel, a subpixel including a light-emitting device used for image display, a subpixel including a light-emitting device used for a light source, and a subpixel including a light-receiving device used for image capturing. This structure enables multifunctionalization of an electronic device.

Furthermore, in the display apparatus of one embodiment of the present invention, an island-shaped EL layer is formed by processing an EL layer formed on the entire surface, not by using a fine metal mask. Thus, the island-shaped EL layer can have a uniform thickness. In addition, a high-resolution display apparatus or a display apparatus having a high aperture ratio, which had been difficult to achieve, can be manufactured. Moreover, a high-resolution display apparatus or a display apparatus having a high aperture ratio, which incorporates a light-receiving device and has a function of sensing light, can be manufactured.

The first layer, the second layer, the third layer, and the fourth layer included in the light-emitting devices of different colors are formed in separate steps. Accordingly, the respective EL layers can have structures (a material, thickness, and the like) appropriate for the light-emitting devices of different colors. Thus, the light-emitting devices can have favorable characteristics. In addition, since the fifth layer is formed in a step separate from the steps of forming the first to fourth layers, the light-receiving device can have an appropriate structure (a material, thickness, and the like) regardless of the structures of the light-emitting devices. Thus, the light-receiving device can have favorable characteristics.

This embodiment can be combined with any of the other embodiments as appropriate. In this specification, in the case where a plurality of structure examples are shown in one embodiment, the structure examples can be combined as appropriate.

Embodiment 2

In this embodiment, a display apparatus of one embodiment of the present invention and an electronic device that includes the display apparatus and is one embodiment of the present invention are described with reference to FIGS. 7A to 7C.

Figure 7A:
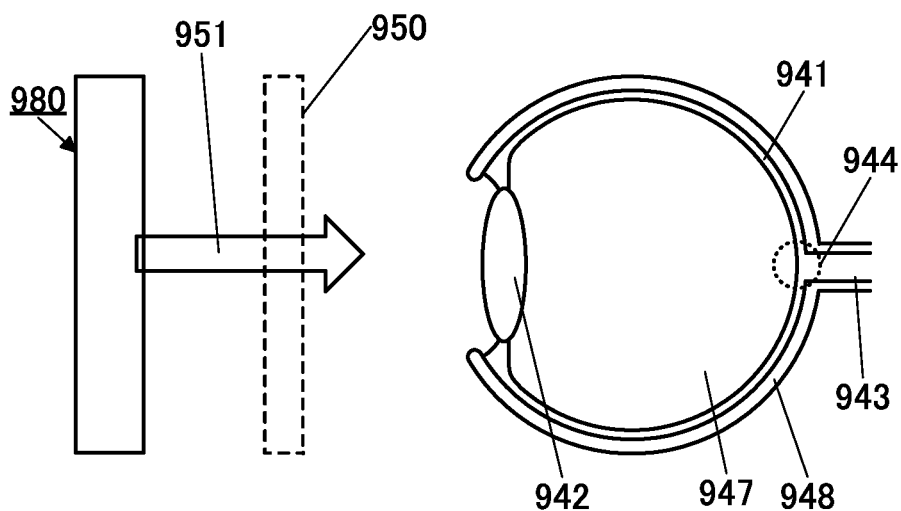
FIG. 7A is a schematic cross-sectional view of a display apparatus and a user's eye.

FIG. 7A is a schematic cross-sectional view showing the positional relationship between a display apparatus 980 and a user's eye. The display apparatus 980 includes a plurality of light-emitting devices and a plurality of light-receiving devices.

Light 951 emitted from the light-emitting devices included in the display apparatus 980 is emitted on the user's eye through an optical system 950, and light reflected by the eye is received by the light-receiving devices. The display apparatus 980 can capture an image of the periphery, surface, or inside (e.g., fundus) of an eye.

For example, the display apparatus 980 illustrated in FIG. 7A includes the light-emitting devices and the light-receiving devices, and thus can capture an image of the fundus of one's eye through the optical system 950 to obtain image data of a retinal pattern. Note that it is difficult to capture an image other than that of a focused target when the focus is adjusted with the optical system 950. For example, when the fundus of the eye is focused on, the periphery of the eye or the like is out of focus and thus an image thereof can hardly be captured.

The display apparatus of one embodiment of the present invention includes a light-emitting device and a light-receiving device in a pixel. In the display apparatus of one embodiment of the present invention, the pixel has a light-receiving function, whereby the contact or approach of an object can be sensed while an image is displayed. Moreover, the display apparatus of one embodiment of the present invention includes a subpixel emitting infrared light; thus, with the use of the subpixels included in the display apparatus, an image can be displayed while infrared light is emitted as a light source.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor. That is, an image can be captured by sensing light with the display portion, or movement of an object (movement of an eye, an eyelid, or an eyeball) can be sensed by regularly monitoring an image. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

First, a method for sensing user's blinking and movement of a user's eyelid is described below with reference to FIG. 7A and FIG. 7B.

<Blinking and Movement of Eyelid>

The display apparatus 980 emits near-infrared light. The user's eye or the periphery of the user's eye is irradiated with the near-infrared light through the optical system 950. Reflected light goes through the optical system 950 again and enters the display apparatus 980. In this manner, the state of an object can be identified.

Figure 7B:
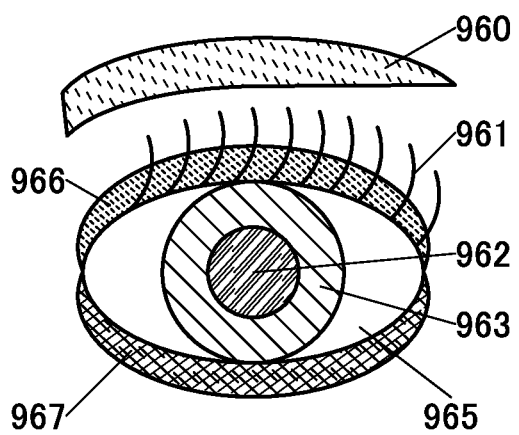
FIG. 7B is a schematic view illustrating the user's eye and its vicinity.

FIG. 7B is a schematic view illustrating a user's eye, and the periphery of the user's eye. FIG. 7B illustrates a user's eyebrow 960, user's eyelids (an upper eyelid 966 and a lower eyelid 967), user's eyelashes 961, a user's pupil 962, a user's cornea 963, and a user's sclera 965. The display apparatus 980 has a function of capturing an image of one or more selected from the user's eyebrow 960, the user's eyelids (the upper eyelid 966 and the lower eyelid 967), the user's eyelashes 961, the user's pupil 962, the user's cornea 963, and the user's sclera 965, which are illustrated in FIG. 7B.

For example, an electronic device of one embodiment of the present invention can sense the state of the user's eye or the periphery of the user's eye illustrated in FIG. 7B with the use of the display apparatus 980. For example, when the user closes the eyelids (the upper eyelid 966 and the lower eyelid 967), the surface of the eyelids, i.e., the skin is irradiated with the near-infrared light. When the user open the eyelids, the surface of the user's eyeball is irradiated with the near-infrared light. Since the skin and the surface of an eyeball have different reflectivities, the intensities of reflected near-infrared light are different. By continuously monitoring this state, the display apparatus 980 can perform one or both of measuring the number of blinks or measuring a blink duration.

When the user looks at a display for a long time, the number of blinks might be decreased. Furthermore, when the user feels fatigue, blink intervals might become longer and a blink duration might become longer.

The electronic device of one embodiment of the present invention can estimate the fatigue level of the user from one or both of the number of user's blinks per unit time and a user's blink duration.

<Movement of Iris>

When a boundary region between a cornea (e.g., the cornea 963 in FIG. 7B) and a sclera (e.g., the sclera 965 in FIG. 7B) is irradiated with an infrared circular spot, the ratio of a region including the cornea to a region including the sclera in a region irradiated with the infrared spot changes in accordance with the movement of the eyeball. The reflectivity of the region including the sclera is far higher than that of the region including the cornea, and thus the amount of reflected light changes in accordance with the movement of the eyeball. By measuring this change, the direction in which the user sees can be determined.

<Scleral Reflection Method>

Next, a scleral reflection method is described. The display apparatus 980 emits near-infrared light. The user's eye is irradiated with the near-infrared light through the optical system 950. Light reflected by the eye goes through the optical system 950 again and enters the display apparatus 980. In this manner, the state of an object can be identified. The user shifts his/her line of sight when watching a fast-moving object in a displayed video. When the line of sight is shifted, an eyeball moves. When the eyeball moves, the ratio of a region including the cornea to a region including the sclera in the infrared circular spot changes. Thus, by monitoring the reflected light component, the movement of an eyeball can be sensed. That is, the electronic device of one embodiment of the present invention has an eye tracking function.

A region the user watches carefully can be estimated by reading the user's line of sight by eye tracking. The definition degree of a region other than the region the user watches carefully is reduced by variable rate shading, whereby the amount of calculation of the electronic device can be reduced, leading to a reduction in power consumption.

Since the electronic device of one embodiment of the present invention includes both the light-emitting device and the sensor device in the display apparatus 980, the number of components can be reduced.

Next, funduscopy of a user's eye is described with reference to FIGS. 7A and 7C.

<Funduscopy>

As illustrated in FIG. 7A, a user's eye is made up of a crystalline lens 942, a retina 941, an optic nerve 943, a vitreous body 947, a choroid 948, a cornea, and the like. For simplicity, the cornea and a pupil between the cornea and the crystalline lens are not illustrated. A ciliary body is a tissue continuous with an iris, and the choroid 948 is a tissue continuous with the ciliary body. Like the diaphragm of a camera, the iris and the pupil adjust the amount of light emitted to the retina 941. It is said that the pattern of the retina 941, i.e., the retina pattern basically does not change in one's life, and the retina pattern can be used for personal authentication or the like. Medical examination of an eye is possible even from a remote place with the use of the retina pattern obtained with the display apparatus 980.

Note that the display apparatus 980 has a function of sensing one or more of blinking, movement of an iris, and movement of an eyelid of a user without focusing on the fundus of an eye by adjusting the optical system 950. That is, the electronic device of one embodiment of the present invention has a function of detecting eye fatigue.

Figure 7C:
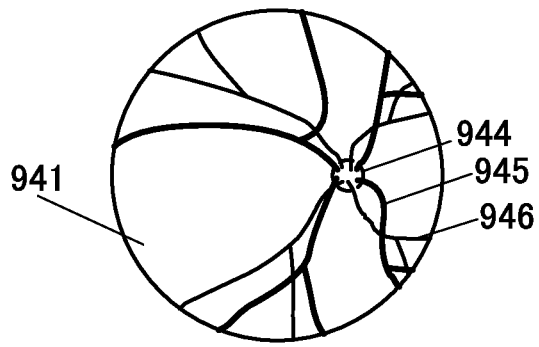
FIG. 7C is a schematic view illustrating a retina pattern of the user's eye.

Next, FIG. 7C illustrates an example of the retina pattern of a right eye obtained by image capturing with the use of the display apparatus of one embodiment of the present invention. An optic disc 944, a vein 945, an artery 946, a macula, a fovea, and the like can be observed in the retina 941. Note that for easily distinguishing between the vein 945 and the artery 946, the vein 945 is illustrated with a thicker solid line than the artery 946 in FIG. 7C. The optic disc 944 is a boundary portion between the optic nerve 943 and the retina 941 and the vein 945 or the artery 946 extends from the optic disc 944. Note that the fundus of the eye is a portion behind the eyeball and collectively means the retina 941, the vitreous body 947, the choroid 948, and the optic disc 944. Note that the optic disc 944 of the left eye is positioned in the left portion of the retina pattern. The retina pattern of the left eye is a mirror-reversed retina pattern of the right eye in FIG. 7C.

To obtain the retina pattern of the fundus of the eye with the use of the light-receiving device included in the display apparatus 980, the pupil needs to be open. Display is changed in the following procedure to capture an image of the fundus of the eye with the pupil open. First, the display screen of the display apparatus 980 is gradually darkened so that the user's eye adapts to the dark. Then, the display screen is brightened for a short time of 16.7 ms or less and an image is captured. After that, the brightness of the display screen is gradually returned to the original.

In addition, the electronic device of one embodiment of the present invention can assess the fatigue level of the user's eye with the use of the display apparatus 980. When an image is captured while the display screen is brightened for a certain period of time, an image of the eye cannot be captured if the user blinks. In this case, the eye fatigue level can be estimated with the use of a system utilizing artificial intelligence (AI) from the number of blinks, blink intervals, or the time when the user closes the eyes, which are sensed by the electronic device.

Furthermore, to assess the fatigue level of the user's eye, a plurality of images may be captured while the display screen of the display apparatus 980 is darkened. The plurality of images can be used for sensing the pulse of the retina blood vessel and further for determining whether the user is in a rest state, in a state of tension, or the like with the use of an AI system. Furthermore, diagnosis of high blood pressure, diabetes, and the like can be performed with an AI system and a variety of pieces of data obtained with the display apparatus 980. In the case of employing an AI system, a control circuit is mounted on the electronic device or the display apparatus 980. A central processing unit (CPU) or a graphics processing unit (GPU) is used for the control circuit. Alternatively, an accelerated processing unit (APU) that is an integrated chip of a CPU and a GPU can also be used for the control circuit. An IC with an AI system (also referred to as an inference chip) can be used. The IC with an AI system is sometimes referred to as a circuit performing neural network calculation (a microprocessor).

The movement of an eyeball may be controlled by displaying an eye-catching pattern on the screen of the display apparatus 980 while the display screen of the display apparatus 980 is darkened.

The distance between the display apparatus 980 and the surface of an eye (e.g., a cornea) is preferably 5 cm or less, further preferably 2 cm or less. The optical system 950 having a short focal distance is provided between the display apparatus 980 and the eye to achieve this positional relationship.

In the case where an image displayed on a screen is magnified tenfold by the optical system 950, for example, the sensor pixel pitch is approximately 10.4 µm in a display screen of the display apparatus 980 having a diagonal of approximately 1 inch and a definition (resolution) degree of approximately 2450 ppi. Since the vascular diameter of each of the vein 945 and the artery 946 of the retina is smaller than 100 µm, an image of the vein 945 or the artery 946 can be captured with the display apparatus 980.

At least part of this embodiment can be implemented in combination with any of the other embodiments described in this specification, as appropriate.

Embodiment 3

In this embodiment, a structure of a pixel circuit and a driving method thereof, which are applicable to the display apparatus of one embodiment of the present invention, will be described below.

Figure 8A:
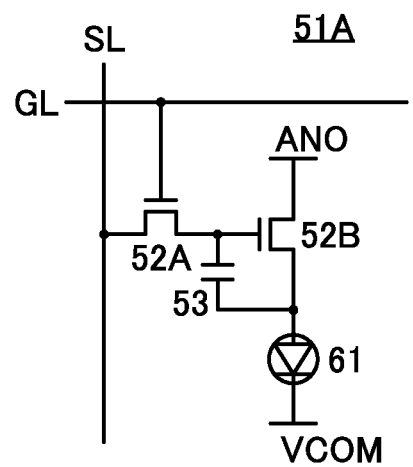
FIGS. 8A to 8D are circuit diagrams each illustrating an example of a display apparatus.

A pixel circuit 51A illustrated in FIG. 8A includes a transistor 52A, a transistor 52B, and a capacitor 53. FIG. 8A illustrates a light-emitting device 61 connected to the pixel circuit 51A. Wirings SL, GL, ANO, and VCOM are electrically connected to the pixel circuit 51A.

A gate of the transistor 52A is electrically connected to the wiring GL, one of a source and a drain of the transistor 52A is electrically connected to the wiring SL, and the other of the source and the drain of the transistor 52A is electrically connected to a gate of the transistor 52B and one electrode of the capacitor 53. One of a source and a drain of the transistor 52B is electrically connected to the wiring ANO and the other of the source and the drain of the transistor 52B is electrically connected to an anode of the light-emitting device 61. The other electrode of the capacitor 53 is electrically connected to the anode of the light-emitting device 61. A cathode of the light-emitting device 61 is electrically connected to the wiring VCOM.

The transistor 52A can be referred to as a selection transistor and functions as a switch for controlling selection/non-selection of the pixel. The transistor 52B can be referred to as a driver transistor and has a function of controlling a current flowing to the light-emitting device 61. The capacitor 53 functions as a storage capacitor and has a function of retaining a gate potential of the transistor 52B. A capacitor such as a MIM capacitor may be used as the capacitor 53; alternatively, capacitance between wirings, a gate capacitance of the transistor, or the like may be used as the capacitor 53.

The wiring SL is supplied with a source signal. The wiring GL is supplied with a gate signal. The wirings ANO and VCOM are each supplied with a constant potential. In the light-emitting device 61, the anode side can have a high potential and the cathode side can have a lower potential than the anode side.

Figure 8B:
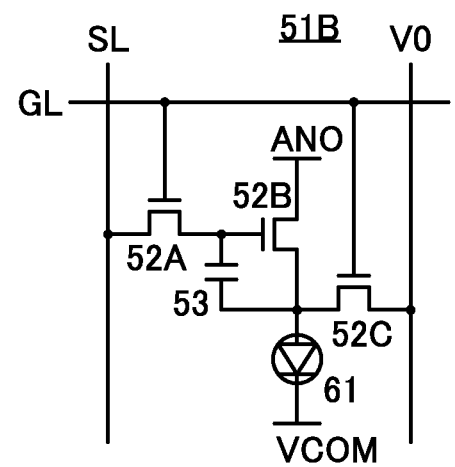

A pixel circuit 51B illustrated in FIG. 8B has a structure in which a transistor 52C is added to the pixel circuit 51A. In addition, a wiring VO is electrically connected to the pixel circuit 51B.

A gate of the transistor 52C is electrically connected to the wiring GL, one of a source and a drain of the transistor 52C is electrically connected to the anode of the light-emitting device 61, and the other of the source and the drain of the transistor 52C is electrically connected to the wiring VO.

The wiring VO is supplied with a constant potential when data is written to the pixel circuit 51B. Thus, a variation in the gate-source voltage of the transistor 52B can be inhibited.

Figure 8C:
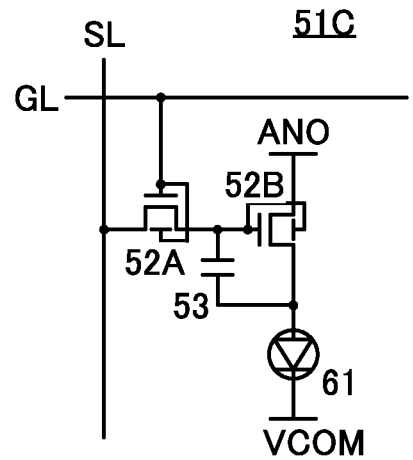
Figure 8D:
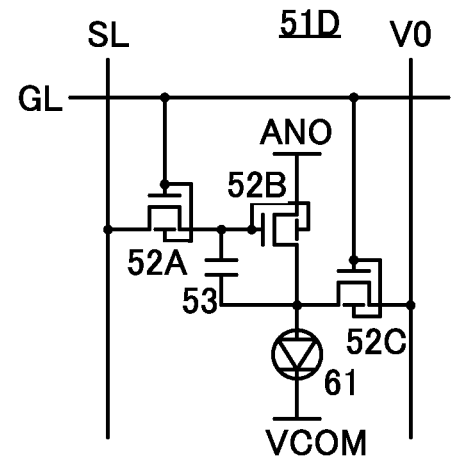

A pixel circuit 51C illustrated in FIG. 8C is an example in the case where a transistor in which a pair of gates are electrically connected to each other is used as each of the transistors 52A and 52B of the pixel circuit 51A. A pixel circuit 51D illustrated in FIG. 8D is an example in the case where such transistors are used in the pixel circuit 51B. With these structures, a current that can flow through the transistor can be increased. Although the transistor in which the pair of gates are connected to each other is used as every transistor here, one embodiment of the present invention is not limited thereto. A transistor that includes a pair of gates electrically connected to different wirings may be used. When, for example, a transistor in which one of the gates is electrically connected to the source is used, the reliability can be increased.

Figure 9A:
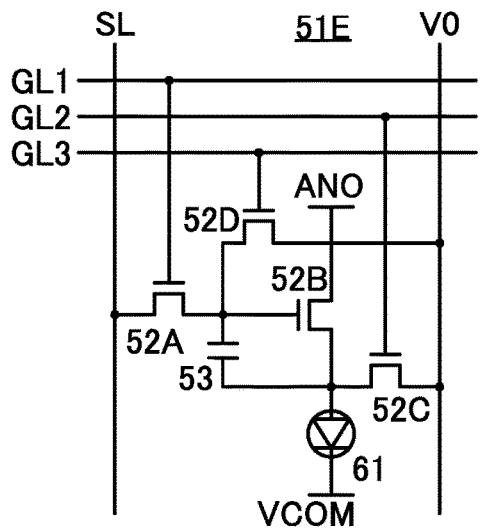
FIGS. 9A to 9D are circuit diagrams each illustrating an example of a display apparatus.

A pixel circuit 51E illustrated in FIG. 9A has a structure in which a transistor 52D is added to the pixel circuit 51B. Three wirings (wirings GL1, GL2, and GL3) functioning as gate lines are electrically connected to the pixel circuit 51E.

A gate of the transistor 52D is electrically connected to the wiring GL3, one of a source and a drain of the transistor 52D is electrically connected to the gate of the transistor 52B, and the other of the source and the drain of the transistor 52D is electrically connected to the wiring VO. The gate of the transistor 52A is electrically connected to the wiring GL1, and the gate of the transistor 52C is electrically connected to the wiring GL2.

When the transistors 52C and 52D are turned on at the same time, the source and the gate of the transistor 52B have the same potential, so that the transistor 52B can be turned off. Thus, a current flowing to the light-emitting device 61 can be blocked forcibly. Such a pixel circuit is suitable for the case of using a display method in which a display period and an off period are alternately provided.

Figure 9B:
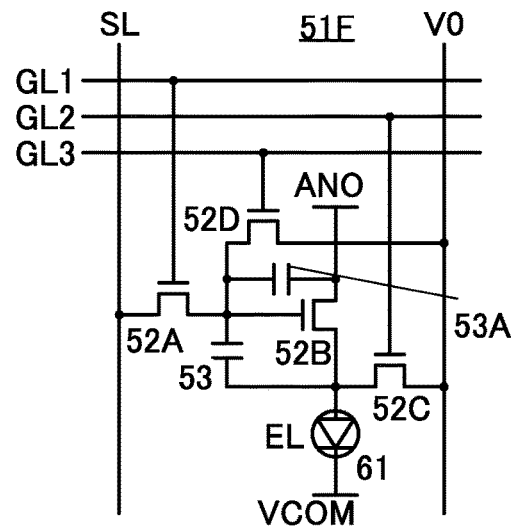

A pixel circuit 51F illustrated in FIG. 9B is an example in the case where a capacitor 53A is added to the pixel circuit 51E. The capacitor 53A functions as a storage capacitor.

Figure 9C:
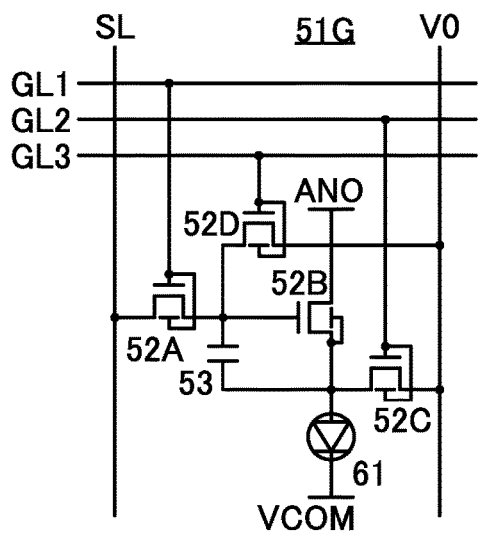
Figure 9D:
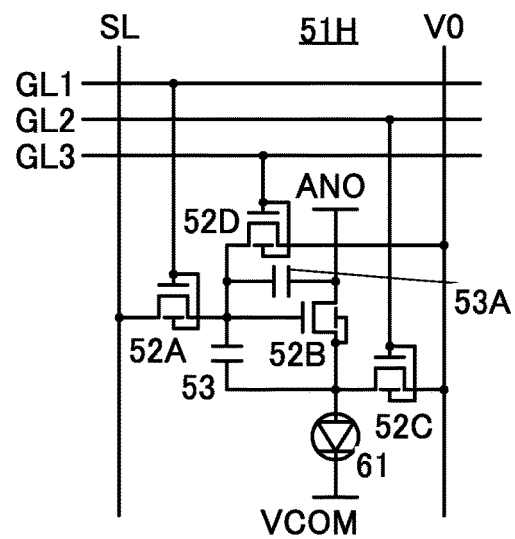

A pixel circuit 51G illustrated in FIG. 9C and a pixel circuit 51H illustrated in FIG. 9D are each an example in the case where a transistor including a pair of gates is used in the pixel circuit 51E or the pixel circuit 51F. A transistor in which a pair of gates are electrically connected to each other is used as each of the transistors 52A, 52C, and 52D, and a transistor in which one of gates is electrically connected to a source is used as the transistor 52B.

Next, an example of a method for driving a display apparatus in which the pixel circuit 51E is used will be described. Note that a similar driving method can be applied to the pixel circuits 51F, 51G, and 51H.

Figure 10:
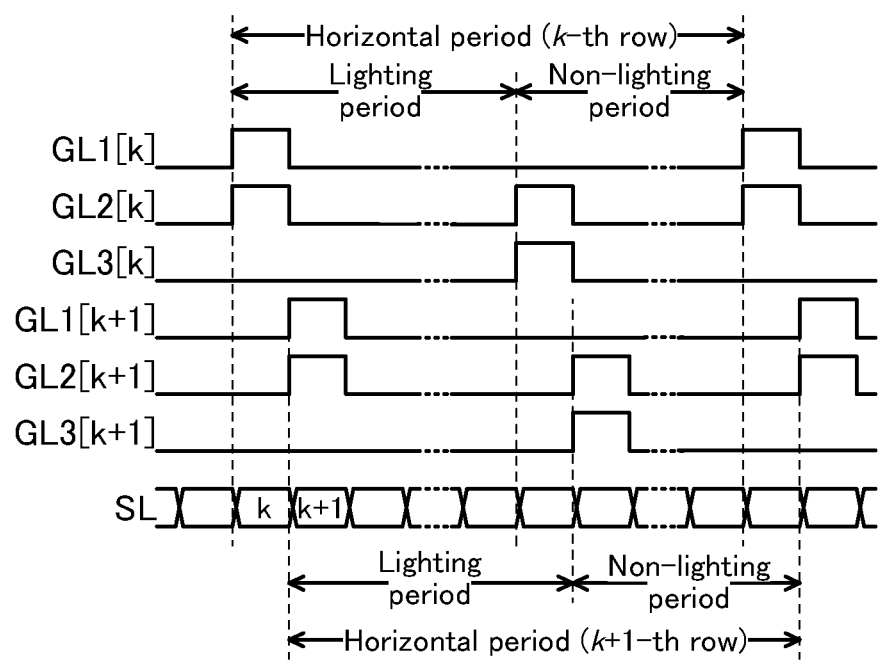
FIG. 10 is a timing chart showing an example of a method for driving a display apparatus.

FIG. 10 shows a timing chart of a method for driving the display apparatus in which the pixel circuit 51E is used. Changes in the potentials of wirings GL1[k], GL2[k], and GL3[k] that are gate lines of the k-th row and changes in the potentials of wirings GL1 [k+1], GL2[k+1], and GL3 [k+1] that are gate lines of the k+1-th row are shown here. FIG. 10 also shows the timing of supplying a signal to the wiring SL functioning as a source line.

In the example of the driving method described here, one horizontal period is divided into a lighting period and a non-lighting period. A horizontal period of the k-th row is shifted from a horizontal period of the k+1-th row by a selection period of the gate line.

In the lighting period of the k-th row, first, the wirings GL1[k] and GL2[k] are supplied with a high-level potential and the wiring SL is supplied with a source signal. Thus, the transistors 52A and 52C are turned on, so that a potential corresponding to the source signal is written from the wiring SL to the gate of the transistor 52B. After that, the wirings GL1[k] and GL2[k] are supplied with a low-level potential, so that the transistors 52A and 52C are turned off and the gate potential of the transistor 52B is retained.

Subsequently, in a lighting period of the k+1-th row, data is written by operation similar to that described above.

Next, the non-lighting period is described. In the non-lighting period of the k-th row, the wirings GL2[k] and GL3[k] are supplied with a high-level potential. Accordingly, the transistors 52C and 52D are turned on, and the source and the gate of the transistor 52B are supplied with the same potential, so that almost no current flows through the transistor 52B. Therefore, the light-emitting device 61 is turned off. As a result, all the subpixels that are positioned in the k-th row are turned off. The subpixels of the k-th row remain in the off state until the next lighting period.

Subsequently, in a non-lighting period of the k+1-th row, all the subpixels of the k+1-th row are turned off in a manner similar to that described above.

Such a driving method described above, in which the subpixels are not constantly on through one horizontal period and a non-lighting period is provided in one horizontal period, can be called duty driving. With duty driving, an afterimage phenomenon can be inhibited at the time of displaying moving images; therefore, a display apparatus with high performance in displaying moving images can be achieved. Particularly in a VR device and the like, a reduction in an afterimage can reduce what is called VR sickness.

In the duty driving, the proportion of the lighting period in one horizontal period can be called a duty cycle. For example, a duty cycle of 50% means that the lighting period and the non-lighting period have the same lengths. Note that the duty cycle can be set freely and can be adjusted appropriately within a range higher than 0% and lower than or equal to 100%, for example.

At least part of this embodiment can be implemented in combination with any of the other embodiments described in this specification, as appropriate.

Embodiment 4

In this embodiment, a display apparatus of one embodiment of the present invention is described with reference to FIGS. 11A and 11B, FIGS. 12A to 12C, FIG. 13, FIG. 14, FIG. 15, FIG. 16, FIG. 17, FIG. 18, FIGS. 19A to 19C, and FIGS. 20A to 20D.

The display apparatus in this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on the head, such as a VR device like a head-mounted display and a glasses-type AR device.

The display apparatus in this embodiment includes a light-receiving device in a pixel. Thus, an image of the periphery, surface, or inside (e.g., fundus) of an eye of a user of a wearable device can be captured with the use of the light-receiving device. Therefore, the wearable device can have a function of sensing one or more selected from blinking, movement of an iris, and movement of an eyelid of the user.

The display apparatus in this embodiment can be a high-definition display apparatus or a large-sized display apparatus. Accordingly, the display apparatus in this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

The display apparatus in this embodiment includes a light-receiving device in a pixel. Thus, data of biological information, such as a fingerprint and a palm print, of the user of the electronic device can be obtained with the light-receiving device. That is, a biological authentication sensor can be incorporated in the display apparatus. When the display apparatus incorporates a biological authentication sensor, the number of components of an electronic device can be reduced as compared to the case where a biological authentication sensor is provided separately from the display apparatus; thus, the size and weight of the electronic device can be reduced.

The light-receiving device may be used for a touch sensor, a non-contact sensor, or the like.

Here, a touch sensor or a non-contact sensor can sense the approach or contact of an object (e.g., a finger, a hand, or a pen). The touch sensor can sense an object when the object directly touches the electronic device. The non-contact sensor can sense an object even without touch of the object on the electronic device. For example, the display apparatus is preferably capable of sensing an object positioned in the range of 0.1 mm to 300 mm inclusive, more preferably 3 mm to 50 mm inclusive from the display apparatus (or the electronic device). This structure enables the electronic device to be operated without direct contact of an object. In other words, the display apparatus can be operated in a contactless (touchless) manner. This structure can reduce the risk of attachment of stain or generation of scratch on the electronic device. Alternatively, this structure enables the electronic device to be operated without direct contact of an object with stain (e.g., dust or virus) attached on the electronic device.

Note that the non-contact sensor function can also be referred to as a hover sensor function, a hover touch sensor function, a near-touch sensor function, a touchless sensor function, or the like. The touch sensor function can also be referred to as a direct touch sensor function or the like.

[Display Module]

Figure 11A:
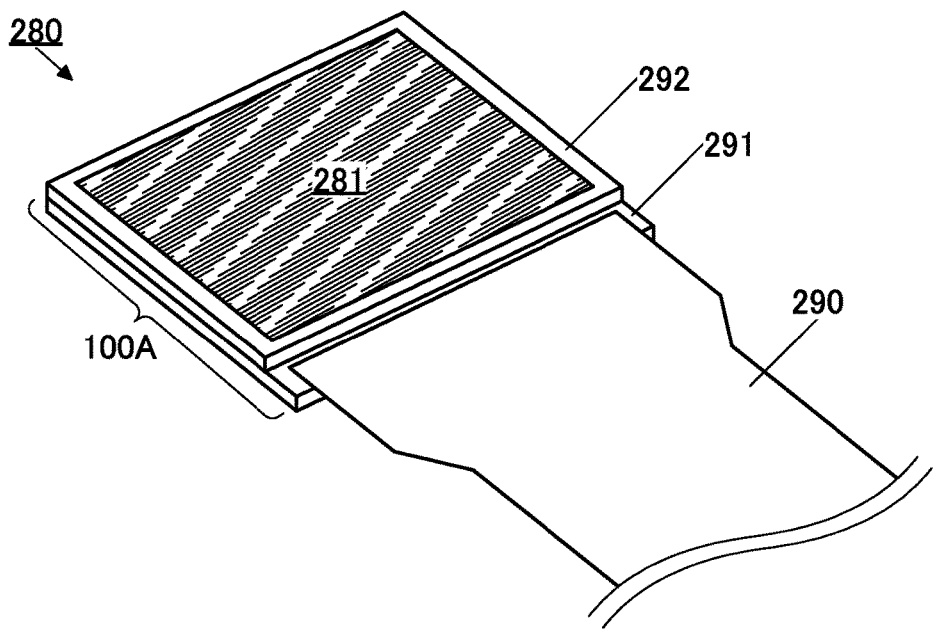
FIG. 11A and FIG. 11B are perspective views illustrating an example of a display apparatus.

FIG. 11A is a perspective view of a display module 280. The display module 280 includes a display apparatus 100A and an FPC 290. Note that the display apparatus included in the display module 280 is not limited to the display apparatus 100A and may be any of display apparatuses 100B to 100F described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 11B:
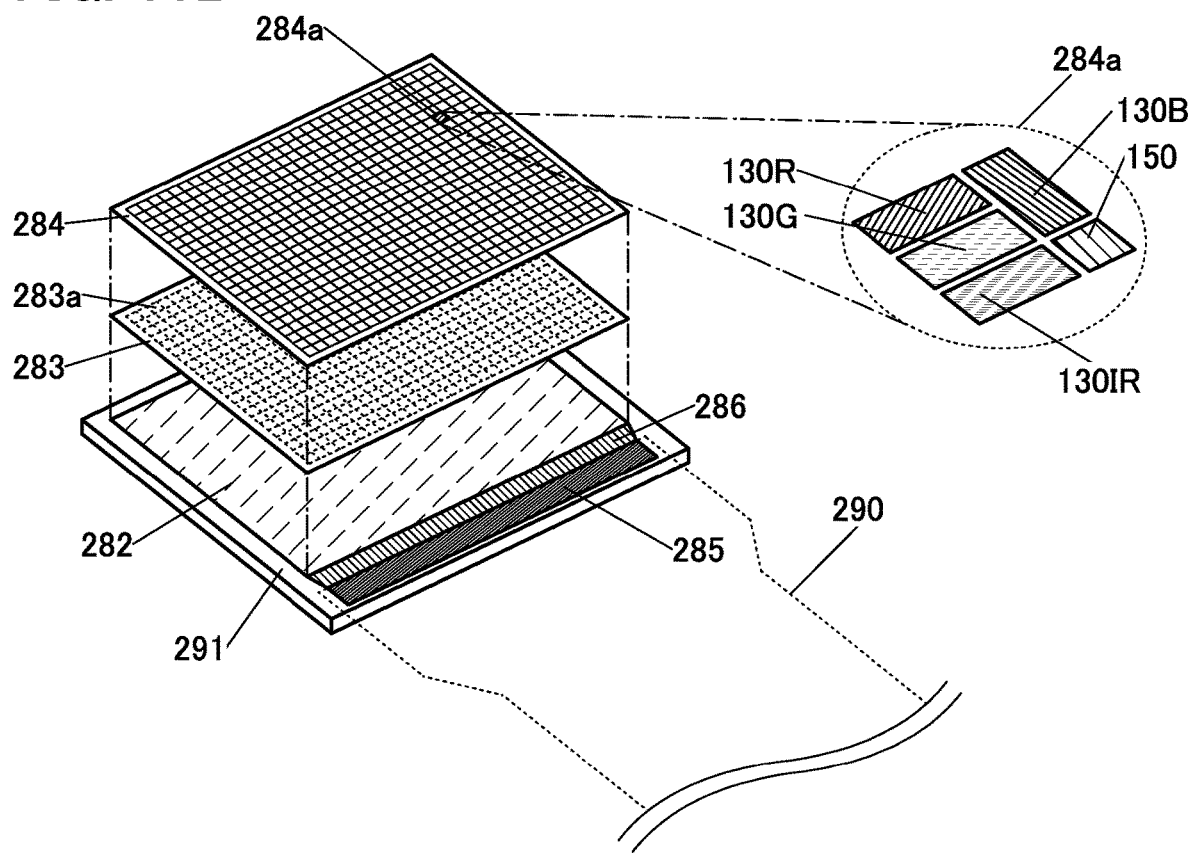

FIG. 11B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side in FIG. 11B. The pixel 284a includes five elements (devices): the light-emitting device 130R emitting red light, the light-emitting device 130G emitting green light, the light-emitting device 130B emitting blue light, the light-emitting device 130IR emitting infrared light, and the light-receiving device 150 sensing infrared light.

Note that the pixel 284a consists of five subpixels. In such a pixel including many subpixels, a high aperture ratio is extremely difficult to achieve. Alternatively, a high-resolution display apparatus is difficult to achieve with the use of a pixel including many subpixels. Thus, in the method for manufacturing the display apparatus of one embodiment of the present invention, an island-shaped EL layer is formed by processing an EL layer formed on the entire surface, not by using a metal mask having a fine pattern. Accordingly, a high-resolution display apparatus or a display apparatus having a high aperture ratio, which had been difficult to achieve, can be manufactured. Moreover, EL layers of different colors can be formed separately, which enables extremely clear images with a high contrast; thus, a display apparatus with high display quality can be manufactured. Moreover, a high-resolution display apparatus or a display apparatus having a high aperture ratio, which incorporates a light-receiving device and has a function of sensing light, can be manufactured.

In the pixel of the display apparatus in this embodiment, the subpixel including the light-emitting device or the light-receiving device can include a light-emitting region or a light-receiving region having a side of 1 µm to 10 µm inclusive. Moreover, the pixel can have a structure including a region in which the distance between two adjacent subpixels is 3 µm or less, or less than 1 µm.

The pixel circuit portion 283 includes a plurality of pixel circuits 283a arranged periodically.

One pixel circuit 283a controls driving of a plurality of devices included in one pixel 284a. One pixel circuit 283a may be provided with five circuits each of which controls driving of a device. For example, the pixel circuit 283a can include at least one selection transistor, one current control transistor (driving transistor), and a capacitor for one light-emitting device. In this case, a gate signal is input to a gate of the selection transistor, and a source signal is input to a source of the selection transistor. Thus, an active-matrix display apparatus is achieved.

The circuit portion 282 includes a circuit for driving the pixel circuits 283a in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head-mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Apparatus 100A]

Figure 12A:
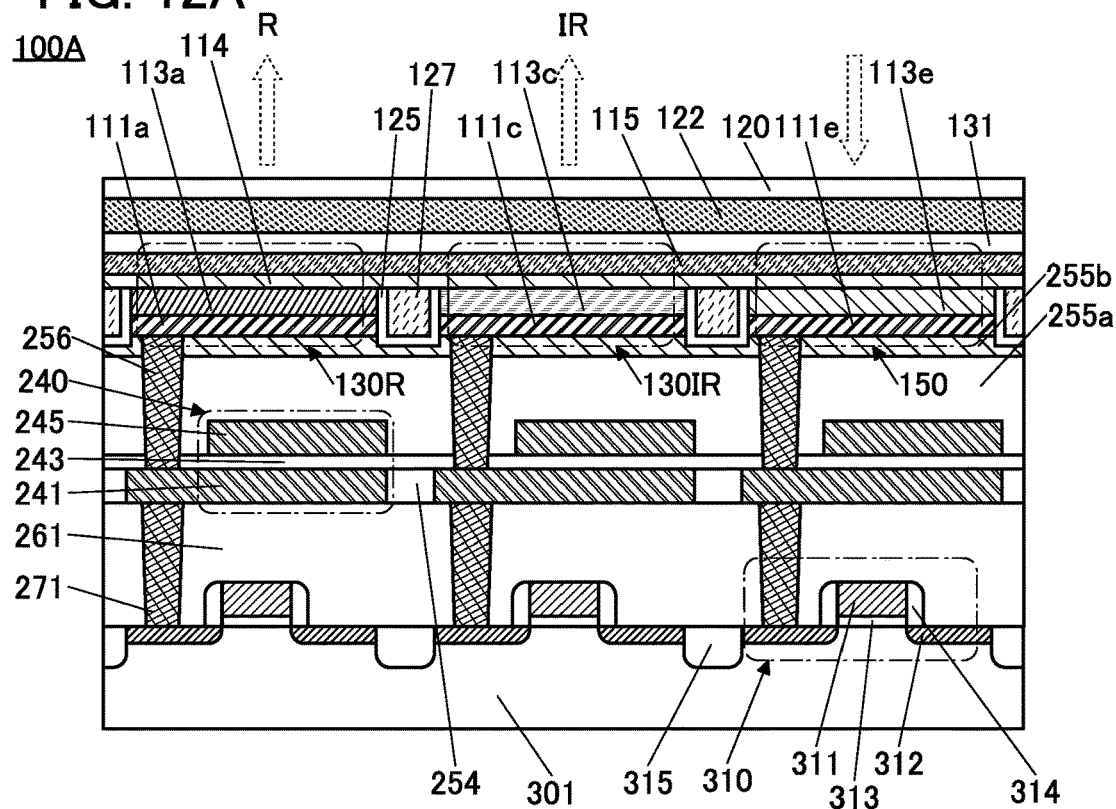
FIGS. 12A to 12C are cross-sectional views illustrating examples of display apparatuses.

The display apparatus 100A illustrated in FIG. 12A includes a substrate 301, the light-emitting devices 130R and 130IR, the light-receiving device 150, a capacitor 240, and a transistor 310.

The substrate 301 corresponds to the substrate 291 illustrated in FIGS. 11A and 11B. A stacked-layer structure including the substrate 301 and the components thereover up to an insulating layer 255b corresponds to the layer 101 including a transistor in Embodiment 1.

The transistor 310 includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover the side surface of the conductive layer 311.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping the conductive layer 241 with the insulating layer 243 therebetween.

An insulating layer 255a is provided to cover the capacitor 240, and an insulating layer 255b is provided over the insulating layer 255a.

As each of the insulating layers 255a and 255b, a variety of inorganic insulating films such as an oxide insulating film, a nitride insulating film, an oxynitride insulating film, and a nitride oxide insulating film can be suitably used. As the insulating layer 255a, an oxide insulating film or an oxynitride insulating film, such as a silicon oxide film, a silicon oxynitride film, or an aluminum oxide film, is preferably used. As the insulating layer 255b, a nitride insulating film or a nitride oxide insulating film, such as a silicon nitride film or a silicon nitride oxide film, is preferably used. Specifically, it is preferred that a silicon oxide film be used as the insulating layer 255a and a silicon nitride film be used as the insulating layer 255b. The insulating layer 255b preferably has a function of an etching protective film. Alternatively, a nitride insulating film or a nitride oxide insulating film may be used as the insulating layer 255a, and an oxide insulating film or an oxynitride insulating film may be used as the insulating layer 255b. Although this embodiment shows an example in which a depression portion is provided in the insulating layer 255b, a depression portion is not necessarily provided in the insulating layer 255b.

The light-emitting device 130R, the light-emitting device 130IR, and the light-receiving device 150 are provided over the insulating layer 255b. FIG. 12A illustrates an example in which the light-emitting device 130R, the light-emitting device 130IR, and the light-receiving device 150 each have a structure similar to the stacked-layer structure illustrated in FIG. 1B. An insulator is provided in a region between adjacent light-emitting devices and a region between a light-emitting device and a light-receiving device adjacent to each other. In FIG. 12A and the like, the insulating layer 125 and the insulating layer 127 over the insulating layer 125 are provided in those regions.

The display apparatus 100A includes five devices in a pixel as illustrated in FIG. 11B, and FIG. 12A illustrates three devices of the five devices. The light-emitting devices 130G and 130B, which are not illustrated in FIG. 12A, are also provided over the insulating layer 255b. Structures of the five devices are similar to those in FIG. 1B, and therefore description thereof will not be repeated.

The pixel electrode of each of the light-emitting devices and the light-receiving device is electrically connected to one of the source and the drain of the transistor 310 through a plug 256 embedded in the insulating layers 255a and 255b, the conductive layer 241 embedded in the insulating layer 254, and the plug 271 embedded in the insulating layer 261. The top surface of the insulating layer 255b and the top surface of the plug 256 are level with or substantially level with each other. A variety of conductive materials can be used for the plugs.

The protective layer 131 is provided over the light-emitting devices 130R and 130IR and the light-receiving device 150. The substrate 120 is bonded to the protective layer 131 with the resin layer 122. Embodiment 1 can be referred to for the details of the light-emitting devices and the components thereover up to the substrate 120. The substrate 120 corresponds to the substrate 292 in FIG. 11A.

The end portions of the top surfaces of the conductive layers 111a, 111c, and 111e are not covered with an insulating layer. Thus, the distance between adjacent light-emitting devices and the distance between a light-emitting device and a light-receiving device adjacent to each other can be extremely shortened. Accordingly, the display apparatus can have high resolution or high definition.

Although FIG. 1B and the like illustrate an example in which the light-emitting devices 130R, 130G, and 130B include the first layer 113a, the second layer 113b, the fourth layer 113d, respectively, which have different structures, the EL layers included in the light-emitting devices 130R, 130G, and 130B may have the same structure.

Figure 12B:
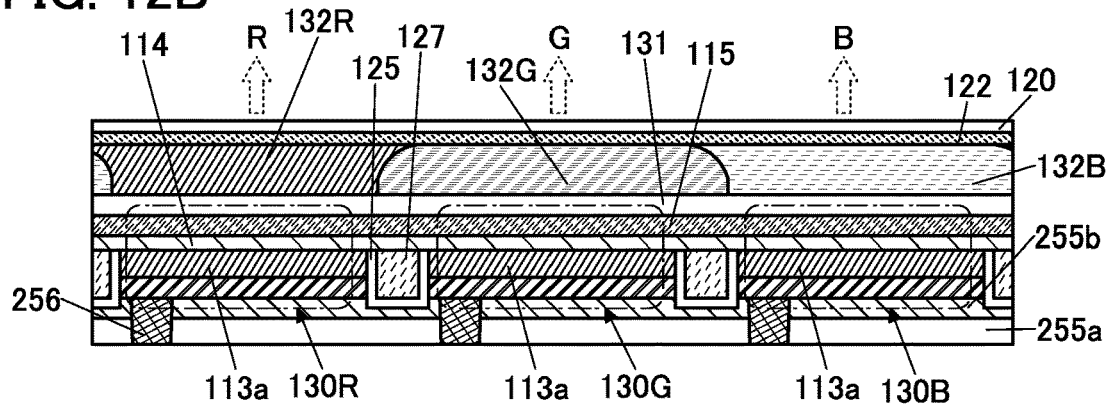
Figure 12C:
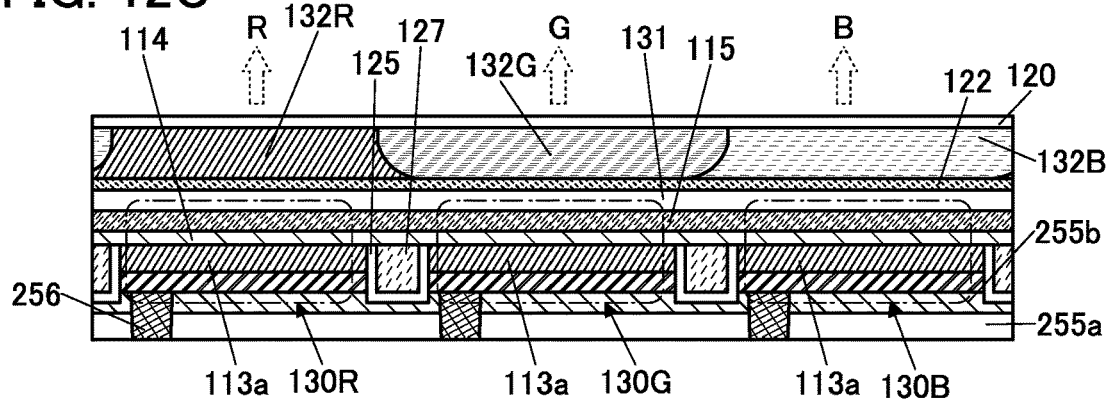

FIG. 12B and FIG. 12C each illustrate an example in which the light-emitting devices 130R, 130G, and 130B have the same structure. The light-emitting devices 130R, 130G, and 130B illustrated in FIG. 12B and FIG. 12C each include the first layer 113a and the sixth layer 114 between the pixel electrode and the common electrode 115. For example, the light-emitting devices 130R, 130G, and 130B can emit white light.

FIG. 12B illustrates an example in which coloring layers 132R, 132G, and 132B are provided over the protective layer 131. The substrate 120 is bonded to the coloring layers 132R, 132G, and 132B with the resin layer 122.

FIG. 12C illustrates an example in which the substrate 120 provided with the coloring layers 132R, 132G, and 132B is bonded to the protective layer 131 with the resin layer 122.

In FIG. 12B and FIG. 12C, the light-emitting device 130R and the red coloring layer 132R overlap with each other, and light emitted from the light-emitting device 130R passes through the coloring layer 132R and is extracted as red light to the outside of the display apparatus. Similarly, the light-emitting device 130G and the green coloring layer 132G overlap with each other, and light emitted from the light-emitting device 130G passes through the coloring layer 132G and is extracted as green light to the outside of the display apparatus. The light-emitting device 130B and the blue coloring layer 132B overlap with each other, and light emitted from the light-emitting device 130B passes through the coloring layer 132B and is extracted as blue light to the outside of the display apparatus.

[Display Apparatus 100B]

Figure 13:
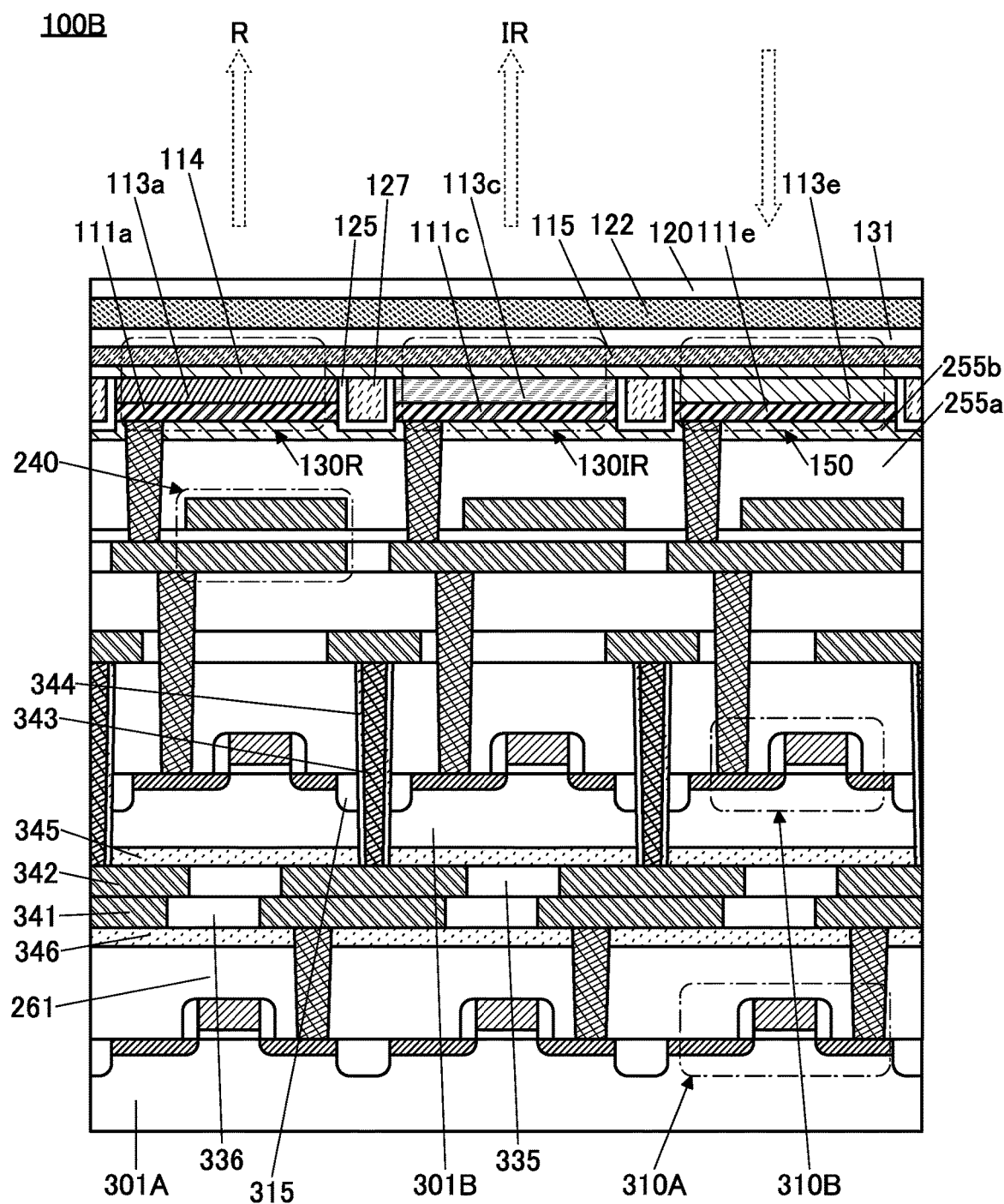
FIG. 13 is a cross-sectional view illustrating an example of a display apparatus.

The display apparatus 100B illustrated in FIG. 13 has a structure in which a transistor 310A and a transistor 310B each having a channel formed in a semiconductor substrate are stacked. Note that in the following description of display apparatuses, the description of portions similar to those of the above-described display apparatuses may be omitted.

In the display apparatus 100B, a substrate 301B provided with the transistor 310B, the capacitor 240, the light-emitting devices, and the light-receiving device is attached to a substrate 301A provided with the transistor 310A.

Here, an insulating layer 345 is preferably provided on the bottom surface of the substrate 301B. An insulating layer 346 is preferably provided over the insulating layer 261 over the substrate 301A. The insulating layers 345 and 346 function as protective layers and can inhibit diffusion of impurities into the substrate 301B and the substrate 301A. As the insulating layers 345 and 346, an inorganic insulating film that can be used as the protective layer 131 or an insulating layer 332 can be used.

The substrate 301B is provided with a plug 343 that penetrates the substrate 301B and the insulating layer 345. An insulating layer 344 is preferably provided to cover the side surface of the plug 343. The insulating layer 344 functions as a protective layer and can inhibit diffusion of impurities into the substrate 301B. As the insulating layer 344, an inorganic insulating film that can be used as the protective layer 131 can be used.

A conductive layer 342 is provided under the insulating layer 345 on the rear surface of the substrate 301B (the surface opposite to the substrate 120). The conductive layer 342 is preferably provided to be embedded in the insulating layer 335. The bottom surfaces of the conductive layer 342 and the insulating layer 335 are preferably planarized. Here, the conductive layer 342 is electrically connected to the plug 343.

A conductive layer 341 is provided over the insulating layer 346 over the substrate 301A. The conductive layer 341 is preferably provided to be embedded in the insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layers 341 and 342 to be bonded to each other favorably.

The conductive layers 341 and 342 are preferably formed using the same conductive material. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layers 341 and 342. In that case, it is possible to employ copper-to-copper (Cu-to-Cu) direct bonding (a technique for achieving electrical continuity by connecting copper (Cu) pads).

[Display Apparatus 100C]

Figure 14:
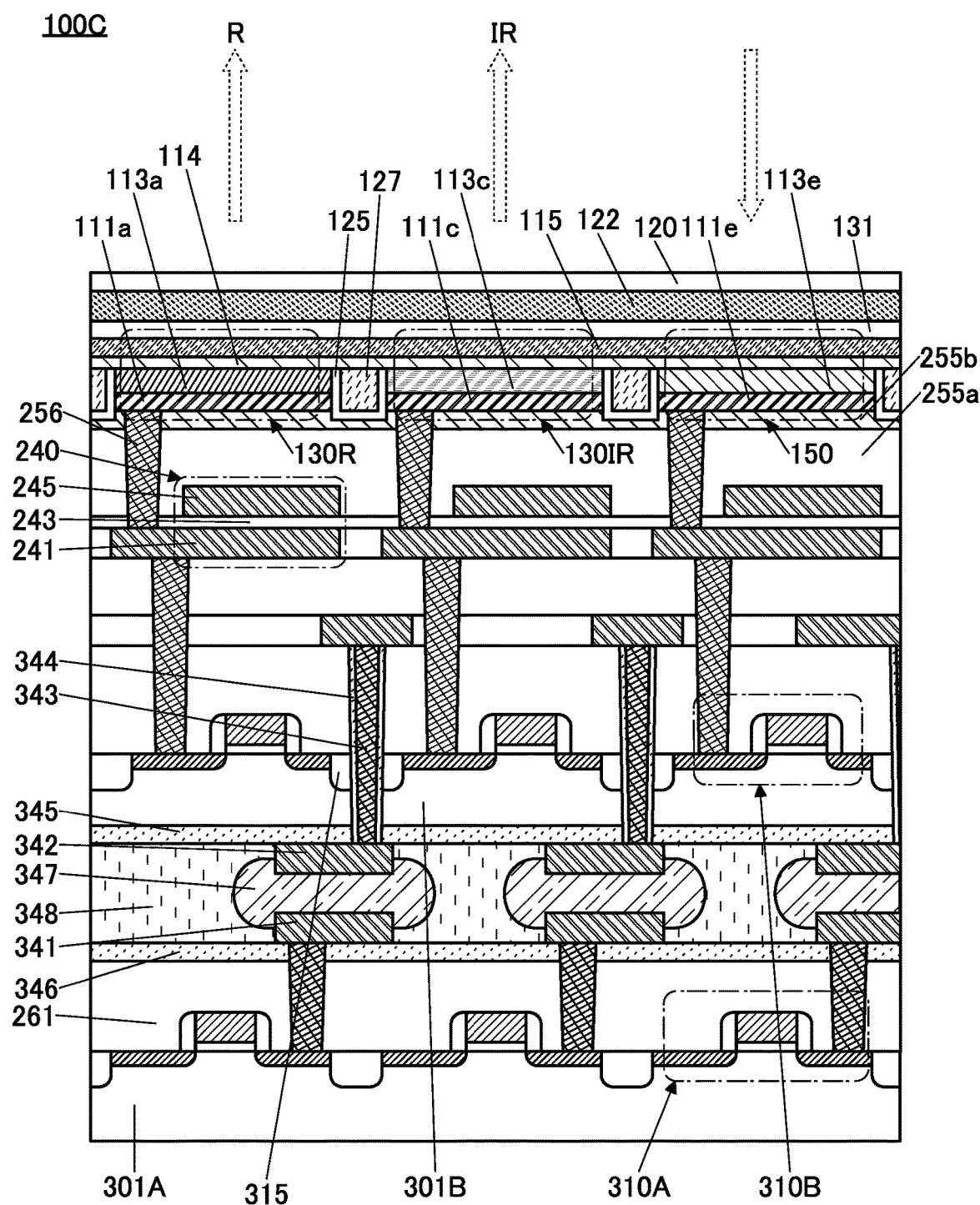
FIG. 14 is a cross-sectional view illustrating an example of a display apparatus.

The display apparatus 100C illustrated in FIG. 14 has a structure in which the conductive layer 341 and the conductive layer 342 are bonded to each other with a bump 347.

As illustrated in FIG. 14, providing the bump 347 between the conductive layer 341 and the conductive layer 342 enables the conductive layers 341 and 342 to be electrically connected to each other. The bump 347 can be formed using a conductive material containing gold (Au), nickel (Ni), indium (In), tin (Sn), or the like, for example.

As another example, solder may be used for the bump 347. An adhesive layer 348 may be provided between the insulating layer 345 and the insulating layer 346. In the case where the bump 347 is provided, the insulating layer 335 and the insulating layer 336 may be omitted.

[Display Apparatus 100D]

Figure 15:
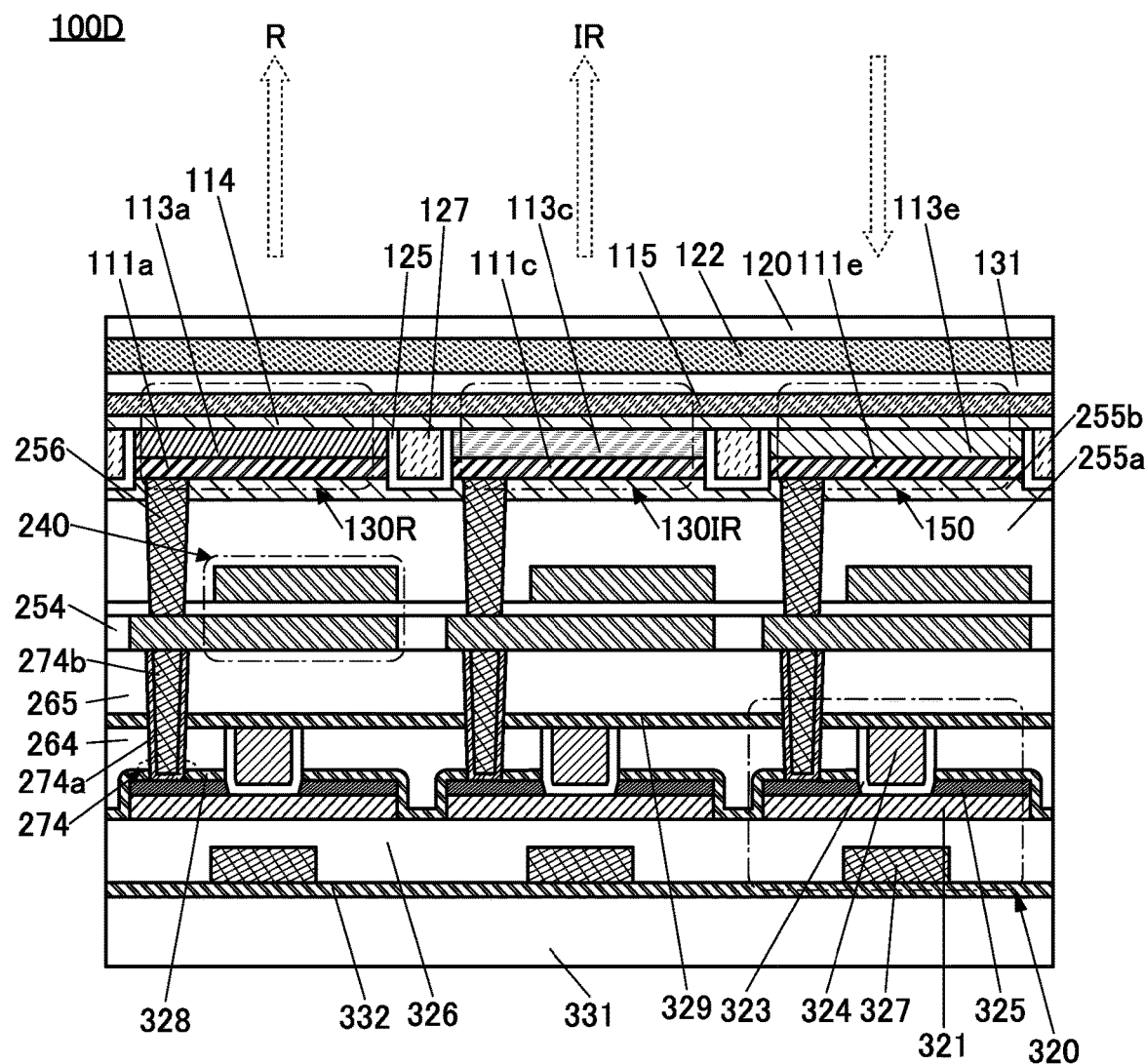
FIG. 15 is a cross-sectional view illustrating an example of a display apparatus.

The display apparatus 100D illustrated in FIG. 15 differs from the display apparatus 100A mainly in a structure of a transistor.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIGS. 11A and 11B. A stacked-layer structure including the substrate 331 and the components thereover up to the insulating layer 255b corresponds to the layer 101 including a transistor in Embodiment 1. As the substrate 331, an insulating substrate or a semiconductor substrate can be used.

The insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. A metal oxide film having semiconductor characteristics (also referred to as an oxide semiconductor film) is preferably used as the semiconductor layer 321. The pair of conductive layers 325 is provided on and in contact with the semiconductor layer 321, and functions as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. The insulating layer 323 that is in contact with the side surfaces of the insulating layers 264 and 328, the side surface of the conductive layer 325, and the top surface of the semiconductor layer 321 and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are level with or substantially level with each other, and insulating layers 329 and 265 are provided to cover these layers.

The insulating layers 264 and 265 each function as an interlayer insulating layer. The insulating layer 329 functions as a barrier layer that prevents diffusion of impurities such as water or hydrogen from the insulating layer 265 or the like into the transistor 320. As the insulating layer 329, an insulating film similar to the insulating layers 328 and 332 can be used.

A plug 274 electrically connected to one of the pair of conductive layers 325 is provided to be embedded in the insulating layers 265, 329, and 264. Here, the plug 274 preferably includes a conductive layer 274a that covers the side surface of an opening formed in the insulating layers 265, 329, 264, and 328 and part of the top surface of the conductive layer 325, and a conductive layer 274b in contact with the top surface of the conductive layer 274a. For the conductive layer 274a, a conductive material in which hydrogen and oxygen are less likely to diffuse is preferably used.

[Display Apparatus 100E]

Figure 16:
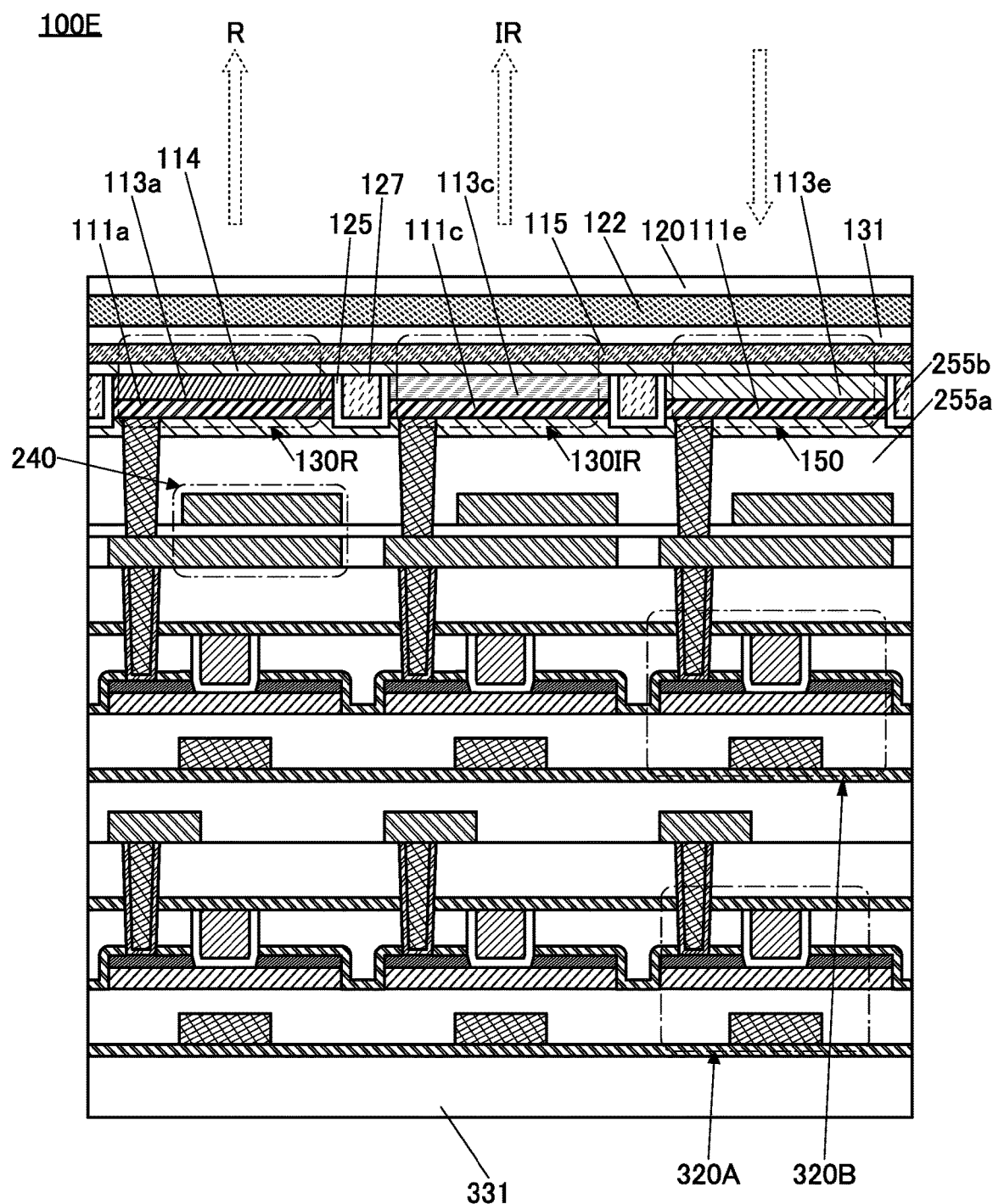
FIG. 16 is a cross-sectional view illustrating an example of a display apparatus.

The display apparatus 100E illustrated in FIG. 16 has a structure in which a transistor 320A and a transistor 320B each including an oxide semiconductor in a semiconductor where a channel is formed are stacked.

The description of the display apparatus 100D can be referred to for the transistor 320A, the transistor 320B, and other peripheral structures.

Although the structure in which two transistors including an oxide semiconductor are stacked is described, the present invention is not limited thereto. For example, three or more transistors may be stacked.

[Display Apparatus 100F]

Figure 17:
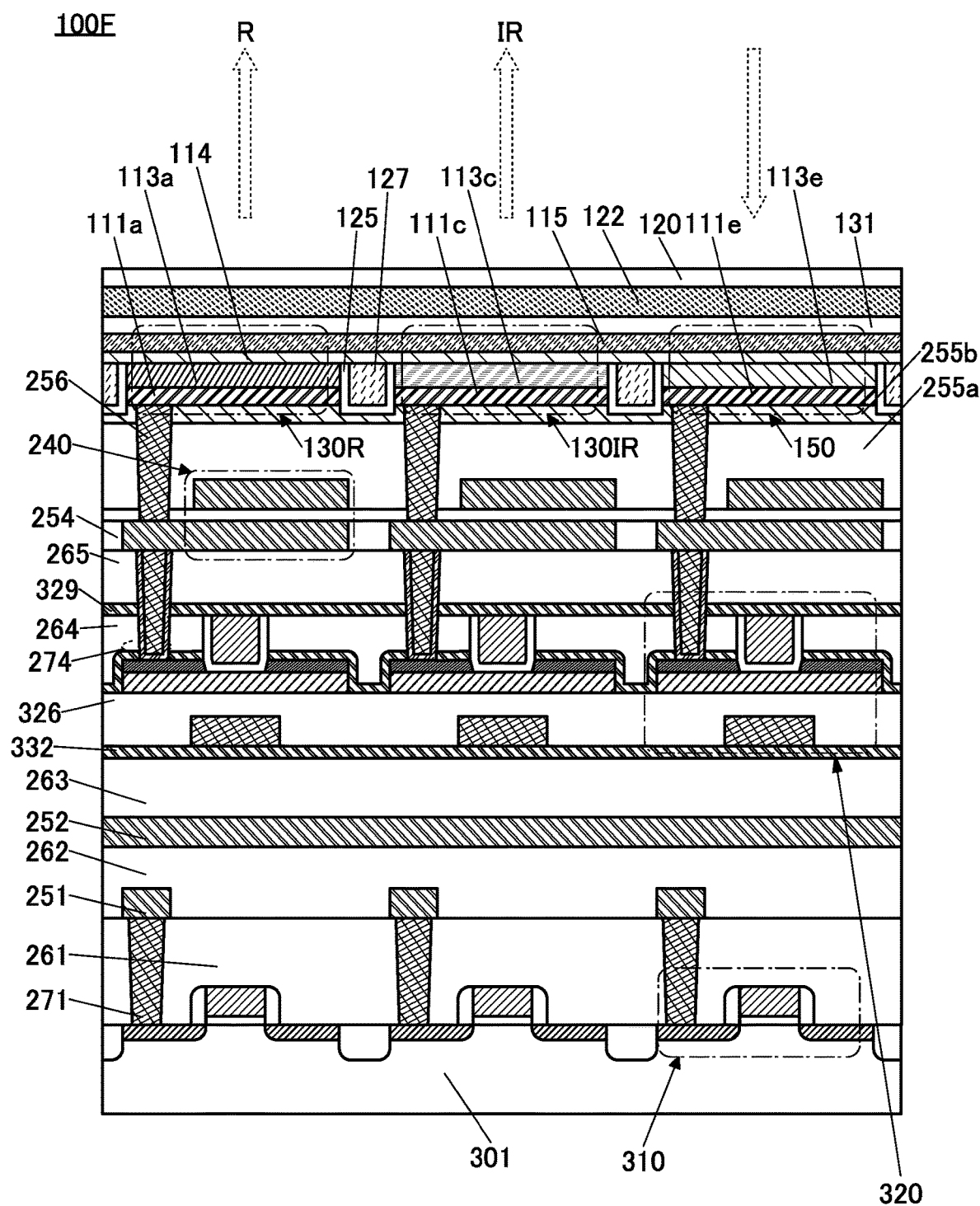
FIG. 17 is a cross-sectional view illustrating an example of a display apparatus.

The display apparatus 100F illustrated in FIG. 17 has a structure in which the transistor 310 having a channel formed in the substrate 301 and the transistor 320 including a metal oxide in a semiconductor layer where a channel is formed are stacked.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display apparatus can be downsized as compared with the case where a driver circuit is provided around a display portion.

[Display Apparatus 100G]

Figure 18:
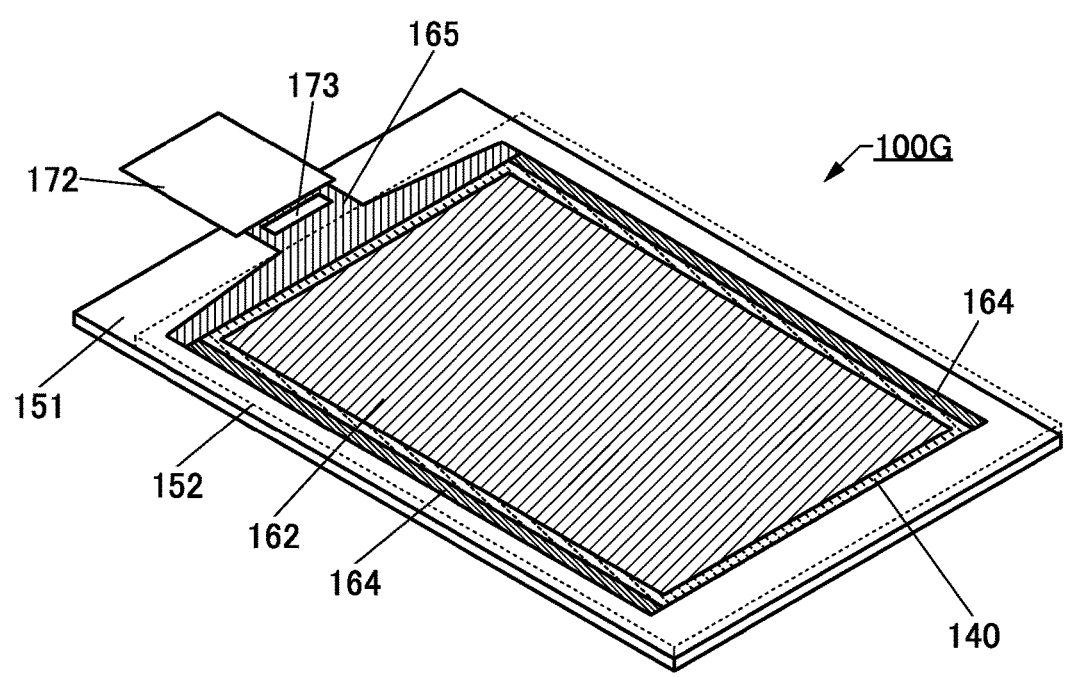
FIG. 18 is a perspective view illustrating an example of a display apparatus.

FIG. 18 is a perspective view of a display apparatus 100G, and FIG. 19A is a cross-sectional view of the display apparatus 100G.

In the display apparatus 100G, a substrate 152 and a substrate 151 are bonded to each other. In FIG. 18, the substrate 152 is denoted by a dashed line.

The display apparatus 100G includes a display portion 162, the connection portion 140, circuits 164, a wiring 165, and the like. FIG. 18 illustrates an example in which an IC (integrated circuit) 173 and an FPC 172 are mounted on the display apparatus 100G. Thus, the structure illustrated in FIG. 18 can be regarded as a display module including the display apparatus 100G, the IC, and the FPC.

The connection portion 140 is provided outside the display portion 162. The connection portion 140 can be provided along one or more sides of the display portion 162. The number of the connection portions 140 may be one or more. FIG. 18 illustrates an example in which the connection portion 140 is provided to surround the four sides of the display portion. The common electrode of the light-emitting device is electrically connected to a conductive layer in the connection portion 140, and thus a potential can be supplied to the common electrode.

As the circuit 164, a scan line driver circuit can be used, for example.

The wiring 165 has a function of supplying a signal and power to the display portion 162 and the circuits 164. The signal and power are input to the wiring 165 from the outside through the FPC 172 or from the IC 173.

FIG. 18 illustrates an example in which the IC 173 is provided over the substrate 151 by a chip on glass (COG) method, a chip on film (COF) method, or the like. An IC including a scan line driver circuit, a signal line driver circuit, or the like can be used as the IC 173, for example. Note that the display apparatus 100G and the display module are not necessarily provided with an IC. The IC may be mounted on the FPC by a COF method or the like.

FIG. 19A illustrates an example of cross sections of part of a region including the FPC 172, part of the circuit 164, part of the display portion 162, part of the connection portion 140, and part of a region including an end portion of the display apparatus 100G.

The display apparatus 100G illustrated in FIG. 19A includes a transistor 201, transistors 205, the light-receiving device 150, the light-emitting device 130G emitting green light, the light-emitting device 130IR emitting infrared light, and the like between the substrate 151 and the substrate 152.

For example, the display apparatus 100G can employ the pixel layout described in Embodiment 1 with reference to FIG. 1A. FIG. 19A illustrates three devices included in the layout. The light-emitting devices 130R and 130B not illustrated in FIG. 19A are also provided over the insulating layer 214. The description of the structures of the five devices similar to those in FIG. 1B is omitted.

The light-receiving device 150 includes the conductive layer 111e, a conductive layer 112e over the conductive layer 111e, and a conductive layer 126e over the conductive layer 112e. All of the conductive layers 111e, 112e, and 126e can be referred to as pixel electrodes, or one or two of them can be referred to as pixel electrodes.

The conductive layer 111e is connected to a conductive layer 222b included in the transistor 205 through an opening provided in the insulating layer 214. The end portion of the conductive layer 112e is positioned on an outer side than the end portion of the conductive layer 111e. The end portion of the conductive layer 112e and the end portion of the conductive layer 126e are aligned or substantially aligned with each other. For example, a conductive layer functioning as a reflective electrode can be used as the conductive layer 111e and the conductive layer 112e, and a conductive layer functioning as a transparent electrode can be used as the conductive layer 126e.

The light-emitting device 130G includes the conductive layer 111b, a conductive layer 112b over the conductive layer 111b, and a conductive layer 126b over the conductive layer 112b.

The light-emitting device 130IR includes the conductive layer 111c, a conductive layer 112c over the conductive layer 111c, and a conductive layer 126c over the conductive layer 112c.

Since the conductive layers 111b, 112b, and 126b of the light-emitting device 130G and the conductive layers 111c, 112c, and 126c of the light-emitting device 130IR are similar to the conductive layers 111e, 112e, and 126e of the light-receiving device 150, detailed description of those layers is omitted.

The conductive layers 111b, 111c, and 111e are provided to cover the openings provided in the insulating layer 214. A layer 128 is embedded in depression portions of the conductive layers 111b, 111c, and 111e.

The layer 128 has a function of planarizing the depression portions of the conductive layers 111b, 111c, and 111e. The conductive layers 112b, 112c, and 112e electrically connected to the conductive layers 111b, 111c, and 111e, respectively, are provided over the conductive layers 111b, 111c, and 111e and the layer 128. Thus, regions overlapping with the depression portions of the conductive layers 111b, 111c, and 111e can also be used as the light-emitting regions, increasing the aperture ratio of the pixels.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer including an organic material can be favorably used as the layer 128. For example, an acrylic resin, a polyimide resin, an epoxy resin, a polyamide resin, a polyimide-amide resin, a siloxane resin, a benzocyclobutene-based resin, a phenol resin, and precursors of these resins can be used for the layer 128. A photosensitive resin can also be used for the layer 128. Examples of the photosensitive resin include positive-type materials and negative-type materials.

When a photosensitive resin is used, the layer 128 can be formed through only light-exposure and development steps, reducing the influence of dry etching, wet etching, or the like on the surfaces of the conductive layers 111b, 111c, and 111e. When the layer 128 is formed using a negative photosensitive resin, the layer 128 can sometimes be formed using the same photomask (light-exposure mask) as the photomask used for forming the opening in the insulating layer 214.

The top surface and the side surface of the conductive layer 112e and the top surface and the side surface of the conductive layer 126e are covered with the fifth layer 113e. The fifth layer 113e includes at least an active layer.

Similarly, the top surface and the side surface of the conductive layer 112b and the top surface and the side surface of the conductive layer 126b are covered with the second layer 113b. Moreover, the top surface and the side surface of the conductive layer 112c and the top surface and the side surface of the conductive layer 126c are covered with the third layer 113c. Accordingly, regions provided with the conductive layers 112b and 112c can be entirely used as the light-emitting regions of the light-emitting devices 130G and 1301R, increasing the aperture ratio of the pixels.

The side surfaces of the second layer 113b, the third layer 113c, and the fifth layer 113e are covered with the insulating layers 125 and 127. The sacrifice layer 118b is positioned between the second layer 113b and the insulating layer 125. The sacrifice layer 118c is positioned between the third layer 113c and the insulating layer 125, and the sacrifice layer 118e is positioned between the fifth layer 113e and the insulating layer 125. The sixth layer 114 is provided over the second layer 113b, the third layer 113c, the fifth layer 113e, and the insulating layers 125 and 127, and the common electrode 115 is provided over the sixth layer 114. The sixth layer 114 and the common electrode 115 are each one continuous film shared by the light-receiving device and the light-emitting devices. The protective layer 131 is provided over the light-emitting devices 130G and 130IR and the light-receiving device 150.

The protective layer 131 and the substrate 152 are bonded to each other with an adhesive layer 142. A solid sealing structure, a hollow sealing structure, or the like can be employed to seal the light-emitting devices. In FIG. 19A, a solid sealing structure is employed, in which a space between the substrate 152 and the substrate 151 is filled with the adhesive layer 142. Alternatively, a hollow sealing structure may be employed, in which the space is filled with an inert gas (e.g., nitrogen or argon). In this case, the adhesive layer 142 may be provided not to overlap with the light-emitting devices. Alternatively, the space may be filled with a resin other than the frame-like adhesive layer 142.

The conductive layer 123 is provided over the insulating layer 214 in the connection portion 140. An example is illustrated in which the conductive layer 123 has a stacked-layer structure of a conductive film obtained by processing the same conductive film as the conductive layers 111b, 111c, and 111e; a conductive film obtained by processing the same conductive film as the conductive layers 112b, 112c, and 112e; and a conductive film obtained by processing the same conductive film as the conductive layers 126b, 126c, and 126e. The end portion of the conductive layer 123 is covered with the sacrifice layer, the insulating layer 125, and the insulating layer 127. The sixth layer 114 is provided over the conductive layer 123, and the common electrode 115 is provided over the sixth layer 114. The conductive layer 123 and the common electrode 115 are electrically connected to each other through the sixth layer 114. Note that the sixth layer 114 is not necessarily formed in the connection portion 140. In this case, the conductive layer 123 and the common electrode 115 are directly and electrically connected to each other.

The display apparatus 100G is a top-emission display apparatus. Light emitted from the light-emitting devices is emitted toward the substrate 152. For the substrate 152, a material having a high visible-light-transmitting property and a high infrared-light-transmitting property is preferably used. The pixel electrode contains a material that reflects visible light and infrared light, and the counter electrode (the common electrode 115) contains a material that transmits visible light and infrared light.

A stacked-layer structure including the substrate 151 and the components thereover up to the insulating layer 214 corresponds to the layer 101 including a transistor in Embodiment 1.

The transistor 201 and the transistor 205 are formed over the substrate 151. These transistors can be fabricated using the same materials in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display apparatus.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

An organic insulating film is suitable as the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer 214 may have a stacked-layer structure of an organic insulating film and an inorganic insulating film. The outermost layer of the insulating layer 214 preferably functions as an etching protective film. Thus, the formation of a depression portion in the insulating layer 214 can be inhibited in processing the conductive layer 111b, the conductive layer 112b, the conductive layer 126b, or the like. Alternatively, a depression portion may be formed in the insulating layer 214 in processing the conductive layer 111b, the conductive layer 112b, the conductive layer 126b, or the like.

Each of the transistors 201 and 205 includes a conductive layer 221 functioning as a gate, the insulating layer 211 functioning as a gate insulating layer, a conductive layer 222a and a conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. It is preferable to use a single crystal semiconductor or a semiconductor having crystallinity because degradation of transistor characteristics can be inhibited.

It is preferable that a semiconductor layer of a transistor contain a metal oxide (also referred to as an oxide semiconductor). That is, a transistor including a metal oxide in its channel formation region (hereinafter, also referred to as an OS transistor) is preferably used for the display apparatus of this embodiment.

As the oxide semiconductor having crystallinity, a c-axis aligned crystalline oxide semiconductor (CAAC-OS), a nanocrystalline oxide semiconductor (nc-OS), and the like are given.

The OS transistor has much higher field-effect mobility than a transistor containing amorphous silicon. In addition, the OS transistor has an extremely low leakage current between a source and a drain in an off state (the leakage current is also referred to as an off-state current below), and charge accumulated in a capacitor that is connected in series to the transistor can be held for a long period. Furthermore, the power consumption of the display apparatus can be reduced with the OS transistor.

The off-state current per micrometer of channel width the OS transistor at room temperature can be lower than or equal to 1 aA ($1 \times 10^{-18}$ A), lower than or equal to 1 zA ($1 \times 10^{-21}$ A), or lower than or equal to 1 yA ($1 \times 10^{-24}$ A). Note that the off-state current per micrometer of channel width of a Si transistor at room temperature is higher than or equal to 1 fA ($1 \times 10^{-15}$ A) and lower than or equal to 1 pA ($1 \times 10^{-12}$ A).

That is, the off-state current of the OS transistor is lower than the off-state current of the Si transistor by approximately 10 digits.

A metal oxide used for the semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin.

It is particularly preferable that an oxide containing indium (In), gallium (Ga), and zinc (Zn) (also referred to as IGZO) be used for the semiconductor layer. Alternatively, it is preferable to use an oxide containing indium, tin, and zinc. Further alternatively, it is preferable to use an oxide containing indium, gallium, tin, and zinc. Further alternatively, it is preferable to use an oxide containing indium (In), aluminum (Al), and zinc (Zn) (also referred to as IAZO). Further alternatively, it is preferable to use an oxide containing indium (In), aluminum (Al), gallium (Ga), and zinc (Zn) (also referred to as IAGZO).

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1, 1:1:1.2, 1:3:2, 1:3:4, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, when the atomic ratio is described as In:Ga:Zn=4:2:3 or a composition in the vicinity thereof, the case is included where the atomic proportion of Ga is greater than or equal to 1 and less than or equal to 3 and the atomic proportion of Zn is greater than or equal to 2 and less than or equal to 4 with the atomic proportion of In being 4. In addition, when the atomic ratio is described as In:Ga:Zn=5:1:6 or a composition in the vicinity thereof, the case is included where the atomic proportion of Ga is greater than 0.1 and less than or equal to 2 and the atomic proportion of Zn is greater than or equal to 5 and less than or equal to 7 with the atomic proportion of In being 5. Furthermore, when the atomic ratio is described as In:Ga:Zn=1:1:1 or a composition in the vicinity thereof, the case is included where the atomic proportion of Ga is greater than 0.1 and less than or equal to 2 and the atomic proportion of Zn is greater than 0.1 and less than or equal to 2 with the atomic proportion of In being 1.

Alternatively, a transistor using silicon in a channel formation region (a Si transistor) may be used. Examples of silicon include single crystal silicon, polycrystalline silicon, and amorphous silicon. In particular, a transistor containing low-temperature polysilicon (LTPS) in a semiconductor layer (such a transistor is referred to as an LTPS transistor below) can be used. The LTPS transistor has high field-effect mobility and excellent frequency characteristics.

With the use of the Si transistor such as the LTPS transistor, a circuit required to drive at a high frequency (e.g., a source driver circuit) can be formed on the same substrate as the display portion. This allows simplification of an external circuit mounted on the display apparatus and a reduction in costs of parts and mounting costs.

The transistors included in the circuit 164 and the transistors included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

All of the transistors included in the display portion 162 may be OS transistors or Si transistors. Alternatively, some of the transistors included in the display portion 162 may be OS transistors and the others may be Si transistors.

For example, when both the LTPS transistor and the OS transistor are used in the display portion 162, the display apparatus can have low power consumption and high drive capability. Note that a structure in which the LTPS transistor and the OS transistor are combined is referred to as LTPO in some cases. As a favorable example, it is preferable that the OS transistor be used as a transistor functioning as a switch for controlling conduction or non-conduction between wirings and the LTPS transistor be used as a transistor for controlling current.

For example, one transistor included in the display portion 162 may function as a transistor for controlling current flowing through the light-emitting device and be referred to as a driving transistor. One of a source and a drain of the driving transistor is electrically connected to the pixel electrode of the light-emitting device. The LTPS transistor is preferably used as the driving transistor. Thus, current flowing through the light-emitting device in the pixel circuit can be increased.

In contrast, another transistor included in the display portion 162 may function as a switch for controlling selection or non-selection of a pixel and be referred to as a selection transistor. A gate of the selection transistor is electrically connected to a gate line, and one of a source and a drain thereof is electrically connected to a source line (signal line). The OS transistor is preferably used as the selection transistor. Thus, the gray level of the pixel can be maintained even when the frame frequency is extremely reduced (e.g., 1 fps or lower), whereby power consumption can be reduced by stopping the driver in displaying a still image.

As described above, the display apparatus of one embodiment of the present invention can have all of a high aperture ratio, high resolution, high display quality, and low power consumption.

Note that the display apparatus of one embodiment of the present invention has a structure including the OS transistor and the light-emitting device having a metal maskless (MML) structure. This structure can extremely reduce the leakage current that might flow through a transistor, and the leakage current that might flow between adjacent light-emitting devices (also referred to as side leakage current or the like). In addition, when an image is displayed on the display apparatus having this structure, the user can notice one or more of crispness, sharpness, and a high contrast ratio of an image. Note that when the leakage current that might flow through a transistor and the side leakage current between light-emitting devices are extremely low, light leakage or the like that might occur in black display can be reduced as much as possible (such display is also referred to as completely black display).

FIG. 19B and FIG. 19C illustrate other structure examples of the transistor.

Transistors 209 and 210 each include the conductive layer 221 functioning as a gate, the insulating layer 211 functioning as a gate insulating layer, the semiconductor layer 231 including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between at least the conductive layer 223 and the channel formation region 231i. Furthermore, an insulating layer 218 covering the transistor may be provided.

FIG. 19B illustrates an example of the transistor 209 in which the insulating layer 225 covers the top surface and the side surface of the semiconductor layer 231. The conductive layer 222a and the conductive layer 222b are connected to the corresponding low-resistance regions 231n through openings provided in the insulating layer 225 and the insulating layer 215. One of the conductive layers 222a and 222b functions as a source, and the other functions as a drain.

In the transistor 210 illustrated in FIG. 19C, the insulating layer 225 overlaps with the channel formation region 231i of the semiconductor layer 231 and does not overlap with the low-resistance regions 231n. The structure illustrated in FIG. 19C is obtained by processing the insulating layer 225 with the conductive layer 223 as a mask, for example. In FIG. 19C, the insulating layer 215 is provided to cover the insulating layer 225 and the conductive layer 223, and the conductive layer 222a and the conductive layer 222b are connected to the corresponding low-resistance regions 231n through the openings in the insulating layer 215.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the conductive layers 111b, 111c, and 111d; a conductive film obtained by processing the same conductive film as the conductive layers 112b, 112c, and 112d; and a conductive film obtained by processing the same conductive film as the conductive layers 126b, 126c, and 126d. On the top surface of the connection portion 204, the conductive layer 166 is exposed. Thus, the connection portion 204 and the FPC 172 can be electrically connected to each other through the connection layer 242.

A light-blocking layer 117 is preferably provided on the surface of the substrate 152 on the substrate 151 side. The light-blocking layer 117 can be positioned over a region between adjacent light-emitting devices, in the connection portion 140, in the circuit 164, and the like. A variety of optical members can be arranged on the outer surface of the substrate 152.

Providing the protective layer 131 that covers the light-emitting device and the light-receiving device can inhibit entry of impurities such as water into the light-emitting device and the light-receiving device, thereby increasing the reliability of the light-emitting device and the light-receiving device.

A material that can be used for the substrate 120 can be used for each of the substrates 151 and 152.

A material that can be used for the resin layer 122 can be used for the bonding layer 142.

As the connection layer 242, an anisotropic conductive film (ACF), an anisotropic conductive paste (ACP), or the like can be used.

[Display Apparatus 100H]

A display apparatus 100H illustrated in FIG. 20A is different from the display apparatus 100G mainly in that the display apparatus 100H is a bottom-emission display apparatus in which a white light-emitting device and a color filter are combined.

Light emitted from the light-emitting device is emitted toward the substrate 151. Light is incident on the light-receiving device from the substrate 151 side. For the substrate 151, a material having a high visible-light-transmitting property is preferably used. In contrast, there is no limitation on the light-transmitting property of a material used for the substrate 152.

The light-blocking layer 117 is preferably formed between the substrate 151 and the transistor 201 and between the substrate 151 and the transistor 205. FIG. 20A illustrates an example in which the light-blocking layer 117 is provided over the substrate 151, an insulating layer 153 is provided over the light-blocking layer 117, and the transistors 201 and 205 and the like are provided over the insulating layer 153.

The light-emitting device 130B and the blue coloring layer 132B overlap with each other, and light emitted from the light-emitting device 130B passes through the coloring layer 132B and is extracted as blue light to the outside of the display apparatus 100H.

The light-emitting device 130B includes the conductive layer 111d, the conductive layer 112d over the conductive layer 111d, and the conductive layer 126d over the conductive layer 112d.

The light-receiving device 150 includes the conductive layer 111e, the conductive layer 112e over the conductive layer 111e, and the conductive layer 126e over the conductive layer 112e.

A material having a high visible-light-transmitting property is used for each of the conductive layers 111d, 111e, 112d, 112e, 126d, and 126e. A material that reflects visible light is preferably used for the common electrode 115.

The top surface and the side surface of the conductive layer 112d and the top surface and the side surface of the conductive layer 126d are covered with the fourth layer 113d. The side surface of the fourth layer 113d is covered with the insulating layers 125 and 127. A sacrifice layer 118d is positioned between the fourth layer 113d and the insulating layer 125. The sixth layer 114 is provided over the fourth layer 113d, the fifth layer 113e, and the insulating layers 125 and 127, and the common electrode 115 is provided over the sixth layer 114. The sixth layer 114 and the common electrode 115 are each one continuous film shared by the light-receiving device and the light-emitting devices. The protective layer 131 is provided over the light-emitting device 130G and the light-receiving device 150.

The light-emitting devices included in the red, green, and blue subpixels emit white light. For example, the fourth layer 113d can employ a stacked-layer structure of a first light-emitting unit, a charge generation layer, and a second light-emitting unit.

Although FIG. 19A, FIG. 20A, and the like illustrate an example in which the top surface of the layer 128 includes a flat portion, the shape of the layer 128 is not particularly limited. FIGS. 20B to 20D illustrate modification examples of the layer 128.

As illustrated in FIGS. 20B and 20D, the top surface of the layer 128 can have a shape in which its center and vicinity thereof fall, i.e., a shape including a concave surface, in the cross-sectional view.

As illustrated in FIG. 20C, the top surface of the layer 128 can have a shape in which its center and vicinity thereof rise, i.e., a shape including a convex surface, in the cross-sectional view.

The top surface of the layer 128 may include one or both of a convex surface and a concave surface. The number of convex surfaces and the number of concave surfaces included in the top surface of the layer 128 are not limited and can each be one or more.

The level of the top surface of the layer 128 and the level of the top surface of the conductive layer 111e may be the same or substantially the same, or may be different from each other. For example, the level of the top surface of the layer 128 may be either lower or higher than the level of the top surface of the conductive layer 111e.

FIG. 20B can be said as an example in which the layer 128 fits in the depression portion of the conductive layer 111e. In contrast, as illustrated in FIG. 20D, the layer 128 may exist also outside the depression portion of the conductive layer 111e, that is, the top surface of the layer 128 may extend beyond the depression portion.

This embodiment can be combined with any of the other embodiments as appropriate.

Embodiment 5

In this embodiment, a light-emitting device that can be used in the display apparatus of one embodiment of the present invention will be described.

Figure 21A:
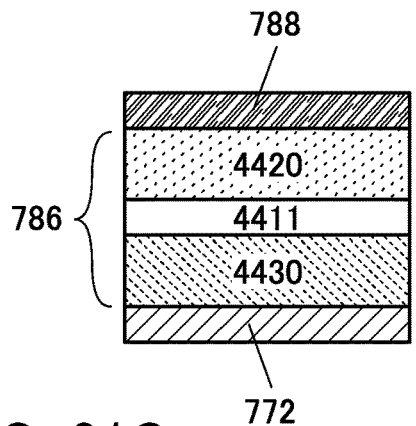
FIGS. 21A to 21F each illustrate a structure example of a light-emitting device.

As illustrated in FIG. 21A, the light-emitting device includes an EL layer 786 between a pair of electrodes (a lower electrode 772 and an upper electrode 788). The EL layer 786 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes, can function as a single light-emitting unit, and the structure in FIG. 21A is referred to as a single structure in this specification.

Figure 21B:
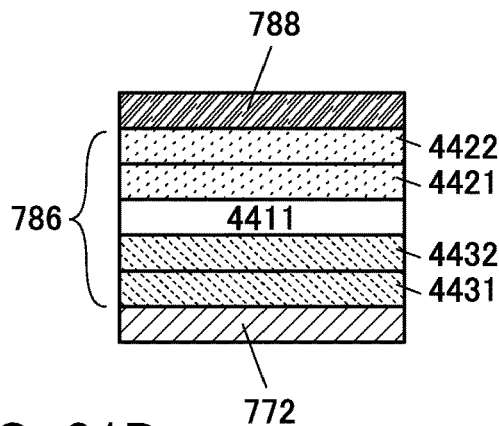

FIG. 21B is a modification example of the EL layer 786 included in the light-emitting device illustrated in FIG. 21A. Specifically, the light-emitting device illustrated in FIG. 21B includes a layer 4431 over the lower electrode 772, a layer 4432 over the layer 4431, the light-emitting layer 4411 over the layer 4432, a layer 4421 over the light-emitting layer 4411, a layer 4422 over the layer 4421, and the upper electrode 788 over the layer 4422. For example, when the lower electrode 772 functions as an anode and the upper electrode 788 functions as a cathode, the layer 4431 functions as a hole-injection layer, the layer 4432 functions as a hole-transport layer, the layer 4421 functions as an electron-transport layer, and the layer 4422 functions as an electron-injection layer. Alternatively, when the lower electrode 772 functions as a cathode and the upper electrode 788 functions as an anode, the layer 4431 functions as an electron-injection layer, the layer 4432 functions as an electron-transport layer, the layer 4421 functions as a hole-transport layer, and the layer 4422 functions as the hole-injection layer. With such a layered structure, carriers can be efficiently injected to the light-emitting layer 4411, and the efficiency of the recombination of carriers in the light-emitting layer 4411 can be enhanced.

Figure 21C:
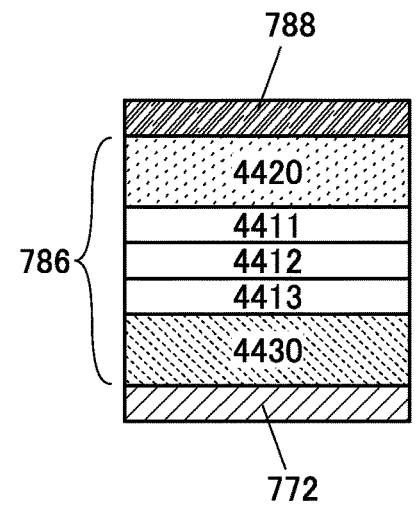
Figure 21D:
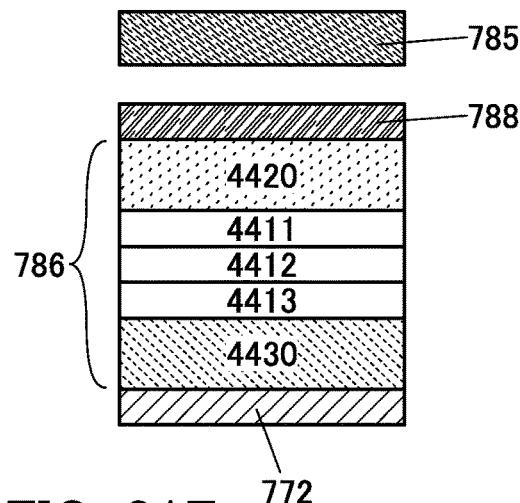

Note that structures in which a plurality of light-emitting layers (light-emitting layers 4411, 4412, and 4413) are provided between the layer 4420 and the layer 4430 as illustrated in FIG. 21C and FIG. 21D are other variations of the single structure.

Figure 21E:
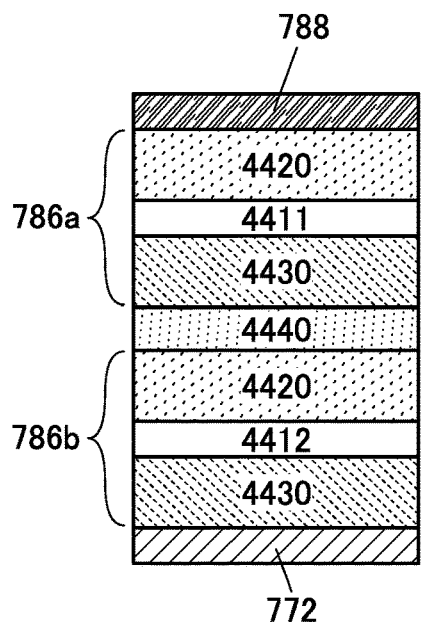
Figure 21F:
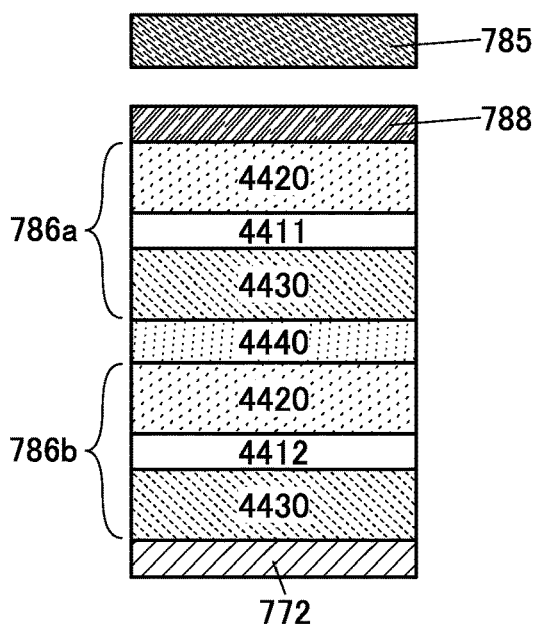

Structures in which a plurality of light-emitting units (EL layers 786a and 786b) are connected in series with a charge-generation layer 4440 therebetween as illustrated in FIG. 21E and FIG. 21F are referred to as a tandem structure in this specification. A tandem structure may be referred to as a stack structure. The tandem structure enables a light-emitting device capable of high luminance light emission.

In FIG. 21C and FIG. 21D, light-emitting materials that emit light of the same color, or moreover, the same light-emitting material may be used for the light-emitting layer 4411, the light-emitting layer 4412, and the light-emitting layer 4413. For example, a light-emitting material that emits blue light may be used for the light-emitting layer 4411, the light-emitting layer 4412, and the light-emitting layer 4413. A color conversion layer may be provided as a layer 785 illustrated in FIG. 21D.

Alternatively, light-emitting materials that emit light of different colors may be used for the light-emitting layer 4411, the light-emitting layer 4412, and the light-emitting layer 4413. White light can be obtained when the light-emitting layer 4411, the light-emitting layer 4412, and the light-emitting layer 4413 emit light of complementary colors. A color filter (also referred to as a coloring layer) may be provided as the layer 785 illustrated in FIG. 21D. When white light passes through a color filter, light of a desired color can be obtained.

In FIG. 21E and FIG. 21F, light-emitting materials that emit light of the same color, or moreover, the same light-emitting material may be used for the light-emitting layer 4411 and the light-emitting layer 4412. Alternatively, light-emitting materials that emit light of different colors may be used for the light-emitting layer 4411 and the light-emitting layer 4412. White light can be obtained when the light-emitting layer 4411 and the light-emitting layer 4412 emit light of complementary colors. FIG. 21F illustrates an example in which the layer 785 is further provided. One or both of a color conversion layer and a color filter (coloring layer) can be used as the layer 785.

In FIGS. 21C to 21F, the layer 4420 and the layer 4430 may each have a layered structure of two or more layers as in FIG. 21B.

A structure in which light-emitting devices that emit light of different colors (e.g., blue (B), green (G), and red (R)) are separately formed is referred to as a side-by-side (SBS) structure in some cases.

The emission color of the light-emitting device can be changed to red, green, blue, cyan, magenta, yellow, white, or the like depending on the material of the EL layer 786. When the light-emitting device has a microcavity structure, the color purity can be further increased.

In the light-emitting device that emits white light, the light-emitting layer preferably contains two or more kinds of light-emitting substances. To obtain white light emission, the two or more kinds of light-emitting substances are selected so as to emit light of complementary colors. For example, the emission colors of first and second light-emitting layers are complementary, so that the light-emitting device can emit white light as a whole. This can be applied to a light-emitting device including three or more light-emitting layers.

The light-emitting layer preferably contains two or more selected from light-emitting substances that emit light of red (R), green (G), blue (B), yellow (Y), orange (0), and the like. Alternatively, the light-emitting layer preferably contains two or more light-emitting substances that emit light containing two or more of spectral components of R, G, and B.

This embodiment can be combined with any of the other embodiments as appropriate.

Embodiment 6

In this embodiment, electronic devices of embodiments of the present invention will be described with reference to FIGS. 22A and 22B, FIGS. 23A and 23B, FIGS. 24A and 24B, FIGS. 25A to 25D, and FIGS. 26A to 26G.

Electronic devices of this embodiment are each provided with the display apparatus of one embodiment of the present invention in a display portion. The display apparatus of one embodiment of the present invention can be easily increased in resolution and definition. Thus, the display apparatus of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display apparatus of one embodiment of the present invention can have a high resolution, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a definition of 4K, 8K, or higher is preferable. The pixel density (resolution) of the display apparatus of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. The use of the display apparatus having one or both of such high definition and high resolution can further increase realistic sensation, sense of depth, and the like in personal use such as portable use and home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices will be described with reference to FIGS. 22A and 22B and FIGS. 23A and 23B. These wearable devices have one or both of a function of displaying AR contents and a function of displaying VR contents. Note that these wearable devices may have a function of displaying SR or MR contents, in addition to AR and VR contents. The electronic device having a function of displaying contents of AR, VR, SR, MR, or the like enables the user to reach a higher level of immersion.

Figure 22A:
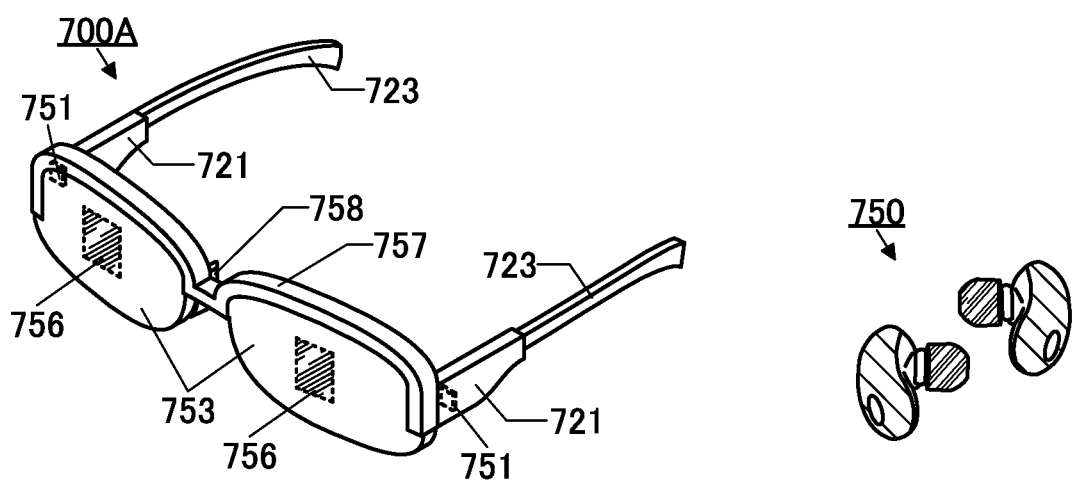
FIGS. 22A and 22B illustrate examples of electronic devices.
Figure 22B:
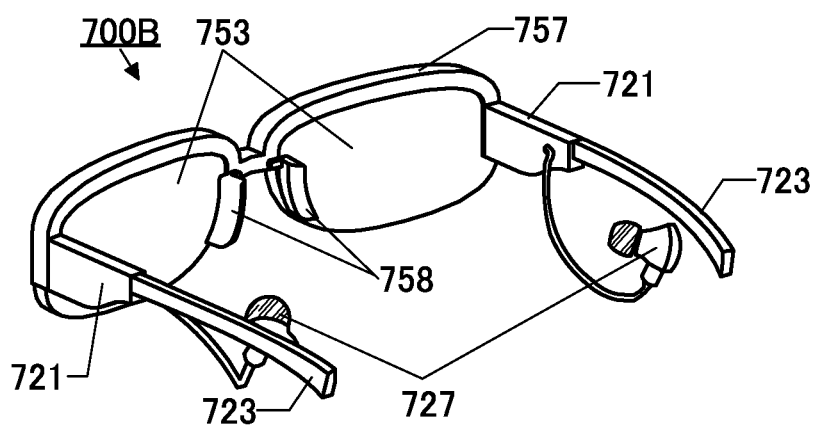

An electronic device 700A illustrated in FIG. 22A and an electronic device 700B illustrated in FIG. 22B each include a pair of display panels 751, a pair of housings 721, a communication portion (not illustrated), a pair of mounting portions 723, a control portion (not illustrated), an image capturing portion (not illustrated), a pair of optical members 753, a frame 757, and a pair of nose pads 758.

The display apparatus of one embodiment of the present invention can be used for the display panels 751. Thus, the electronic devices are capable of performing ultrahigh-resolution display.

The electronic devices 700A and 700B can each project images displayed on the display panels 751 onto display regions 756 of the optical members 753. Since the optical members 753 have a light-transmitting property, the user can see images displayed on the display regions 756, which are superimposed on transmission images seen through the optical members 753. Accordingly, the electronic devices 700A and 700B are electronic devices capable of AR display.

In the electronic devices 700A and 700B, a camera capable of capturing images of the front side may be provided as the image capturing portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic devices 700A and 700B are provided with a battery so that they can be charged wirelessly and/or by wire.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device (also referred to as a light-receiving element). One or both of an inorganic semiconductor and an organic semiconductor can be used for an active layer of the photoelectric conversion device.

Figure 23A:
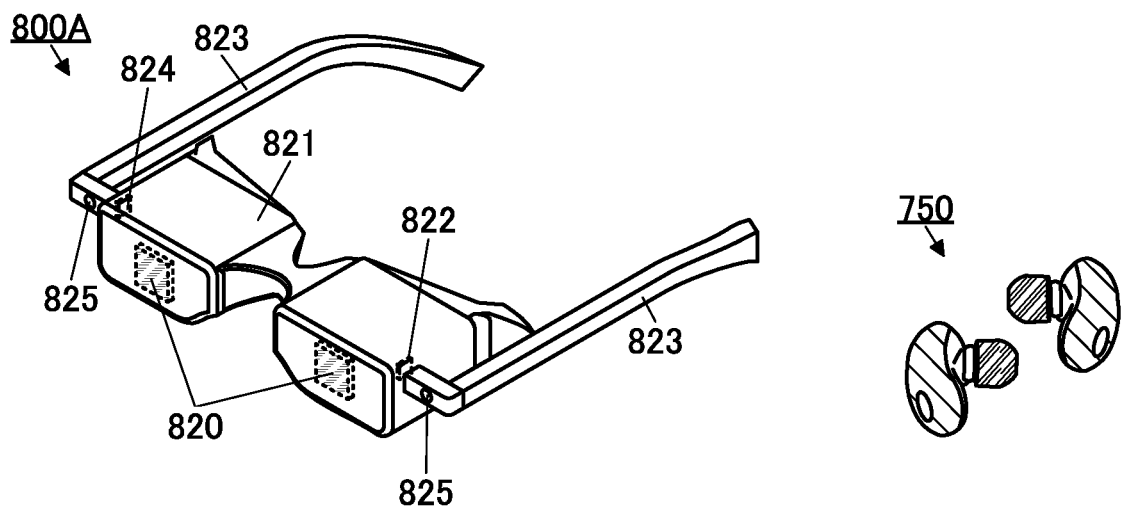
FIGS. 23A and 23B illustrate examples of electronic devices.
Figure 23B:
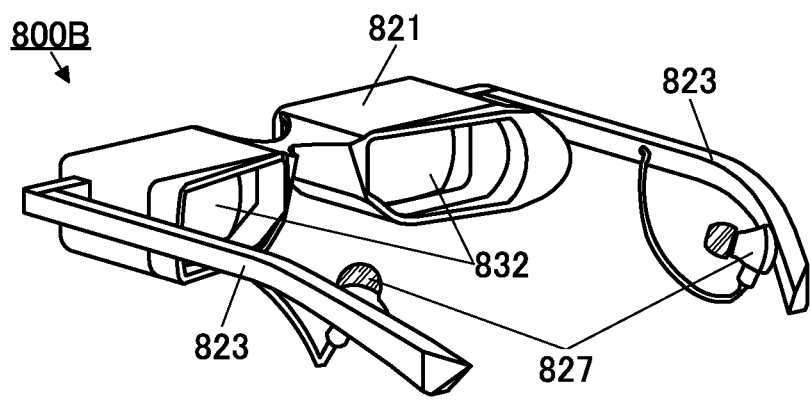

An electronic device 800A illustrated in FIG. 23A and an electronic device 800B illustrated in FIG. 23B each include a pair of display portions 820, a housing 821, a communication portion 822, a pair of mounting portions 823, a control portion 824, a pair of image capturing portions 825, and a pair of lenses 832.

The display apparatus of one embodiment of the present invention can be used in the display portions 820. Thus, the electronic devices are capable of performing ultrahigh-resolution display. Such electronic devices provide an enhanced sense of immersion to the user.

The display portions 820 are provided at positions where the user can see through the lenses 832 inside the housing 821. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the mounting portions 823. FIG. 23A and the like show examples where the mounting portion 823 has a shape like a temple of glasses; however, one embodiment of the present invention is not limited thereto. The mounting portion 823 can have any shape with which the user can wear the electronic device, for example, a shape of a helmet or a band.

The image capturing portion 825 has a function of obtaining information on the external environment. Data obtained by the image capturing portion 825 can be output to the display portion 820. An image sensor can be used for the image capturing portion 825. Moreover, a plurality of cameras may be provided so as to support a plurality of fields of view, such as a telescope field of view and a wide field of view.

Although an example where the image capturing portions 825 are provided is shown here, a range sensor capable of measuring a distance between the user and an object (hereinafter also referred to as a sensing portion) just needs to be provided. In other words, the image capturing portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, at least one of the display portion 820, the housing 821, and the mounting portion 823 can include the vibration mechanism. Thus, without additionally requiring an audio device such as headphones, earphones, or a speaker, the user can enjoy video and sound only by wearing the electronic device 800A.

The electronic devices 800A and 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 22A has a function of transmitting information to the earphones 750 with the wireless communication function. As another example, the electronic device 800A in FIG. 23A has a function of transmitting information to the earphones 750 with the wireless communication function.

The electronic device may include an earphone portion. The electronic device 700B in FIG. 22B includes earphone portions 727. For example, the earphone portion 727 can be connected to the control portion by wire. Part of a wiring that connects the earphone portion 727 and the control portion may be positioned inside the housing 721 or the mounting portion 723.

Similarly, the electronic device 800B in FIG. 23B includes earphone portions 827. For example, the earphone portion 827 can be connected to the control portion 824 by wire. Part of a wiring that connects the earphone portion 827 and the control portion 824 may be positioned inside the housing 821 or the mounting portion 823. Alternatively, the earphone portions 827 and the mounting portions 823 may include magnets. This is preferred because the earphone portions 827 can be fixed to the mounting portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

The electronic device of one embodiment of the present invention can transmit information to earphones by wire or wirelessly.

Figure 24A:
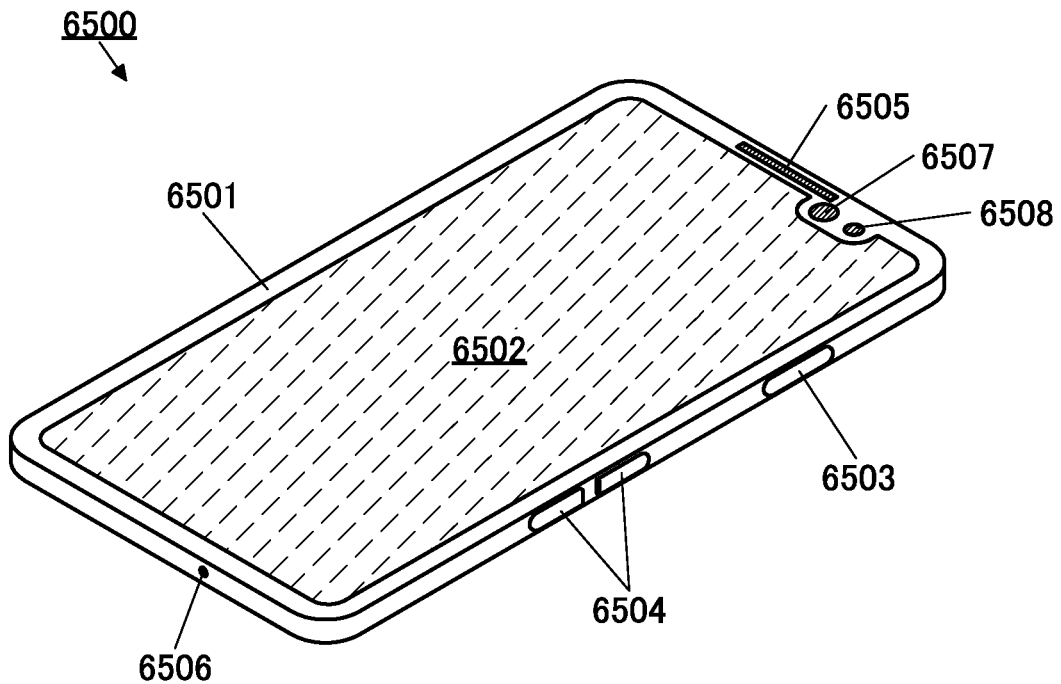
FIGS. 24A and 24B illustrate an example of an electronic device.

An electronic device 6500 illustrated in FIG. 24A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 24B:
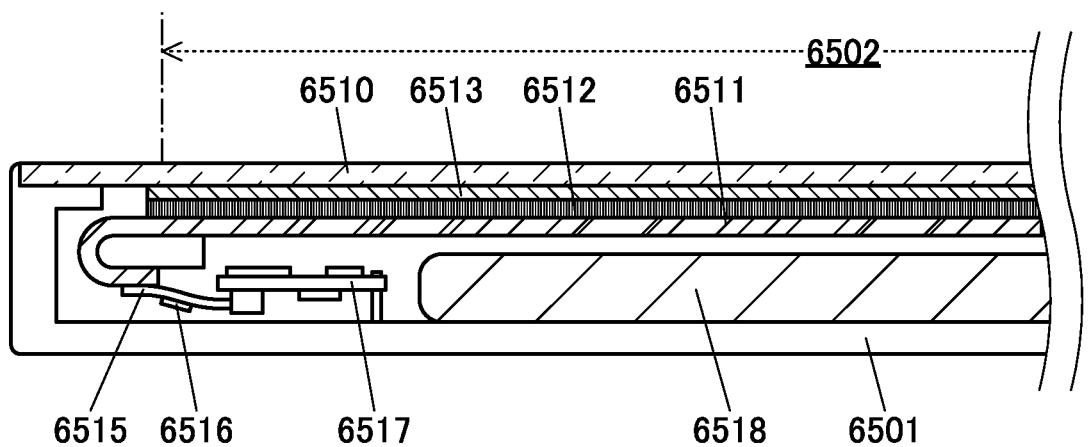

FIG. 24B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 25A:
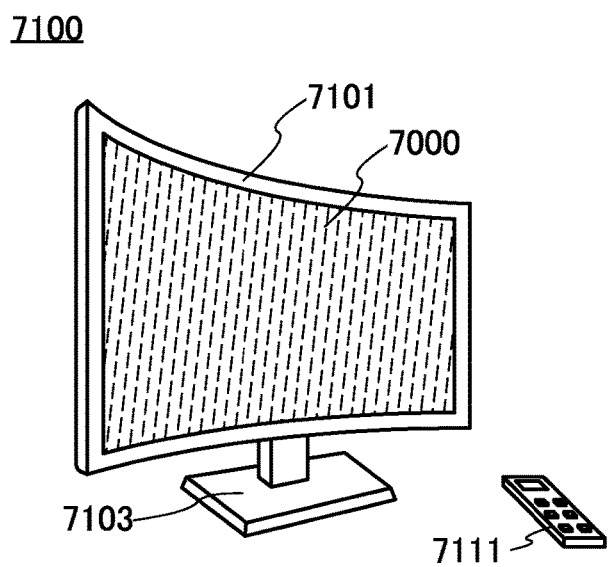
FIGS. 25A to 25D illustrate examples of electronic devices.

FIG. 25A illustrates an example of a television device. In a television device 7100, a display portion 7000 is incorporated in a housing 7101. Here, the housing 7101 is supported by a stand 7103.

The display apparatus of one embodiment of the present invention can be used in the display portion 7000.

Operation of the television device 7100 illustrated in FIG. 25A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 25B:
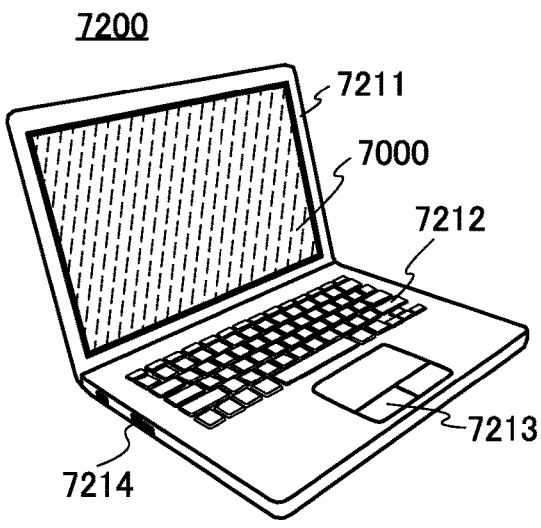

FIG. 25B illustrates an example of a laptop personal computer. The laptop personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000.

Figure 25C:
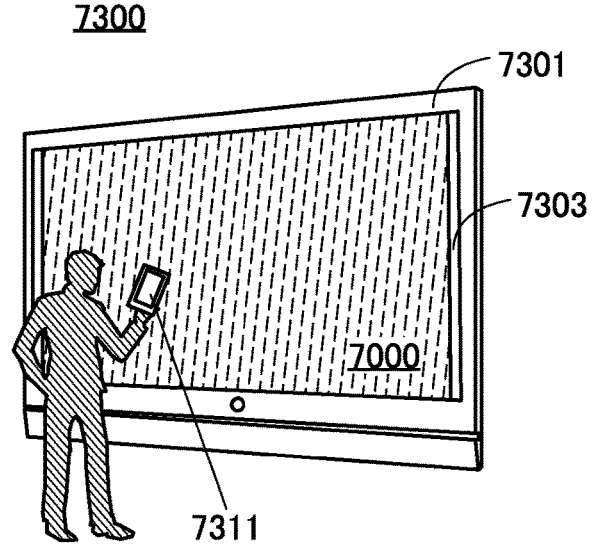
Figure 25D:
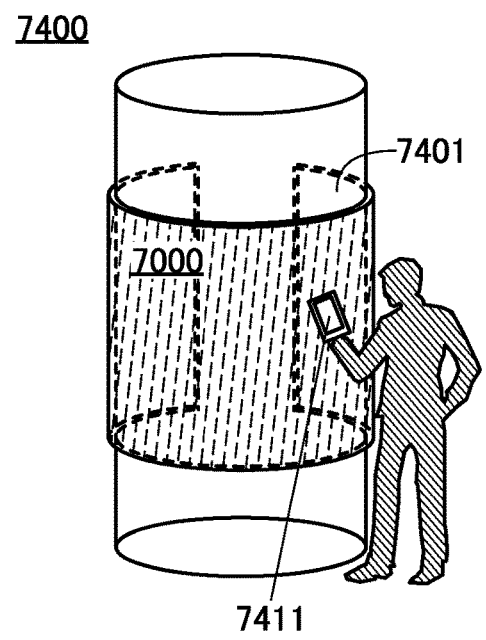

FIGS. 25C and 25D illustrate examples of digital signage.

Digital signage 7300 illustrated in FIG. 25C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 25D shows digital signage 7400 attached to a cylindrical pillar 7401. The digital signage 7400 includes the display portion 7000 provided along a curved surface of the pillar 7401.

In FIGS. 25C and 25D, the display apparatus of one embodiment of the present invention can be used in the display portion 7000.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 25C and 25D, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIGS. 26A to 26G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

In FIGS. 26A to 26G, the display apparatus of one embodiment of the present invention can be used in the display portion 9001.

The electronic devices illustrated in FIGS. 26A to 26G have a variety of functions. For example, the electronic devices can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. Note that the functions of the electronic devices are not limited thereto, and the electronic devices can have a variety of functions. The electronic devices may include a plurality of display portions. The electronic devices may be provided with a camera or the like and have a function of capturing a still image or a moving image, a function of storing the captured image in a storage medium (an external storage medium or a storage medium incorporated in the camera), a function of displaying the captured image on the display portion, and the like.

The electronic devices illustrated in FIGS. 26A to 26G will be described in detail below.

Figure 26A:
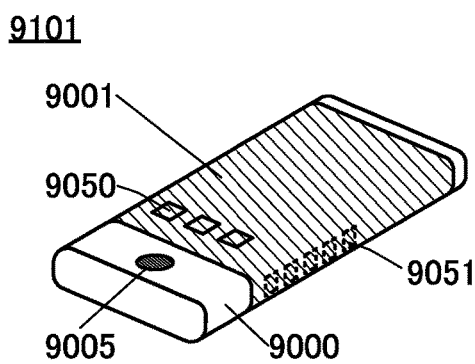
FIGS. 26A to 26G illustrate examples of electronic devices.

FIG. 26A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 26A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 26B:
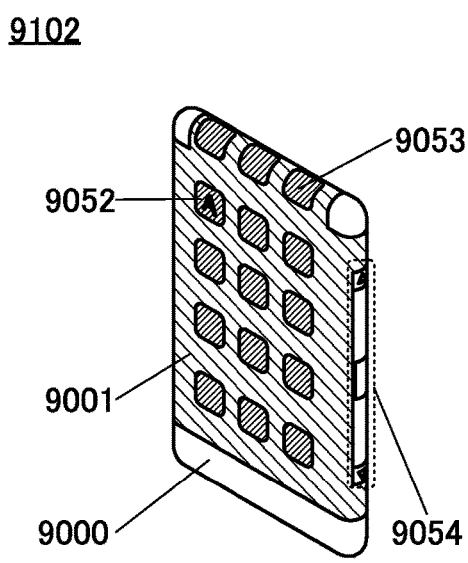

FIG. 26B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 26C:
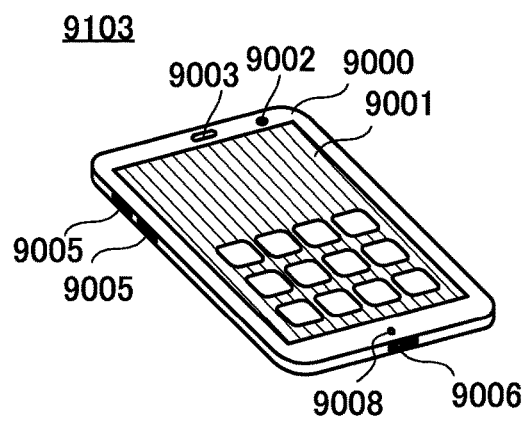

FIG. 26C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 26D:
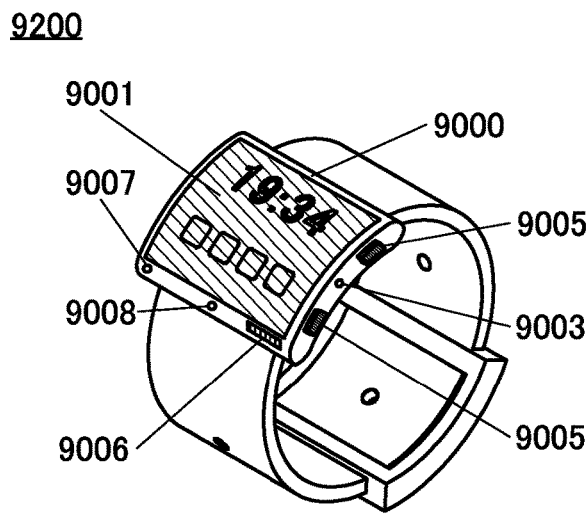

FIG. 26D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 26E:
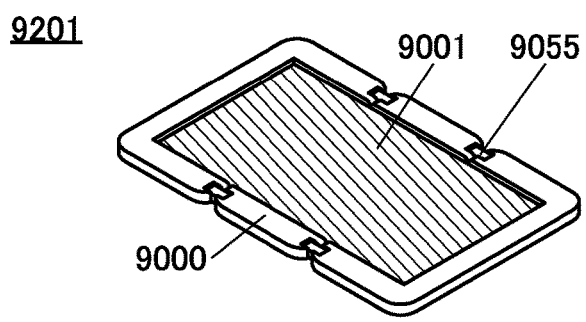
Figure 26F:
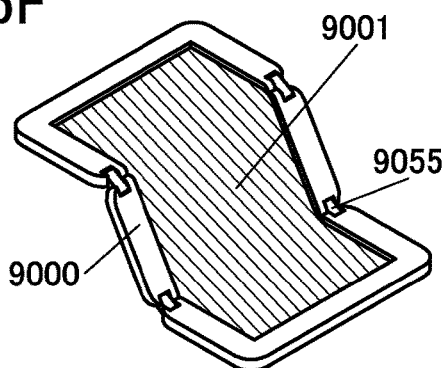
Figure 26G:
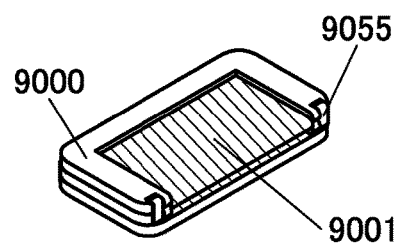

FIGS. 26E to 26G are perspective views of a foldable portable information terminal 9201. FIG. 26E is a perspective view showing the portable information terminal 9201 that is opened. FIG. 26G is a perspective view showing the portable information terminal 9201 that is folded. FIG. 26F is a perspective view showing the portable information terminal 9201 that is shifted from one of the states in FIGS. 26E and 26G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with any of the other embodiments as appropriate.

This application is based on Japanese Patent Application Serial No. 2021-066011 filed with Japan Patent Office on Apr. 8, 2021, the entire contents of which are hereby incorporated by reference.

What is claimed is:

1. A display apparatus comprising a display portion in which a first arrangement pattern and a second arrangement pattern are repeatedly arranged in this order in a first direction,
   wherein in the first arrangement pattern, a first subpixel, a second subpixel, and a third subpixel are repeatedly arranged in this order in a second direction,
   wherein in the second arrangement pattern, a fourth subpixel and a first region are repeatedly arranged in this order in the second direction,
   wherein the first subpixel, the second subpixel, the third subpixel, and the fourth subpixel each comprise a light-emitting device,
   wherein the first region comprises a light-receiving device, and
   wherein an aperture ratio of the first region is lower than aperture ratios of the first to fourth subpixels.

2. The display apparatus according to claim 1,
   wherein a longitudinal direction of each of the first subpixel, the second subpixel, and the third subpixel is the first direction.

3. The display apparatus according to claim 1,
   wherein a longitudinal direction of the fourth subpixel is the second direction.

4. The display apparatus according to claim 1,
   wherein the third subpixel emits infrared light and has a higher aperture ratio than the first subpixel, the second subpixel, the fourth subpixel, and the first region.

5. The display apparatus according to claim 4,
   wherein one of the first subpixel and the second subpixel emits red light,
   wherein the other of the first subpixel and the second subpixel emits green light,
   wherein the fourth subpixel emits blue light, and
   wherein the first region senses at least infrared light.

6. The display apparatus according to claim 1,
   wherein the fourth subpixel emits infrared light and has a higher aperture ratio than the first to third subpixels and the first region.

7. The display apparatus according to claim 6,
wherein one of the first subpixel and the second subpixel emits red light,
wherein the other of the first subpixel and the second subpixel emits green light,
wherein the third subpixel emits blue light, and
wherein the first region senses at least infrared light.

8. The display apparatus according to claim 1,
wherein the first subpixel comprises a region in which a distance to an adjacent subpixel is less than or equal to 3 μm.

9. The display apparatus according to claim 8,
wherein the first subpixel comprises a region in which a distance to an adjacent subpixel is less than 1 μm.

10. An electronic device comprising:
the display apparatus according to claim 1; and
a processing portion,
wherein the display apparatus is configured to capture an image with the use of the first region, and
wherein the processing portion is configured to sense one or more selected from blinking, movement of an iris, and movement of an eyelid of a user, with the use of image data obtained with the display apparatus.

11. An electronic device comprising:
at least two display apparatuses according to claim 1;
a housing provided with the display apparatuses; and
a battery that is provided for the housing and supplies electric power to the display apparatuses,
wherein the housing comprises a mounting portion and a pair of lenses,
wherein an image from one of the two display apparatuses is projected on one of the pair of lenses, and
wherein an image from the other of the two display apparatuses is projected on the other of the pair of lenses.

12. The electronic device according to claim 11, further comprising a processing portion provided for the housing,
wherein the display apparatus is configured to capture an image with the use of the first region, and
wherein the processing portion is configured to sense one or more selected from blinking, movement of an iris, and movement of an eyelid of a user, with the use of image data obtained with the display apparatus.

13. The display apparatus according to claim 1,
wherein the fourth subpixel is in a first row where the first subpixel is arranged and a second row where the second subpixel is arranged.

14. The display apparatus according to claim 1,
wherein the first subpixel, the second subpixel, and the third subpixel are not included in the second arrangement pattern, and
wherein the fourth subpixel and the first region are not included in the first arrangement pattern.

* * * * *